United States Patent [19]
Magome et al.

[11] Patent Number: 5,734,478
[45] Date of Patent: Mar. 31, 1998

[54] PROJECTION EXPOSURE APPARATUS

[75] Inventors: Nobutaka Magome, Kawasaki; Hideo Mizutani, Yokohama; Kenji Nishi, Kawasaki, all of Japan

[73] Assignee: Nikon Corporation, Tokyo, Japan

[21] Appl. No.: 537,982

[22] Filed: Oct. 2, 1995

Related U.S. Application Data

[63] Continuation of Ser. No. 299,796, Sep. 1, 1994, abandoned, which is a continuation of Ser. No. 68,614, May 27, 1993, abandoned, which is a continuation of Ser. No. 781,690, Oct. 25, 1991, abandoned, which is a continuation of Ser. No. 624,534, Dec. 10, 1990, abandoned, which is a continuation of Ser. No. 418,260, Oct. 6, 1989, abandoned.

[30] Foreign Application Priority Data

| Oct. 12, 1988 | [JP] | Japan | 63-256479 |
| Oct. 26, 1988 | [JP] | Japan | 63-270315 |
| Nov. 15, 1988 | [JP] | Japan | 63-288254 |

[51] Int. Cl.$^6$ ............................................. G01B 11/00
[52] U.S. Cl. ................................... 356/401; 250/548
[58] Field of Search ........................ 356/399–401; 250/548, 557, 561, 559.3; 359/674, 754, 764; 355/43, 53

[56] References Cited

U.S. PATENT DOCUMENTS

| 4,251,160 | 2/1981 | Bouwhuis et al. | 356/401 |
| 4,402,596 | 9/1983 | Kanatani | 355/43 |
| 4,498,762 | 2/1985 | Uehara et al. | 356/401 |
| 4,566,795 | 1/1986 | Matsuura et al. | 356/400 |
| 4,710,026 | 12/1987 | Magome et al. | 356/400 |
| 4,780,616 | 10/1988 | Nishi et al. | 356/400 |
| 4,795,244 | 1/1989 | Uehara et al. | 356/401 |
| 4,856,905 | 8/1989 | Nishi | 356/401 |
| 4,870,452 | 9/1989 | Tanimoto et al. | 356/400 |
| 4,880,310 | 11/1989 | Nishi . | |
| 4,984,890 | 1/1991 | Tojo et al. | 356/401 |
| 5,004,348 | 4/1991 | Magome | 356/401 |

Primary Examiner—K. Hantis
Attorney, Agent, or Firm—Shapiro and Shapiro

[57] ABSTRACT

A projection exposure apparatus employs light in two different wavelength bands for exposure of a photosensitive substrate and for alignment of the substrate with a mask, respectively. The mask has a window through which alignment light is passed to an alignment mark on the substrate and has a shield for preventing illumination of the alignment mark by exposure light. In one embodiment the position of the shield relative to the window is determined by magnification chromatic aberration of a projection optical system with regard to the alignment light. In another embodiment the path of the alignment light through the window is inclined relative to a line perpendicular to the mask and passes through a pupil of the projection optical system at a point deviated from the center of the pupil. In another embodiment a mark on the mask and a mark on the substrate are illuminated with light beams incident on the marks from different directions and forming interference fringes to provide optical information that is utilized to align the mask and the substrate.

23 Claims, 26 Drawing Sheets

HEIGHT OF IMAGE

FIG. 32A
FIG. 32B
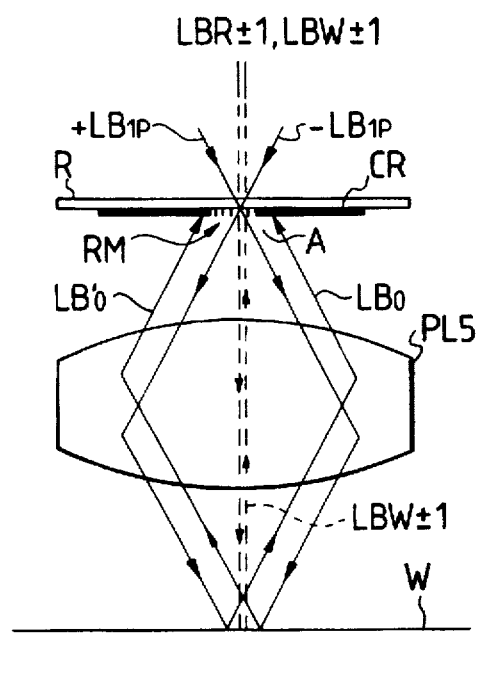
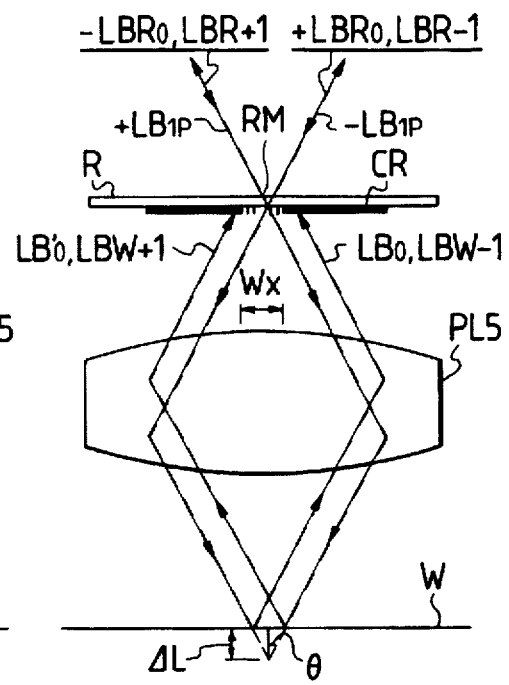
FIG. 34
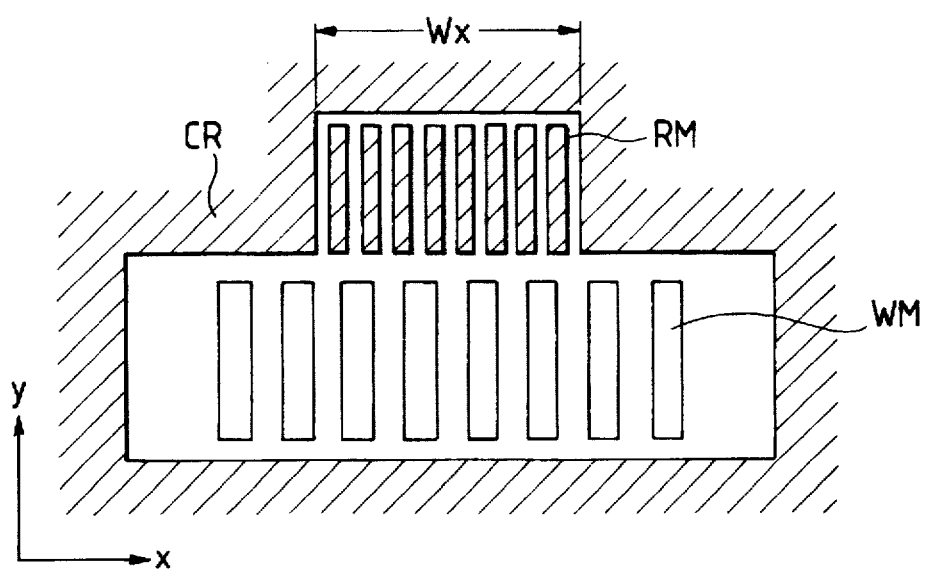

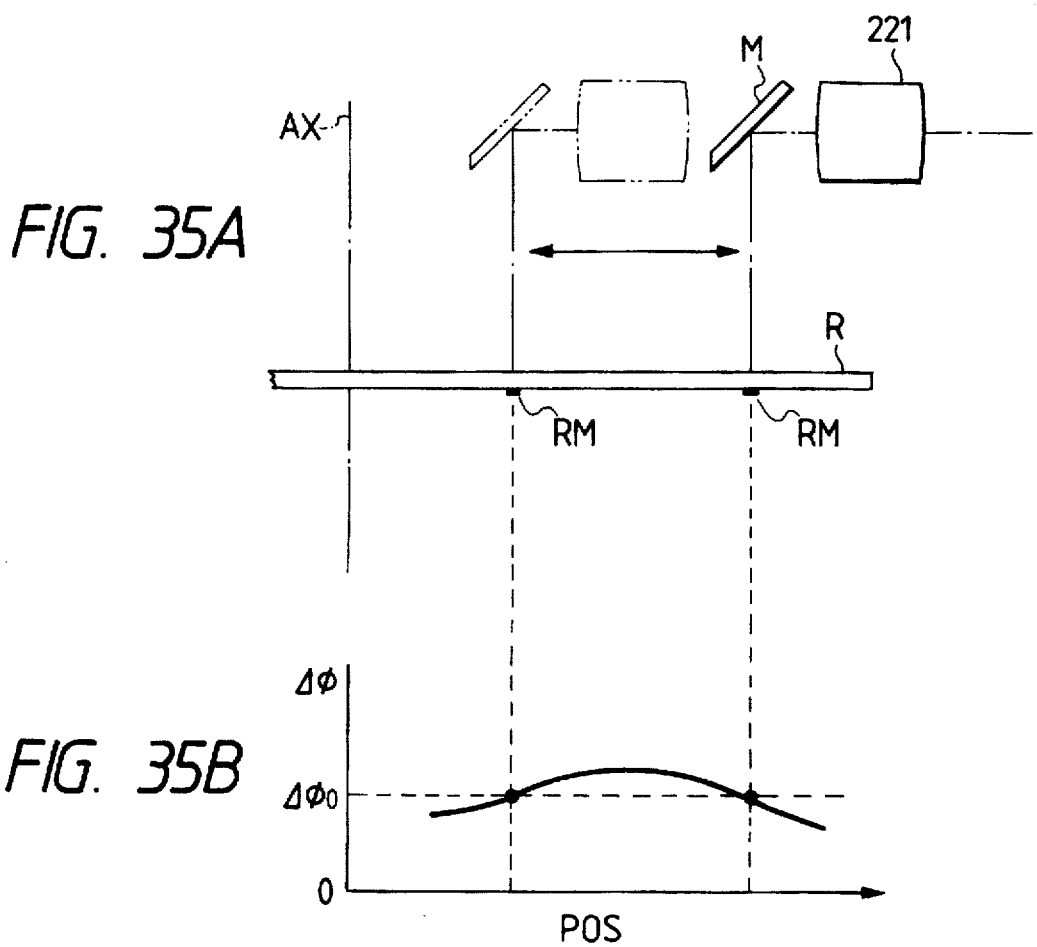
FIG. 35A
FIG. 35B
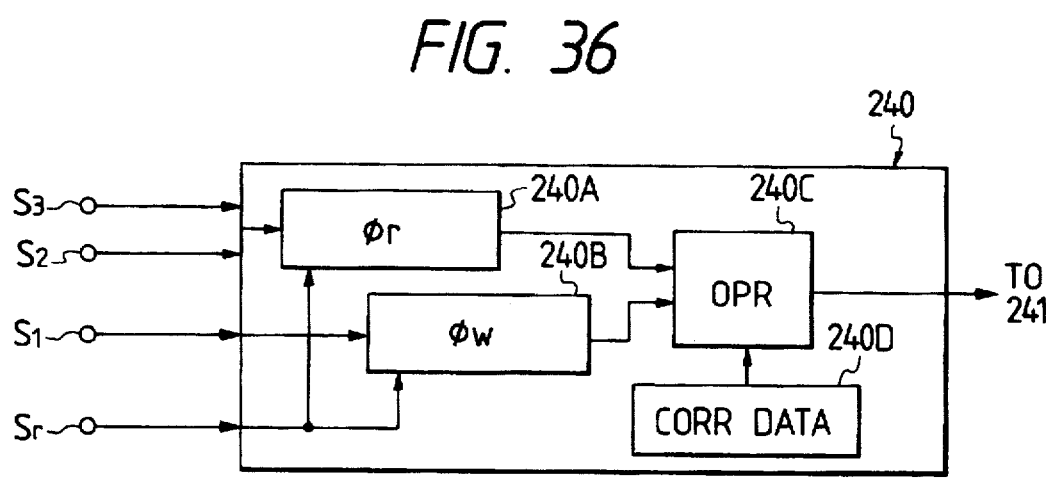
FIG. 36

PROJECTION EXPOSURE APPARATUS

This is a continuation of application Ser. No. 08/299,796 filed Sep. 1, 1994, which is a continuation of application Ser. No. 08/068,614 filed May 27, 1993, which is a continuation of application Ser. No. 07/781,690 filed Oct. 25, 1991, which is a continuation of application Ser. No. 07/624,534 filed Dec. 10, 1990, which is a continuation of application Ser. No. 07/418,260 filed Oct. 6, 1989, all now abandoned.

BACKGROUND OF THE INVENTION

1. Field of the Invention

The present invention relates to a projection exposure apparatus for use in manufacturing semiconductor devices, and, more particularly, to a stepper capable of successively exposing patterns of reticles (masks) on the resist layer of semiconductor wafers by a step-and-repeat system. The present invention further relates to an apparatus capable of relatively aligning a reticle and a wafer.

2. Related Background Art

Exposure apparatuses of the type described above are capable of successively causing images of circuit patterns formed on reticles to be exposed at a plurality of desired regions (shot regions) on a photosensitive substrate such as a wafer via a projection optical system. The wafer is placed on a wafer stage which can two-dimensionally move by stepping. In this case, a shot region on the wafer and the projected image of the circuit pattern must be overlapped with two-dimensional accuracy of better than ±0.2 µm. Therefore, the circuit pattern region formed on the reticle and each of the shot regions on the wafer are directly or indirectly aligned with each other. The aligning work is usually automated in the steppers and a variety of methods are employed, through the lens (TTL) method and through the reticle (TTR) method being widely used because of their high accuracy.

The TTL system is a system whose optical system (alignment system) is arranged so as to detect an alignment mark of a wafer via a projection optical system only, while the TTR method is a method whose optical system (alignment system) is arranged so as to detect both an alignment mark on a wafer and an alignment mark on a reticle via both the reticle and the projection optical system.

Since only an alignment mark of a wafer is substantially detected in the TTL method, it is necessary to define the detection position of the wafer mark on the basis of measurement of the positional relationship between the detection center of the alignment system thereof and the position of the reticle. On the other hand, since the alignment mark of the wafer and that of the reticle are simultaneously or directly detected in the TTR method, the aligning of the reticle and the wafer (or the shot region) can be directly achieved.

Therefore, the ideal method for aligning the reticle and the wafer is considered to be the TTR method. A projection exposure apparatus having the TTR method alignment system is disclosed in (1) U.S. Pat. No. 4,566,795 and another apparatus is disclosed in (2) U.S. Pat. No. 4,402,596, and the like.

Steppers of the type described above are usually arranged to conduct reduced projection on a scale of 1/5, 1/10, or the like, the projection optical system thereof having a projection lens at least the image side (wafer side) of which is in the form of a telecentric shape. The projection lens consists of 15 to 30 lens elements, and the chromatic aberration of which is usually compensated with respect to light in a wavelength region in order to obtain the most excellent resolving power and distortion characteristics at the time of exposure. The projection lenses which are widely in use are arranged in such a manner that either g-ray (wavelength: 436 nm) or i-ray (wavelength: 365 nm) of the spectrum of a mercury discharge lamp (or a Xe—Hg lamp) is arranged to serve as illumination light for the exposure operation, and the structure thereof is designed so as to exhibit the highest performance under this condition.

Therefore, as disclosed in the conventional technologies shown in (1) and (2), it is necessary to arrange the practical alignment system of the TTR method such that the wavelength of light (spot light caused from laser beams or a uniform illumination light) for illuminating the mark on the reticle and the mark on the wafer substantially coincides with that of exposure light. Furthermore, there is a conventional projection exposure apparatus arranged, for example, in such a manner that wavelength $\lambda e$ of exposure light and wavelength $\lambda a$ of illuminating light for conducting the alignment are, as shown in FIG. 14A, arranged not to meet each other and a projection lens whose chromatic aberration has been compensated with respect to the above-described two wavelengths is mounted on the above-described apparatus. Another conventional projection exposure apparatus is disclosed which is arranged in such a manner that a compensating lens for maintaining, at the time of the alignment, the conjugate relationship between the reticle and the wafer is disposed in a projection optical passage (from the reticle to the wafer) and the compensating lens thus disposed is retracted at the time of exposure.

However, the projection lens whose chromatic aberration has been compensated with respect to the two wavelengths as shown in FIG. 14A requires severe conditions (the spectrum width of the wavelength, the wavelength shift, and the like) to maintain its performance at the time of projection exposure. Furthermore, it cannot be easily manufactured. On the other hand, the system in which a compensating lens is provided between the reticle and the wafer encounters a problem in that its alignment accuracy deteriorates due to the mechanical instability of the compensating lens.

Although there are problems as described above, an advantage in using illumination light having an individual wavelength different from that of exposure light in the alignment operation lies in that a resist film covering the wafer mark region is not exposed (or is not easily exposed) at the time of the alignment. A more important advantage lies in that illumination light for the alignment operation or light reflected by the wafer mark cannot be easily absorbed by the resist film with respect to exposure light, and the quantity change in light reflected by the wafer mark is thereby restricted, causing the S/N ratio of the photoelectric signal to be stabilized.

An example of a projection lens capable of realizing the alignment by the TTR method by using illumination light of a non-photosensitive type and having an individual wavelength different from that of exposure light is disclosed in (3) U.S. Pat. No. 4,795,244, the projection lens having no compensating lens. As shown in FIG. 14B, the chromatic aberration characteristics of the projection lens above can be expressed by a cubic curve so that the severe conditions required to maintain performance at the time of projection exposure can be moderated by aligning the external value on the short wave side with wavelength $\lambda e$ of exposure light and by also aligning the zero crossing point on the long wave side with wavelength $\lambda a$ of illumination light for use in the alignment operation.

Another system for conducting the alignment on the basis of the TTR method is disclosed in (4) Japanese Patent Laid-Open No. 63-153820 (which corresponds to U.S. Ser. No. 076,740 filed Jul. 23, 1987 and continued as Ser. No. 287,559, filed Dec. 20, 1988, now U.S. Pat. No. 4,880,310), in which the projection lens is used as it is, non-photosensitive illumination light for the alignment operation is used, and no compensating lens is used. This system is a system in which illumination light for the alignment operation is arranged to be laser beam spot light to be applied from a position above the reticle, the system being characterized in that a double-focus element is disposed for the purpose of simultaneously focusing spot light beams to two points positioned away from each other on the optical axis, the two points corresponding to the axial chromatic aberration.

Since the mark on the wafer is detected by non-photosensitive illumination light for use in the alignment operation in the conventional apparatuses disclosed in (3) and (4), the problems experienced with the conventional apparatuses disclosed in (1) and (2) can be substantially overcome. However, the conventional apparatus disclosed in (3) is arranged for the purpose of compensating the axial chromatic aberration of the projection lens presupposing that its chromatic aberration of magnification is simultaneously compensated. However, since higher performance projection lenses have been required in recent years, it is very difficult to design and stably manufacture projection lenses both the axial chromatic aberration and the chromatic aberration of magnification of which are compensated.

In the conventional technology disclosed in (4) arranged such that the axial chromatic aberration of the projection lens is compensated by way of employing the double-focus beam for the alignment operation, the deviation between the reticle and the wafer is detected from optical information generated at the spot scanning position when either spot light is applied to the alignment mark on the reticle and optical information is generated at the spot scanning position when another spot light is applied to the mark on the wafer. Therefore, the chromatic aberration of magnification left in the projection lens can cause an alignment error. To this end, in the conventional technology disclosed in (4), it is necessary for the projection lens to have its chromatic aberration of magnification compensated in a certain range. This leads to a problem of difficulty in manufacturing the projection lens.

Furthermore, since both the conventional technology disclosed in (3) and (4) are based on the TTR method, a die-by-die alignment method can be readily employed which is capable of conducting the alignment in each of the shot regions on the wafer by disposing the mark on the reticle extremely adjacent to the circuit pattern region and also disposing the mark on the wafer extremely adjacent to the shot region (for example, in a street line).

In this case, although the resist is not sensitized when the mark on the wafer is aligned, the portion of the resist corresponding to the mark on the wafer is sensitized by the image of the mark on the reticle at the time of exposure. This leads to a problem of the destruction of the mark when the wafer is subjected to the processes after the development. As a result, the mark thus destroyed cannot be used in the alignment with the reticle on the ensuing layer.

The accuracy in alignment can be improved by improving the resolving power for detecting the position of the mark by a degree corresponding to the improvement in the resolving power. At present a diffraction grating attracts attention as the mark capable of conducting the most accurate detection.

The diffraction grating is capable of detecting the positional deviation between the reticle and the wafer from the phase difference of photoelectric signals obtained by relatively moving diffraction beams in the direction in which the gratings are arranged, the diffraction beams being respectively generated from the grating formed as a mark on the reticle and the grating formed as a mark on the wafer. An example of the diffraction grating is disclosed in (5) U.S. Pat. No. 4,251,160. There is a proximity exposure method capable of detecting the positional deviation between the reticle and the wafer with a resolving power better than a fraction of the pitch of the diffraction grating in accordance with optical information (sine wave-like change in the intensity) obtained by causing diffraction light generated from the grating of the reticle to interfere with diffraction light generated from the grating of the wafer. In this case, a report about an experiment has been made that a detection resolving power of several millimeters can be obtained in an alignment using the diffraction grating.

In the technology disclosed in U.S. Pat. No. 4,251,160 (5), the reticle is aligned with the substrate by disposing an optical modulator or the like in the alignment optical path arranged between the reticle and the projection optical system. Similarly to the above-described compensating lens disposed between the reticle and the wafer, the optical modulator must be arranged so as not to block a path through which the reticle pattern is imaged, for example, it is necessary for the optical modulator to be arranged to be movable with respect to the projection optical system. Although it is known that the alignment method which directly utilizes periodic optical information defined by the periodic structure of the diffraction grating exhibits excellent accuracy, a practical structure which can be applied to a projection exposure apparatus, more particularly, to a stepper has not been realized as yet.

To this end, an applicant of the present invention has disclosed a system in U.S. Ser. No. 192,784 filed May 10, 1988, continued as Ser. No. 469,713, filed Jan. 4, 1990; and continued as Ser. No. 536,939, filed Jun. 12, 1990, which is capable of overcoming a variety of problems experienced when the aligning system using diffraction gratings is applied to the projection exposure apparatus and achieving stability of the apparatus and an improvement in the alignment accuracy.

In the system described above, illumination light having an individual wavelength component which is distinct from the wavelength component of illumination light for the transcribing operation is used in the alignment operation. It is preferable that illumination light for the alignment operation be determined to be a non-photosensitive wavelength with respect to the resist, that is, a wavelength having higher transmittance with respect to the resist. The structure is arranged in such a manner that illumination light for the alignment operation is applied to the diffraction grating formed on the reticle and the diffraction grating formed on the wafer via an imaging optical system. Between a source of the illumination light for the alignment operation and the reticle there is provided a detection optical system whose aberration in the optical axis has been compensated in accordance with the quantity of chromatic aberration of the imaging optical system, the chromatic aberration being generated with respect to the wavelength of illumination light for the alignment operation. The detection optical system is representatively constituted by a double-focus optical system, one of the focal points of the double-focus optical system being arranged to coincide with a plane on which the diffraction grating for the reticle is formed.

Another focal point is arranged to coincide (to be conjugate) with a plane on which the grating for the wafer is formed, the focal point being arranged to coincide with it via an imaging optical system. Furthermore, orientation control means (for example, a radial grating) is provided, the means being capable of controlling the orientation of illumination light for the alignment operation in order to have each of the diffraction gratings illuminated from individual directions when illumination light for the alignment operation is applied to the reticle via the double focus optical system.

The problems expected to arise when an alignment is conducted with illumination light having an individual wavelength by using the diffraction grating can be substantially overcome. However, a problem is unsolved in that an image corresponding to an opening (a window serving as an alignment mark) in the reticle can be transcribed to an alignment mark (a diffraction grating) on the wafer at the time of exposure, causing the alignment mark on the wafer to be destroyed. This leads to a problem in that a novel alignment mark must be printed again when the next layer is formed on the wafer, which requires keeping a portion having a sufficient area in which the mark can be formed.

SUMMARY OF THE INVENTION

An object of the present invention is to provide an improved alignment system in a projection optical system.

Another object of the present invention is to provide an alignment system capable of realizing an alignment with light having an individual wavelength which is distinct from that of exposure light, and in which the wafer mark cannot be destroyed even if a die-by-die alignment method is employed.

A further object of the present invention is to provide a projection exposure apparatus which can be readily designed and manufactured.

The alignment system according to the present invention comprises a projection optical system which has been compensated without aberration with respect to light in a first wavelength (exposure light) so as to enable the pattern on a reticle (a mask) to be exposed on a wafer (a photosensitive substrate) with the most preferable imaging performance, while it has a magnification chromatic aberration (lateral chromatic aberration) or an axial chromatic aberration (vertical chromatic aberration) exceeding a predetermined value with respect to light in a second wavelength (illumination light for alignment operation). It is preferable that the projection optical system be constituted by a both side telecentric type. However, it can be replaced by a structure whose image side (wafer side) only is arranged to be the telecentric type. An illumination optical system for the alignment operation is provided so as to illuminate an alignment mark provided in an accompanied manner to a shot region on the wafer with light in a second wavelength. Furthermore, a mark detection system capable of detecting optical information on its side confronting the reticle via the projection optical system is provided, the optical information being generated from the alignment mark due to the illumination thus conducted. In this case, a first position at which the image of the alignment mark is projected reversely to the reticle side by the projection optical system with the first wavelength and a second position at which optical information generated from the alignment mark due to the application of light in the second wavelength reaches the reticle side via the projection optical system are arranged to be positioned away from each other corresponding to the quantity of the chromatic aberration.

The above-described mark detection optical system is disposed so as to be capable of detecting optical information of the alignment mark passing through a second position disposed at a distance corresponding to the chromatic aberration quantity. A variety of detection systems can be employed as the mark detection optical system, and a system can be employed in which a portion (for example, the objective lens) of the above-described illumination optical system for the alignment operation is commonly used.

The window formed in the reticle and used in the alignment operation and the image surface when the alignment mark on the wafer is reversely projected by the projection optical system are deviated from each other in the direction of the optical axis. An aspect of the present inventions lies in a structure constituted in such a manner that the main beam of illumination light for the alignment operation is applied to the wafer and is caused to incline with respect to the optical axis by a predetermined degree so as to cause the main beam of optical information (coherent light or the like) generated from the alignment mark to be inclined on the reticle side. In a projection optical system of a one-side telecentric type, a similar structure can be employed without the necessity of causing the main beam of the second illumination light to be inclined on the wafer side. In this case, the structure is arranged in such a manner that the position through which the main beam of the second illumination light passes is laterally deviated on the reticle side.

According to the present invention, the TTR or TTL system alignment using illumination light for the alignment operation having a wavelength different from that of exposure light can be conducted. In addition, the region in which the wafer mark is formed can be brought to a non-exposure state by the reticle during the exposure operation. Therefore, the advantage in the detection of the alignment mark on the wafer with light having a non-exposure wavelength can be effectively attained and the alignment mark can be protected without any necessity of providing an individual shield member.

A still further object of the present invention is to provide an alignment apparatus for use in a projection exposure apparatus capable of conducting a precise alignment with light for the alignment operation having a wavelength different from that of exposure light.

Another object of the present invention is to provide an alignment apparatus in which a coherent alignment method using a diffraction grating mark or the like is employed and the mark detection can thereby be conducted during the exposure operation in order to conduct alignments with an excellent resolving power.

Another object of the present invention is to provide an alignment apparatus capable of preventing optical information from an alignment mark formed on the reticle and from the alignment mark formed on the wafer from being mixed According to the present invention, an alignment apparatus can be provided in which the region for the reticle mark and the region for the wafer mark can be disposed so as not to overlap with the wavelength of exposure light when the reticle and the wafer are aligned to each other. In addition, in the apparatus, the grating constant (the pitch and the interval) of an image (the grating image) due to the projection optical system and the grating constant of the wafer mark are arranged to be different from each other. As a result, illumination light having the same polarization component are simultaneously applied to the reticle mark from two directions so that coherent light between 0-order diffraction light from the reticle mark and higher (1-order)

diffraction light (or scattering light) passing in the same direction as that of the 0-order diffraction light can be photoelectrically detected. As a result, a signal from the reticle mark and that from the wafer mark cannot be mixed, and only diffraction light reflected by the reticle mark can be detected so as to obtain a reticle signal. Consequently, precise alignment can be conducted with the noise component reduced satisfactorily.

According to the structure constituted in such a manner that illumination light for the alignment operation in which the telecentric state is deformed is diagonally applied to the mark on the wafer so as to detect dark visual field light (diffraction light), on-axis-alignment of the through-the-reticle system can be simultaneously applied to both the reticle and the wafer even if the structure is constituted in such a manner that a shield portion capable of protecting the mark on the wafer from exposure light is formed on the reticle. As a result, the necessity of re-printing the mark can be eliminated, and the pattern region can be effectively used. In the case where illumination light for the alignment operation is applied to the wafer through a window formed in the reticle, the window in the reticle can be positioned outside the shot region corresponding to the pattern region. Therefore, the size of the region in which the mark is formed on the wafer can be substantially reduced, and the mark can be easily formed on a street line.

In the case where i-rays or excimer laser beams are employed so as to serve as exposure light, the chromatic aberration quantity is caused to be enlarged considerably. However, since the window formed in the reticle can be, on the wafer, caused to correspond to the outside portion of the mark accompanying the shot region, the size of the mark on the wafer does not need to be enlarged.

BRIEF DESCRIPTION OF THE DRAWINGS

FIGS. 32A and 32B are views which illustrate the optical paths for describing states of diffraction light generated from the reticle marks;

FIG. 34 is a plan view which illustrates the relationship between the reticle mark and the wafer mark;

FIGS. 35A and 35B are views which respectively illustrate the relationship between the alignment system and the reticle, and a state of offset at each of alignment positions; and FIG. 36 is a block diagram which illustrates an example of a phase detection system.

DESCRIPTION OF THE PREFERRED EMBODIMENTS

Figure 1:
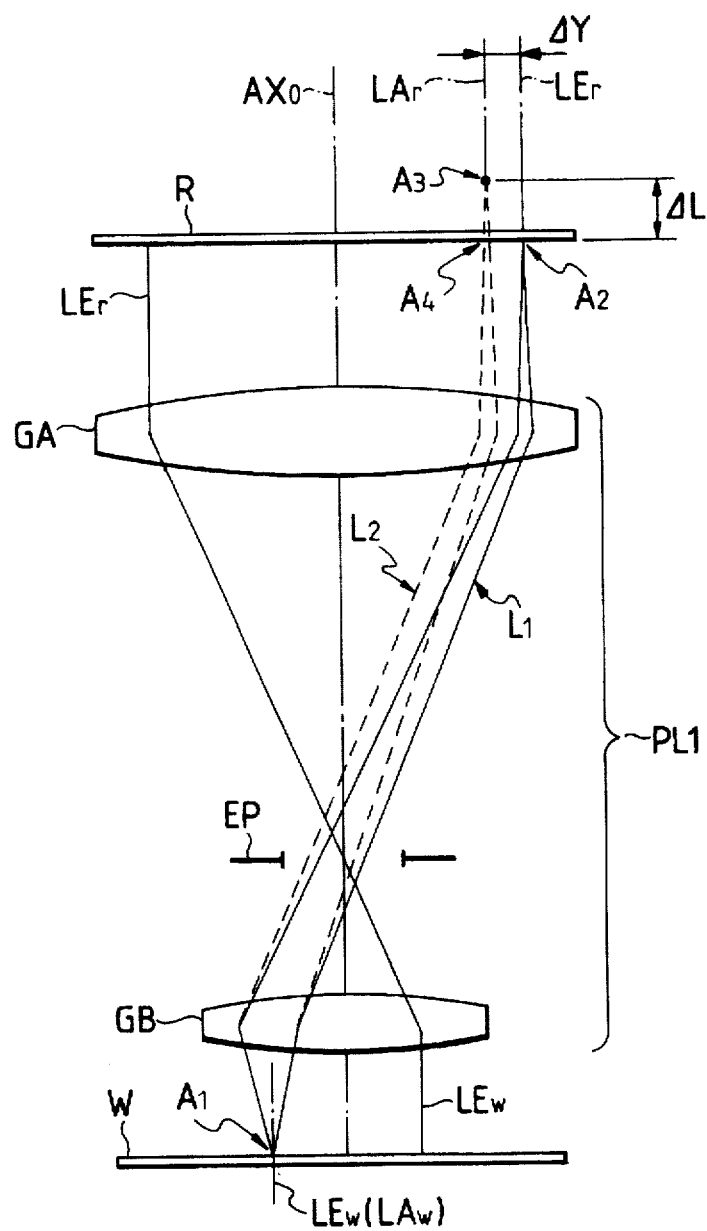
FIG. 1 is a view which illustrates an optical path for the purpose of describing a chromatic aberration of a first embodiment of a projection optical system according to the present invention.

The principle of a first embodiment will be described with reference to FIG. 1. Reticle R and wafer W are disposed in conjugation with each other with respect to projection lens system PL1 under condition of the wavelength of exposure light. The projection lens system PL1 is a reduced system of a double sided telecentric (an exit pupil and an entrance pupil are substantially infinite), the projection lens system PL1 being schematically constituted by lens groups GA and GB with pupil (diaphragm plane) EP held therebetween. Lines LEr and LEw intersecting optical axis $AX_0$ at the center of the pupil EP and connecting the reticle R and the wafer W represent a main beam of main flux $L_1$ of exposure light wherein the main beam LEr adjacent to the reticle R and the main beam $LE_w$ adjacent to the wafer W run parallel to the optical axis $AX_0$.

With the wavelength of exposure light, the flux $L_1$ from point $A_1$ outside the axis of the wafer W is imaged at point $A_2$ on the lower surface (pattern surface) of the reticle R via the projection lens system PL1. If the wavelength of the flux $L_2$ from the point $A_1$ is different from that of exposure light, the flux $L_2$ is not imaged at the point $A_2$, but is imaged at point $A_3$ due to the chromatic aberration of the projection lens system PL1. The deviation between the points $A_2$ and $A_3$ can be classified into a lateral deviation in the visual field of the projection lens system PL1 and a vertical deviation along the optical axis $AX_0$, where the lateral deviation is called magnification chromatic aberration quantity $\Delta Y$, while the vertical deviation is called axial chromatic aberration quantity $\Delta L$. Assuming that the main beam of the flux $L_2$ adjacent to the wafer W is $LA_w$, and the same adjacent to the reticle R is LAr, the magnification chromatic aberration quantity $\Delta Y$ is lateral deviations of the main beams LEr and LAr. Since the projection lens system is symmetric with respect to the optical axis $AX_0$ in general, the magnification chromatic aberration quantity is defined by a lateral deviation in the radial direction relative to the optical axis $AX_0$. The magnification chromatic aberration quantity $\Delta Y$ adjacent to the reticle R is reduced in the portion adjacent to the wafer W by a degree corresponding to the magnification of the projection lens system PL1. If the magnification is, for example, 1/5, the magnification chromatic aberration quantity adjacent to the wafer W becomes $\Delta Y/5$. On the other hand, the axial chromatic aberration adjacent to the wafer is reduced with respect to that adjacent to the reticle by a degree corresponding to the square of the magnification so that it becomes $\Delta L/25$. If the chromatic aberration quantity $\Delta Y$ is defined to be a level exceeding a certain value, the point $A_2$ on the reticle and the point $A_4$ on the reticle through which the flux $L_2$ passes can be positioned away from each other by a relatively long distance. Therefore, an alignment mark is provided at the point $A_1$ on the wafer, a transparent window having a size through which the flux $L_2$ can pass is provided at the point $A_4$ on the reticle, and a shield which is larger than the alignment mark on the wafer is provided at the point $A_2$ on the reticle R. Then, light which is different from exposure light, for example, a laser beam of a single wavelength exceeding 580 nm or the like with which the sensitivity for sensitizing the resist can be substantially eliminated is applied to the alignment mark on the wafer.

Furthermore, the flux $L_2$ from the alignment mark on the wafer can be detected through the window at the point $A_4$ so that the alignment between the reticle and the wafer can be established by arranging a mark detection optical system so as to have its detection center (an optical axis of an objective lens for the alignment operation or the like) substantially coincident with the main beam LAr.

When exposure light is applied to the reticle after the window (point $A_4$) on the reticle has correctly aligned with the alignment mark (point $A_1$) on the wafer, the image projected by exposure light which has passed through the transmission window formed in the reticle is formed at a position shifted from the point $A_1$ on the wafer by a distance $\Delta Y/5$, and the projected image of the shield and formed at point $A_2$ on the reticle is so formed at a position as to cover the alignment mark on the wafer.

Therefore, the alignment mark can be protected by determining the magnification chromatic aberration quantity $\Delta Y$ to a level exceeding a certain value corresponding to the size of the transmissive window formed in the reticle, the dimension of the shield, and the size of the alignment mark on the wafer.

Now referring to FIGS. 2 and 3, the structure of a first embodiment of a projection exposure apparatus will be described.

Exposure light emitted from a mercury discharge lamp (or a Xe—Hg lamp) or an excimer laser beam source illuminates a variable illumination field diaphragm (a reticle blind) 4 via a lens system 2 with a uniform illuminance distribution. The reticle blind 4 has an opening with which the illumination range on the reticle R can be divided into sections of an optional size and shape, and exposing illumination light ILe which has passed through the blind 4 is made incident upon a main condenser lens system 12 via a lens system 6, a parallel flat plate 8 made of quartz or the like, and a reflecting mirror 10. The illumination light ILe emitted from the condenser lens system 12 is caused to be the main beam LEr whose main axis runs parallel to the optical axis $AX_0$. The main beam LEr passes through a dichroic mirror 14 which is arranged diagonally with respect to the optical axis $AX_0$ by 45°, and illuminates the reticle R.

The reticle blind 4 is disposed in conjugation with (in the relationship with which an image can be formed) a pattern surface of the reticle R. The dichroic mirror 14 is arranged to have characteristics causing about 90% or more of the wavelength of the exposing illumination light ILe (for example, g-ray, i-ray, or 294 nm) to pass through the dichroic mirror 14, and reflecting wavelengths longer than that of the illumination light ILe by about 90% or more.

Illuminated region IA on the reticle which is defined by the reticle blind 4 is arranged to have a size which can cover both pattern region PA of the reticle and exposing transparent window $RS_1$ disposed extremely adjacent to the pattern region PA. A shield $LS_1$ made of chrome or the like is layered on the reticle in a portion which is outside the window $RS_1$, and in the portion which is outside the thus formed shield $LS_1$, a reticle alignment mark $RM_1$ is formed.

The reticle alignment mark $RM_1$ is arranged to be positioned at a constant position regardless of the size of the pattern region PA on the reticle, and is arranged to be positioned outside the illuminated region IA defined by the reticle blind 4. The reticle R is held by a reticle stage 16, the position of the reticle stage 16 being determined by slightly moving the reticle in such a manner that the central point of the pattern region PA of the reticle coincides with the optical axis $AX_0$. Image PA' of the pattern region PA on the reticle is projected by the double sided telecentric projection lens system PL1 overlapping a shot region on the wafer. On the wafer there is provided alignment mark $WM_1$ at a position extremely adjacent to the shot region (in a street line) with a constant positional relationship kept therebetween.

The alignment mark $WM_1$ is positioned so as to establish a relationship with the shield $LS_1$ of the reticle from which an image can be formed with the wavelength of exposure light when the projected image PA' of the pattern region PA of the reticle and the shot region on the wafer to be exposed are correctly overlapped. Therefore, between the mark $WM_1$ and the shot region there is provide a margin in which the projected image of the window $RS_1$ formed in the reticle can be placed. Since the wafer W is exposed with a step-and-repeat method, it is held by a wafer stage 18 equipped with an interferometer capable of precisely two-dimensionally moving in direction X-Y.

An alignment system 20 of the TTR system for detecting the mark $WM_1$ on the wafer is disposed so as to be capable of supplying light having a wavelength longer than that of exposure light to the window $RS_1$ formed in the reticle after it has caused longer wavelength light to be reflected by the dichroic mirror 14, and so as to be capable of receiving light from the mark $WM_1$ which has passed through the window $RS_1$ and then been reflected by the dichroic mirror 14. An objective lens 30 disposed at the end portion of the alignment system 20 is arranged horizontally outside of (on the left of the drawing) an optical path alone which exposure light passes through the dichroic mirror 14, and so that the optical axis of the objective lens 30 coincides with the main beam LAr (or LAw) of the alignment flux (non-photosensitive) which passes through the window $RS_1$. Therefore, the objective lens 30 can always detect the mark $WM_1$ on the wafer even if the exposure operation is being performed.

According to this embodiment, since the magnification chromatic aberration quantity $\Delta Y$ of the projection lens system PL1 is retained at a value exceeding a certain level, the axial chromatic aberration quantity $\Delta L$ inevitably becomes a relatively large value. In order to overcome this problem, a double focus element 32 made of a doubly refractive material (crystal or calcite) is provided for the alignment system 20 at a position on a front focal surface (pupil surface) of the telecentric objective lens 30. The alignment system 20 is constituted so as to be capable of detecting the mark by, at least, three individual methods.

A first mark-detection system is a system in which the window $RS_1$ formed in the reticle and the mark $WM_1$ on the wafer are scanned with slit-shaped spot light formed by a laser beam and optical information from the window $RS_1$ and that from the mark $WM_1$ are photoelectrically detected. In order to achieve the detection in this system, the system comprises laser beam ILc with, for example, wavelength 580 nm or longer, a mirror 50, a beam splitter 48, a lens system 46, a scanner mirror 44, a lens system 40, a movable mirror or a beam splitter 38, a lens system 36, the double focus element 32, the objective lens 30, a lens system 52, and a photoelectric detector 54.

Figure 7:
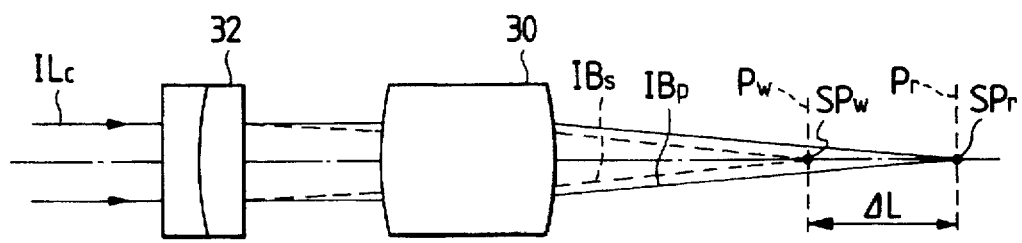
FIG. 7 is a view which illustrates an optical path for the purpose of describing the function of a double-focus element.

The laser beam ILc reaches the mirror 50 via an optical system formed by a beam expander, a cylindrical lens, and the like after it has been emitted from an Ar ion laser beam source (omitted from illustration). Then it passes through the beam splitter 48 and the lens system 46 before being deflected by the scanner mirror 44. The origin of the deflection of the scanner mirror 44 is determined so as to establish a conjugate relationship with the position of the double focus element 32 via the relay system constituted by the lens systems 40 and 36, that is, a conjugate relationship with the front focal surface of the objective lens 30. The linearly deflected beam ILc which has been substantially collimated due to being deflectively scanned by the double focus element 32 and the objective lens 30 is, as shown in FIG. 7, given individually energy according to the difference in the deflective components (an ordinary ray $IB_s$ or an extraordinary ray $IB_p$) so that two components of spot light SPw and SPr are imaged in two corresponding surfaces Pw and Pr which are positioned away from each other in the direction of the optical axis of the objective lens 30. The double focus element 32 is designed so as to make the distance between the two surfaces Pw and Pr substantially the same as the axial chromatic aberration quantity $\Delta L$ of the projection lens system in the portion adjacent to the reticle. Therefore, the making of the surface Pr coincide with the window $RS_1$ in the pattern surface of the reticle causes the other surface Pw to be in conjugation with the surface of the wafer via the projection lens system. As a result, spot light Spr scans the window $RS_1$, while spot light, which is spot light obtained by again imaging spot light Spw by the projection lens system, scans the mark $WM_1$ on the wafer.

information from the window $RS_1$ (the alignment mark) and the mark $WM_1$ again passes through the objective lens 30, the double focus element 32, the lens systems 36 and 40, and the scanner mirror 44 until it is reflected by the beam splitter 48 so that it reaches the photoelectric detector 54. The photoelectric detector 54 is constituted by: a spatial filter disposed in conjugation with the origin of the deflection of the scanner mirror 44 by the optical system consisting of the lens systems 46 and 52; and a light receiving element capable of receiving diffraction light and scattered light except for 0-order light (regularly reflected light) which have passed through the spatial filter. Since the front focal surface (the position of the double focus element 32) of the objective lens 30 is in conjugation with the pupil EP of the projection lens system, the spatial filter is in conjugation with the pupil EP. Therefore, a photoelectric signal can be obtained from the light receiving element, the signal being of a level corresponding to the quantities of diffractive light and scattered light caused by the application of each spot light to the window $RS_1$ and the mark $WM_1$, respectively.

The second system for detecting the mark is a more simple image observation system comprising illumination light ILa whose wavelength is determined to be the same as the beam ILc, lens systems 60 and 36, a beam splitter 34, the double focus element 32, the objective lens 30, a lens system 56, and an imaging element 58 such as a CCD.

The lens systems 60 and 36 form a light source image of illumination light ILa at a position of the double focus element 32, that is, at the pupil EP of the projection lens, while the lens system 56 images a flux from the window $RS_1$ and the mark $WM_1$, which has passed through the objective lens 30 and the double focus element 32, on the light receiving surface of the imaging element 58. According to this system, the pattern surface of the reticle and the surface of the wafer can coincide with each other on the imaging surface and can be thereby observed simultaneously by introducing light from an object which has been made incident upon the objective lens 30 into the double focus element 32. Therefore, an alignment between the window $RS_1$ formed in the reticle and the mark $WM_1$ on the wafer is established in response to an image signal transmitted from the imaging element 58.

The third system for detecting the mark is a system constituted in such a manner that the mark $WM_1$ on the wafer is arranged to be in the form of a diffraction grating pattern expanding two-dimensionally. In the direction of the arrangement of the gratings, two coherent beams which are inclined at individual angles different from each other are simultaneously applied so as to form parallel interference fringes on the grating pattern. Thus, the deviation between the grating pattern (the deviation in the direction of the arrangement of the gratings) and the interference fringes is detected. In order to perform the detection described above, the system comprises two beams ILb having the same wavelength as that of the beam ILc, a lens system 62, a mirror or a beam splitter 42, a lens system 40, a mirror 38, the lens system 36, the double focus element 32, and the objective lens 30. Although its light receiving system is omitted from illustration, it must be constituted in such a manner that a light receiving element is in conjugation with the pupil EP of the projection lens system.

The two beams ILb are arranged so as to become two substantially-collimated fluxes intersecting at a symmetric angle of inclination with respect to the optical axis on surface 1P which is positioned in an intermediate position of the optical path. The surface 1P is arranged to be in conjugation with the window $RS_1$ formed in the reticle and with the surface of the wafer. Thus, the positional relationship between the interference fringes and the diffraction grating pattern can be detected by photoelectrically detecting the intensity of interfered light from the diffraction grating pattern passing on the optical axis along the main beams LAw and LAr.

According to the above-described three mark detecting systems, the mark $RM_1$ can be readily detected by moving the objective lens 30, the double focus element 32, and the like in part in such a manner that the main beam LBr passing through the reticle alignment mark $RM_1$ disposed in the vicinity of the reticle and in parallel to the optical axis $AX_0$ coincides with the optical axis of the objective lens 30. Since the reticle alignment mark $RM_1$, must be aligned with a reference position of the apparatus, it is preferable that an individual microscope or a photoelectric detector or the like be provided in a fixed manner. In the case where the TTR system die-by-die alignment method is employed in which the alignment system 20 is used, the size of the pattern region PA can be varied by the reticle. This causes the position of the window $RS_1$ formed in the reticle and that of the shield $LS_1$ to be shifted. Therefore, it is preferable that at least the objective lens 30 and the double focus element 32 be arranged to be movable in the vertical direction when viewed in FIG. 2 and it is further preferable that the above-described two elements be arranged to be movable in the perpendicular direction when viewed in the same drawing in order to permit freedom of arrangement of the mark.

Figure 2:
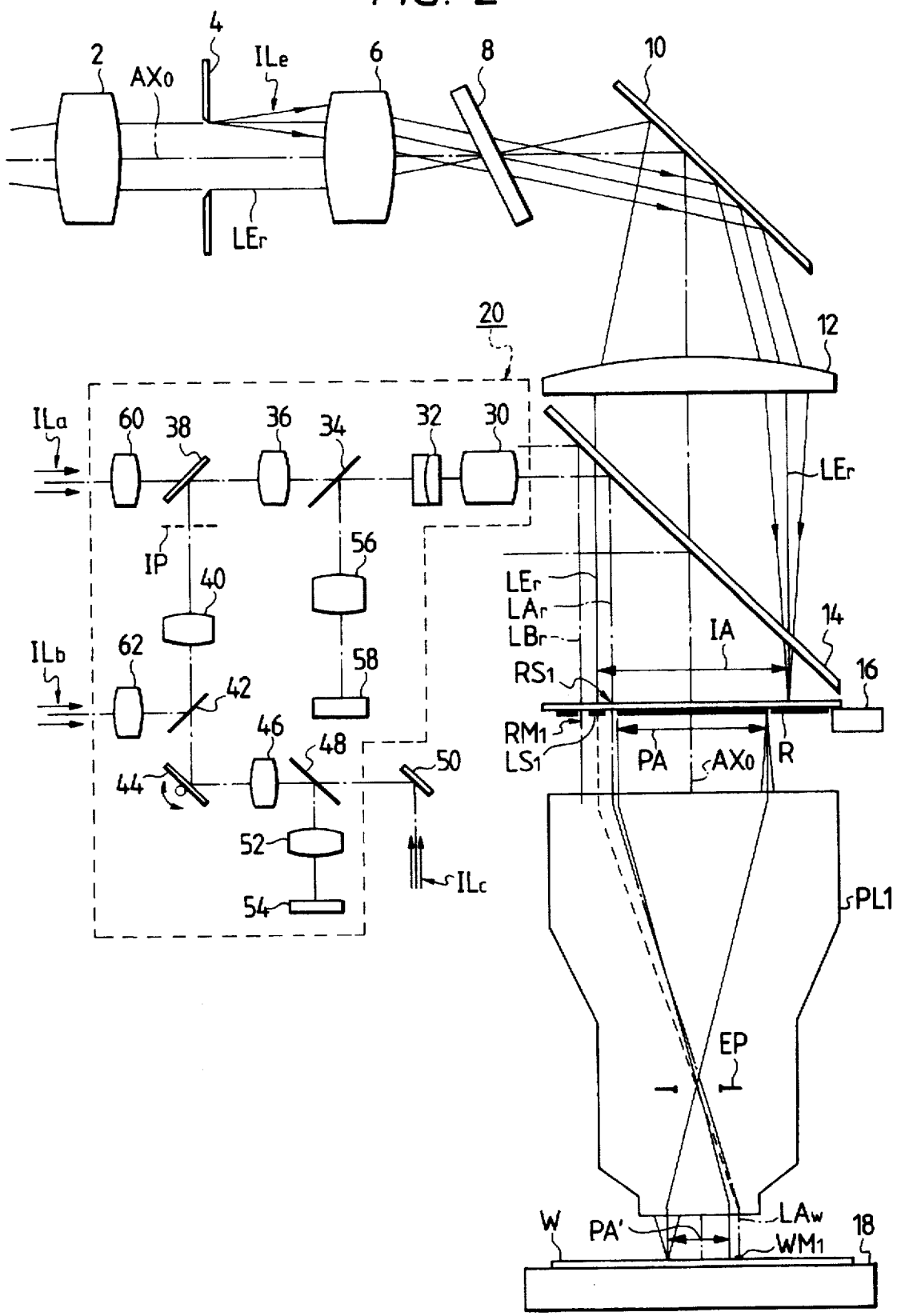
FIG. 2 is a view which illustrates the structure of a projection exposure apparatus according to the first embodiment of the present invention.
Figure 3:
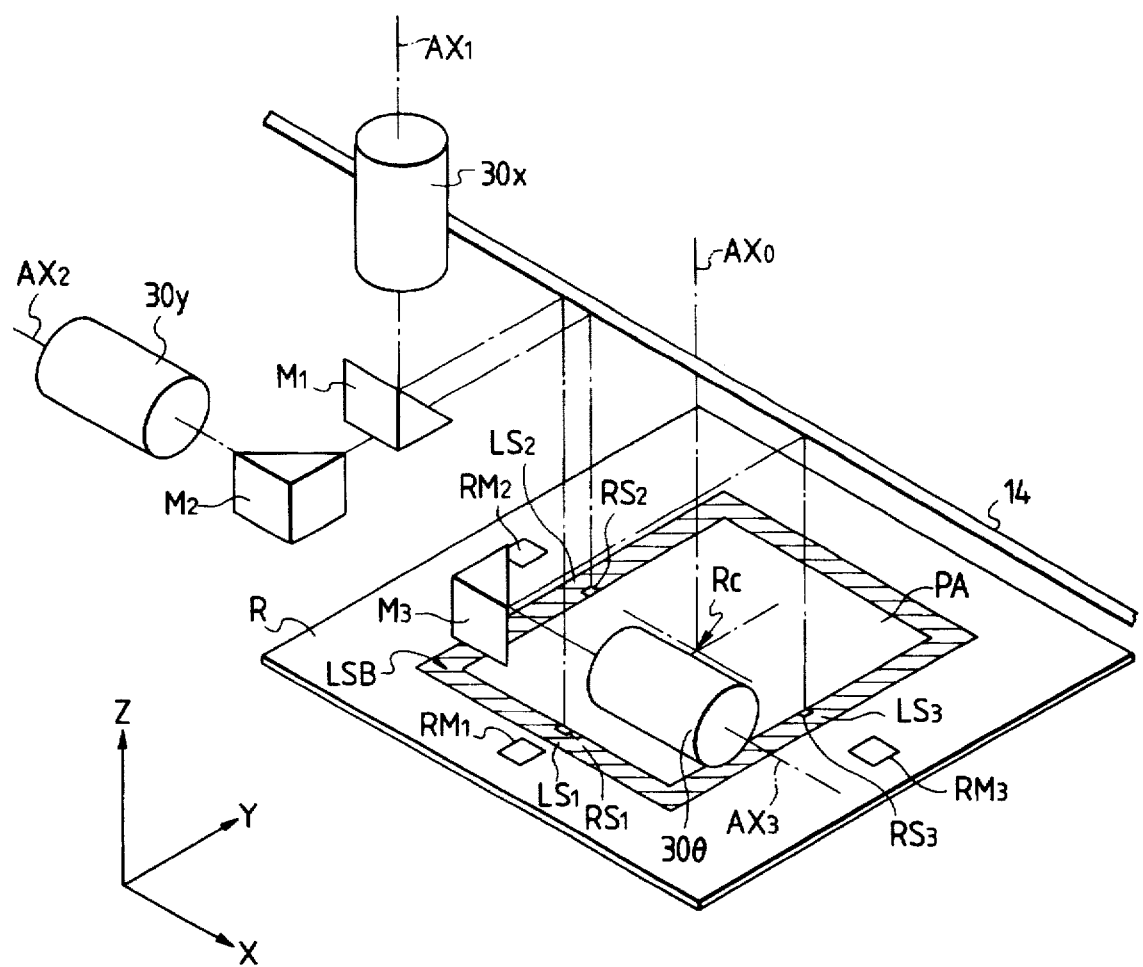
FIG. 3 is a perspective view which illustrates a portion of the alignment system of the apparatus shown in FIG. 2.

Although an alignment system 20 capable of detecting a mark is illustrated in FIG. 2, it is preferable that the structure be constituted, for example, as shown in FIG. 3 for the purpose of detecting two or more marks. FIG. 3 is a view which illustrates the arrangement of the reticle R, the dichroic mirror 14, and each of objective lenses $30x$, $30y$, and $30\theta$ in three alignment systems. The optical axis $AX_0$ passes through center RC of the reticle, and windows $RS_1$, $RS_2$, and $RS_3$ are provided at three places in the periphery of the pattern region, the three places being positioned away from each other in the directions X and Y from the center RC. Shields $LS_1$, $LS_2$, and $LS_3$ are formed at portions outside the windows $RS_1$, $RS_2$, and $RS_3$, the shields $LS_1$, $LS_2$, and $LS_3$ being integrally formed with frame-shaped shield band LSB having a predetermined width and surrounding the pattern region. Furthermore, reticle alignment marks $RM_1$, $RM_2$, and $RM_3$ are formed at three places outside the shield band LSB.

Mirrors $M_1$, $M_2$, and $M_3$ are respectively disposed integrally with objective lenses $30x$, $30y$, and $30\theta$ at the front portions of these objective lenses. Optical axes $AX_1$, $AX_2$, and $AX_3$ of the objective lenses $30x$, $30y$, and $30\theta$ are disposed so as to respectively run parallel with plane X-Z. The structure is constituted in such a manner that the objective lens $30x$ and the mirror $M_1$ move integrally and in parallel in directions Z (in the direction along the optical axis $AX_0$) and X, while a pair consisting of the objective lens $30y$ and the mirror $M_2$ and a pair consisting of the objective lens $30\theta$ and the mirror $M_3$ individually move integrally and in parallel in directions X and Z.

Although only the objective lenses $30x$, $30y$, and $30\theta$ are illustrated in FIG. 3, each of double focus elements is integrally provided, and the arrangement following the double focus element (in the portion adjacent to the illumination light source for the alignment operation) is constituted in the form of an afocal system. The three mirrors $M_1$, $M_2$, and $M_3$ are disposed so as not to be interposed in a space below the dichroic mirror 14. It is advantageous for the mirrors $M_1$, $M_2$, and $M_3$ to be respectively disposed at front ends of the objective lenses $30x$, $30y$, and $30\theta$ since the distances of observation movements performed by the objective lenses $30x$, $30y$, and $30\theta$ can be relatively lengthened in accordance with the variation in the size of the pattern region PA of the reticle, that is, the shifts of the positions of the windows $RS_1$, $RS_2$, and $RS_3$ with respect to the center RC of the reticle.

Figure 4:
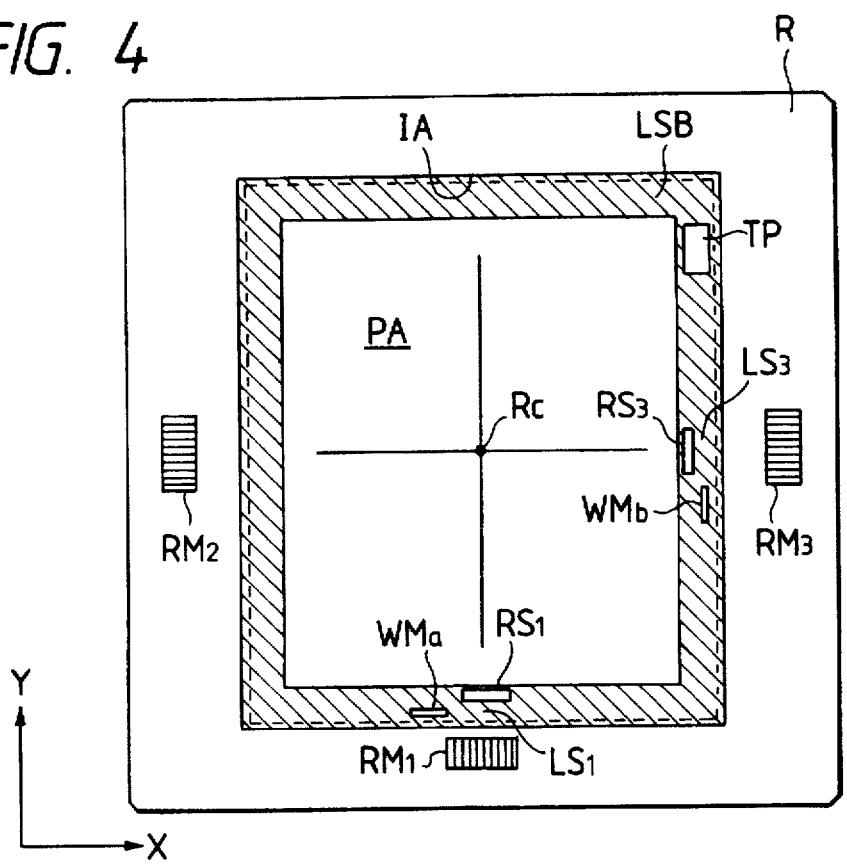
FIG. 4 is a plan view which illustrates a pattern of a reticle and the arrangement of the pattern.
Figure 5:
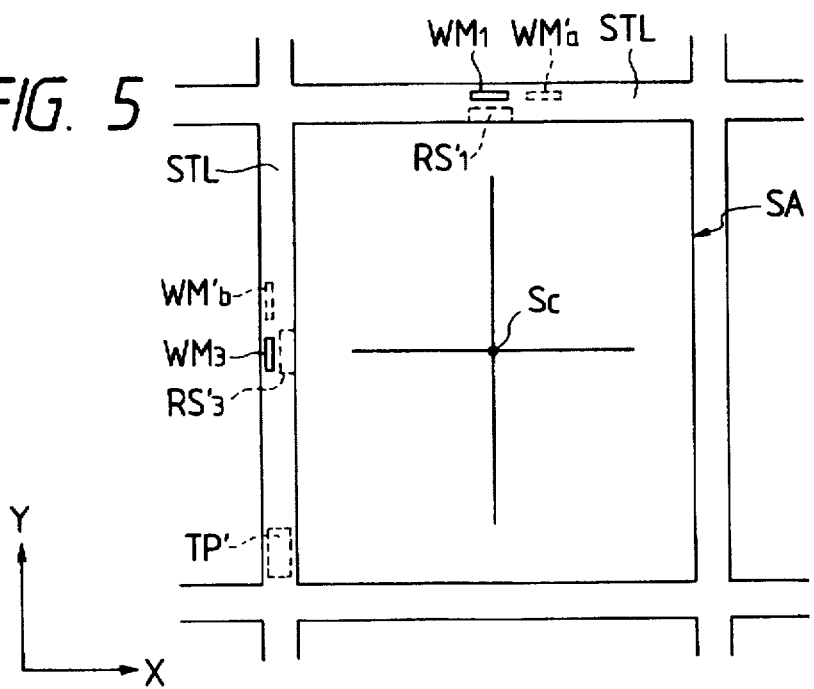
FIG. 5 is a plan view which illustrates the arrangement of shot regions on the wafer.

The operation of this embodiment will be described with reference to FIGS. 4, 5, and 6. FIG. 4 is a view which illustrates the shape and the arrangement of the pattern of the reticle for use in an operation for overlap-exposing the second layer and the ensuing layers. FIG. 5 is a view which illustrates a region SA of a plurality of shot regions (for example, the first layer) which have been previously formed on the wafer.

Referring to FIG. 5, a street line STL usually having a width of 50 to 100 μm is formed at each of the four sides of the shot region SA. Since the thus formed street line STL serves as a margin for use when the chip is cut from the wafer, no circuit pattern is formed in this area. Therefore, the marks $WM_1$ and $WM_3$ are simultaneously formed on a line passing through the shot center SC and running parallel to Y-axis and a line passing through the center SC and running parallel to X-axis, the marks $WM_1$ and $WM_3$ being formed within the width of the street line STL. According to this embodiment, the marks $WM_1$ and $WM_3$ are not disposed adjacent to the shot region SA, but are disposed within the width of the street line STL and away from the boundary of the shot region SA by a distance corresponding to the magnification chromatic aberration quantity $\Delta Y/5$. The mark $WM_1$ is used for the purpose of detecting the position in direction X, while the mark $WM_3$ is used for the purpose of detecting the position in direction Y.

The recticle R shown in FIG. 4 has a pattern region PA which is five times the area of the shot region SA and which is upside down and inverted right to left relative to the region SA of the wafer. The pattern region PA, the shield band LSB, and the reticle alignment marks $RM_1$, $RM_2$ and $RM_3$ are formed in the reticle R to be exposed overlapped on and around the shot region SA. The window $RS_1$ is disposed on a line passing through the reticle center RC and running parallel to the Y-axis at a position adjacent to the pattern region PA. The window $RS_3$ is disposed on a line passing through the reticle center RC and running parallel to the X-axis at a position adjacent to the pattern region PA. According to this embodiment, the width of the shield band LSB is arranged to be five times the width of the street line STL (50 to 100 μm) and the size of the illuminated region IA, shown in FIG. 2, by virtue of the reticle blind 4 is arranged to be large enough to cover one shot region SA on the wafer and the street lines STLs disposed on the four sides surrounding the shot region SA. Therefore, the pattern (the transparent portion) formed in the illuminated region IA and within the shield band LSB is projected and exposed to the street lines STL on the wafer.

In the shield band LSB, the shielding portion $LS_1$ and the shielding portion $LS_3$ outside the windows $RS_1$ and $RS_3$ act to protect the marks $WM_1$ and $WM_3$ on the wafer. Furthermore, mark patterns (five times) WMa and WMb for transcribing a novel wafer mark are formed adjacent to the windows $RS_1$ and $RS_3$ in the shield band LSB. The positions of the mark patterns WMa and WMb may be freely determined if they do not overlap the marks $WM_1$ and $WM_3$ on the wafer and are away from the pattern region PA by a distance corresponding to the magnification chromatic aberration quantity ΔY. In the case where no novel wafer mark is to be transcribed, the marks patterns WMa and WMb are not necessary. In the case where a test pattern TP' is formed on the surface of the wafer (in particular, is formed within the street line STL), test pattern TP may be formed in the fringe area of the shield band LSB.

When the reticle R and the shot region SA are aligned with each other, the wafer stage 18 is first stepped so as to cause the shot center SC to substantially coincide with the reticle center RC. AssUming that the global alignment of the wafer is established correctly by an off-axis wafer microscope (omitted from illustration) or the like, the deviation between the centers SC and RC can be restricted to ±1 μm or less. Therefore, the two marks $WM_1$ and $WM_3$ on the wafer are caused to be positioned when they can be respectively observed through the windows $RS_1$ and $RS_3$ formed in the reticle.

Then, the alignment between the window $RS_1$ and the mark $WM_1$ is established by the alignment system 20, and the alignment between the window $RS_3$ and the mark $WM_3$ is also established by the same system. Assuming that the alignments described above are established by the first detection system using the alignment system 20, that is, are established by conducting the scanning with double-focus spot light SPr and SPw (see FIG. 7), a photoelectric signal, for example, as shown in FIG. 6 can be obtained. FIG. 6 is a view which illustrates the relationship between spot light SP, the window $RS_1$, and the mark $WM_1$. Referring to this drawing, spot light SP (SPr, SPw) is in the form of a slit elongated in direction Y, and it moves in direction X with an amplitude with which it can cross the window $RS_1$. The window RS1 is formed rectangular and having two edges $E_1$ and $E_2$ (edges formed by chrome layer) formed in parallel to spot light SP which are arranged to be used for conducting the alignment operation. The mark $WM_1$ on the wafer consists of a plurality (seven patterns are provided here) of linear patterns which run parallel to spot light SP, edges Ea and Eb of the mark $WM_1$ running parallel to spot light SP corresponding to the linear patterns being used to conduct the alignment operation. When spot light SP starts scanning, the photoelectric detector 54 transmits a signal waveform 541 which reaches its peak when spot light SPr coincides with the edges $E_1$ and $E_2$ of the window $RS_1$, and transmits another signal waveform 542 which reaches its peak when spot light SPw coincides with the edges Ea and Eb. A signal processing system (omitted from illustration) acts to obtain middle point Xr of the edges $E_1$ and $E_2$ in direction X from the signal waveform 541, obtain middle point Xw of the overall body of the mark $WM_1$ in direction X from the signal waveform 542, and obtain deviation Δx between Xr and Xw.

Since the directions of deflections of spot light SPr and SPw are different from each other and spot light SPr and SPw are positioned away from each other in the direction of the optical axis, optical information from the edges $E_1$ and $E_2$ of the window $RS_1$ and optical information from the mark $WM_1$ can be separated and detected by the photoelectric detector 54 with an excellent S/N ratio retained by using a polarization beam splitter.

The above-described operation is simultaneously conducted in the alignment operation in direction Y by using the window $RS_3$ and the mark $WM_3$. After the deviation Δx between the reticle and the shot region SA has been thus obtained, the wafer stage 18 or the reticle stage 16 is moved slightly so as to cause the middle point Xr to coincide with Xw. The above-described operation for detecting the middle points Xr and Xw is repeated successively until the deviations of the middle points Xr and Xw reach a predetermined allowable limit (for example, ±0.06 μm). At this time, exposure light is applied to the region IA to be illuminated via the exposing illumination optical system.

According to this embodiment, since the dichroic mirror 14 is provided, the deviation between the mark $WM_1$ ($WM_3$) and the window $RS_1$ ($RS_3$) can be always detected and the reticle stage 16 or the wafer stage 18 can thereby be feedback-controlled in such a manner that the deviation is caused to be within the allowable limit. Therefore, any image shake due to unnecessary vibrations during the exposure operation can be prevented. As a result, an extremely precise alignment can be achieved.

During the exposure operation above, the windows $RS_1$ and $RS_3$ formed in the reticle are positioned in the illuminated region IA of the reticle blind 4 and are thereby projected to the surface of the wafer. As shown in FIG. 5, their projected images $RS_1'$ and $RS_3'$ are positioned on the street lines STL between the marks $WM_1$ and $WM_3$ and the shot region SA. The marks $WM_1$ and $WM_3$ (regions in which marks are formed) are shielded by the shield portions $LS_1$ and $LS_3$ in the reticle so that the marks $WM_1$ and $WM_3$ are not subjected to the exposure.

Images WMa' and Wmb' of the novel wafer mark patterns WMa and WMb are formed at positions next to the marks $WM_1$ and $WM_3$. Symbol TP' represents a projected image of the test pattern TP.

According to this embodiment, two windows $RS_1$ and $RS_3$ formed in the reticle are arranged to be detected by two objective lenses 30x and 30θ shown in FIG. 3. The structure may be arranged in such a manner that the window $RS_2$ opposite the window $RS_3$ is also. used and the marks $WM_1$, $WM_2$, and $WM_3$ are simultaneously detected by the three objective lenses 30x, 30y, and 30θ. A structure in which the second and third systems for detecting the mark provided in the alignment system 20 is able to realize the same effect.

If light having a wavelength other than that of exposure light is used in the projection lens system of the type described above for the. purpose of obtaining the extremely improved resolving power with exposure light and the quality of the formed image, an error of the type in which the main beam LAr or LAw shown in FIG. 1 does not run parallel to the optical axis $AX_0$, that is, a so-called telecentric error is caused to occur. The thus caused telecentric error can cause a lateral deviation of optical information which reaches the photoelectric detector 54 in the alignment system 20. Therefore, the telecentric error described above must be corrected. In order to correct the telecentric error, a structure may be employed in FIG. 2 comprising parallel flat glass plates which can be tilted. A parallel flat glass plate is respectively disposed between the scanner mirror 44 and the lens system 46 and between the lens system 52 and the photoelectric detector 54, so that the flux is laterally shifted in the pupil in accordance with the quantity of the telecentric error corrected.

According to this embodiment, since the axial chromatic aberration ΔL of the projection lens system is compensated by the double focus element 32 disposed in the alignment system 20, the projection lens system can be designed with the magnification chromatic aberration ΔY exceeding a certain value. Therefore, design and manufacture of the projection lens system can be extremely readily conducted. In order to prevent the main beam LAr adjacent to the reticle from telecentric error when the main beam LAw of the projection lens system adjacent to the wafer runs parallel to the optical axis $AX_0$, the structure must be arranged such that the chromatic aberration at the pupil EP in the projection lens system is compensated.

The quartz plate 8 disposed in the optical path in the exposure illumination system shown in FIG. 2 also acts to compensate the lateral shift of the image of the reticle blind 4 over the reticle due to the influence of the dichroic mirror 14. In the case where the angle of the quartz plate 8 made with respect to the optical axis $AX_0$ is arranged to be adjustable, the position Of the image of the opening (the illuminated region IA) of the blind 4 can be moved slightly over the reticle.

Furthermore, in the case where the dichroic mirror 14 is disposed above the reticle, the position at which the mark is detected by the alignment system 20 may be arranged to coincide with the center of the reticle. Therefore, a window RS may be formed in the region corresponding to a street line in the multi-die-reticle pattern region having 2 to 4 circuit patterns of the same type in the reticle.

Figure 8:
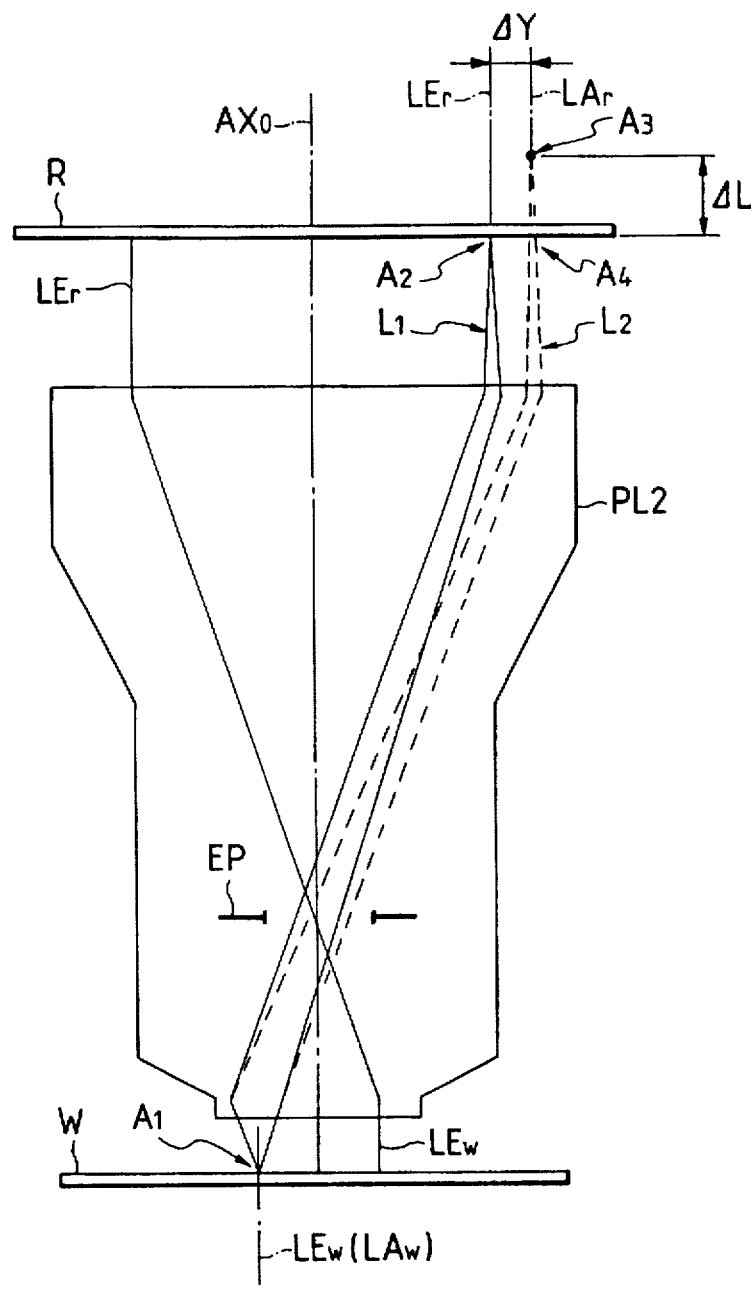
FIG. 8 is a view which illustrates the chromatic aberration of another projection optical system.

Some types of projection lens systems can cause a magnification chromatic aberration quantity ΔY in the opposite direction to the direction shown in FIG. 1. In the case where the projection lens system $PL_2$ as shown in FIG. 8 is used, although a flux from point $A_1$ on the wafer but outside the axis is imaged at point $A_2$ with the wavelength of exposure light, the flux from the point $A_1$ on the wafer but outside the axis of the wafer is imaged at point $A_3$ outside the point $A_2$ with alignment illumination light having a wavelength longer than that of exposure light. As described above, the direction of the magnification chromatic aberration quantity ΔY generated can be varied depending upon the employed structure of the projection lens system, the material of the lens element, and the wavelength of illumination light.

Figure 9A:
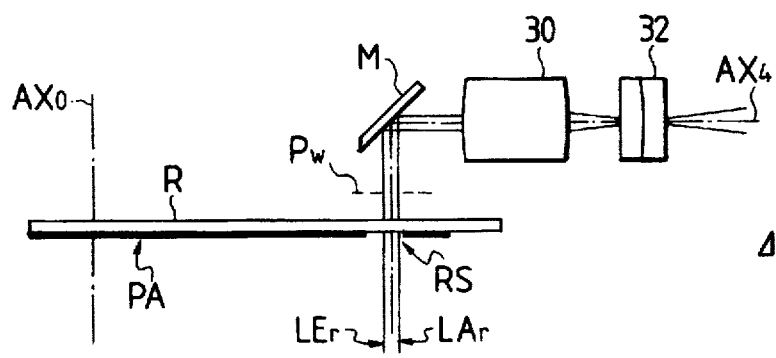
FIG. 9A is a view which illustrates a modification to the first embodiment in which a portion of the alignment system is illustrated.
Figure 9B:
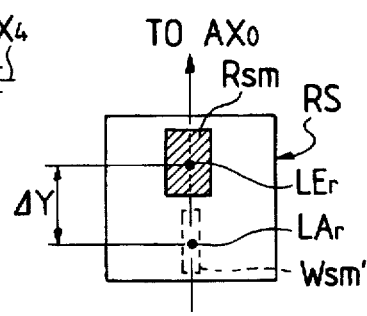
FIG. 9B is a plan view which illustrates the arrangement of alignment marks.

Now an alignment system constituted to use the stepper having the above-described projection lens system $PL_2$ will be described with reference to FIGS. 9A and 9B. FIG. 9A is a view which illustrates a system arranged in such a manner that a small mirror M is disposed immediately. above the window RS formed in the reticle R. The mirror M acts to deflect the optical axis $AX_4$ of the alignment system at right angles and acts to introduce optical information from the window RS and optical information from the wafer mark which has passed through the window RS into the objective lens 30 and the double-focus element 32. As shown in FIG. 9B, exclusive reticle mark Rsm which corresponds to the magnification chromatic aberration quantity ΔY is provided in the window RS formed in the reticle. The reticle mark Rsm serves as a shielding body so that the main beam LEr defined by exposure light passes through its center. The lower half portion of the mark Rsm in the window RS is arranged to be a transparent body so as cause the main beam LAr to pass through the transparent body. Image Wsm' of the wafer mark formed by virtue of the projection lens system $PL_2$ passes through the above-described transparent portion of the window RS, and then it is imaged on the surface Pw in the space above the reticle.

Therefore, when the overall body of the window RS is enlarged and observed by the imaging element via the double focus element 32, the reticle mark Rsm and the wafer mark's image Wsm' can be simultaneously detected in such a manner that they are positioned away from each other by the distance ΔY in the image field. Therefore, the TTR system alignment can be conducted by detecting the lateral deviation between the mark Rsm and the image Wsm' of the mark in accordance with an image signal. When the exposure is conducted after the mirror M has been retracted, the projected image of the reticle mark Rsm is correctly overlapped on the wafer mark Wsm so that the mark Wsm can be protected. The structure thus formed is advantageous to be used in the case where the magnification chromatic aberration ΔY is a relatively small level. Since the reticle mark serves as a shielding body for the wafer mark, the size of the window RS can be reduced.

Figure 10A:
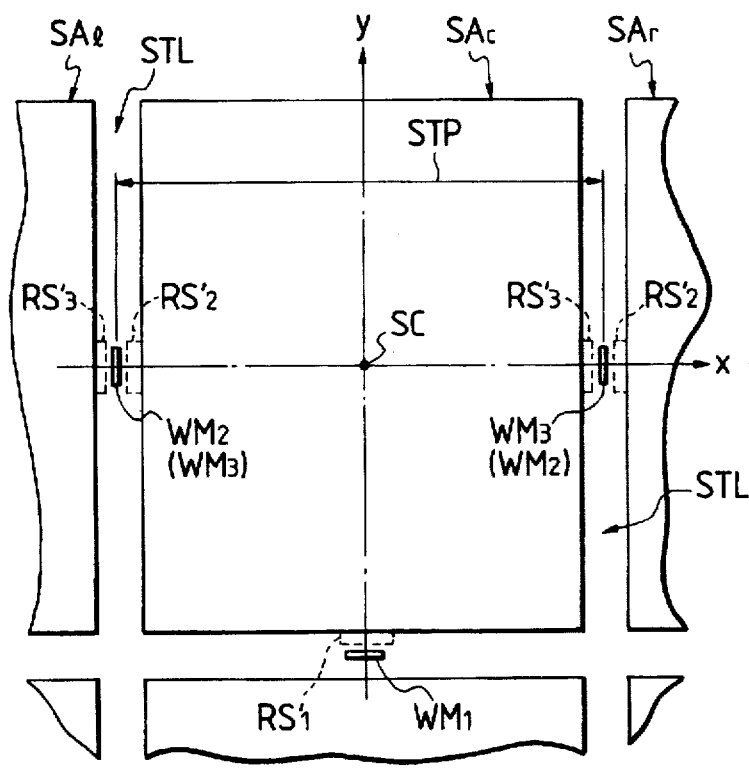
FIG. 10A is a view which illustrates the arrangement of shot regions on the wafer.
Figure 10B:
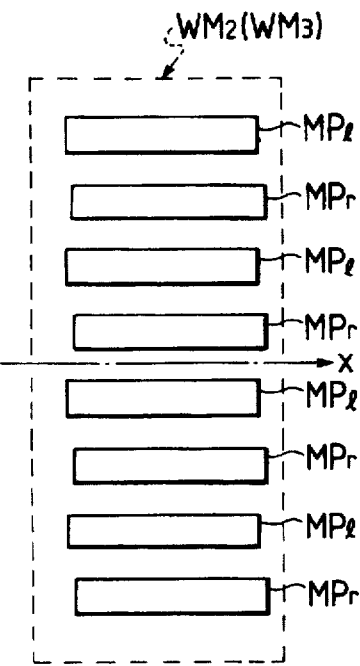
FIG. 10B is an enlarged view which illustrates the wafer mark.

FIGS. 10A and 10B are views which illustrate a modification of the arrangement of the mark. In the case where a projection exposure apparatus using the projection lens system PL1 shown in FIG. 1 is constituted, the shots on the wafer are arranged as shown in FIG. 10A. Each of three shot regions SAl, SAc, and SAr arranged in direction X on the wafer has wafer marks $WM_3$, $WM_2$, and $WM_1$ on its street lines STLs disposed on the two sides of each of the shot regions SAl, SAc, and SAr and on its street line which is disposed in the lower portion of each of the shot regions SAl, SAc, and SAr. As regards the central shot region SAc, since the right and left marks $WM_2$ and $WM_3$ are disposed on axis X passing through the center SC, the marks $WM_2$ and $WM_3$ accompanying the shot regions SAl and SAr neighboring with each other on the street line are caused to run parallel to each other. As a result, a margin exceeding the width of the street line becomes necessary.

That is, the street line formed at the left of the shot region SAc must have a width which is the total of the widths of the mark $WM_2$ accompanying the shot region SAc and the mark $WM_3$ accompanying the shot region SAl and the widths of the images $RS_2'$ and $RS_3'$ of the windows $RS_2$ and $RS_3$ formed on the reticle. Therefore, it is necessary for the width of the street line to be 130 μm or larger when each of the widths of the regions in which the marks $WM_2$ and $WM_3$ are formed is arranged to be 30 μm, each of the widths of the images $RS_2'$ and $RS_3'$ of the windows $RS_2$ and $RS_3$ is arranged to be 35 μm, and the magnification chromatic aberration quantity ΔY is arranged to be about 35 μm.

In order to make the width of the street lines as small as possible, the structure is constituted in such a manner that the two marks $WM_2$ and $WM_3$ formed in a street line have four straight patterns constituted by MPl and another four straight patterns constituted by MPr which are alternately arranged in direction Y. The four linear patterns MPl are formed on the left of the subject shot region SAc, while the four linear patterns MPr are formed on the right of the subject shot region SAc.

Figure 6:
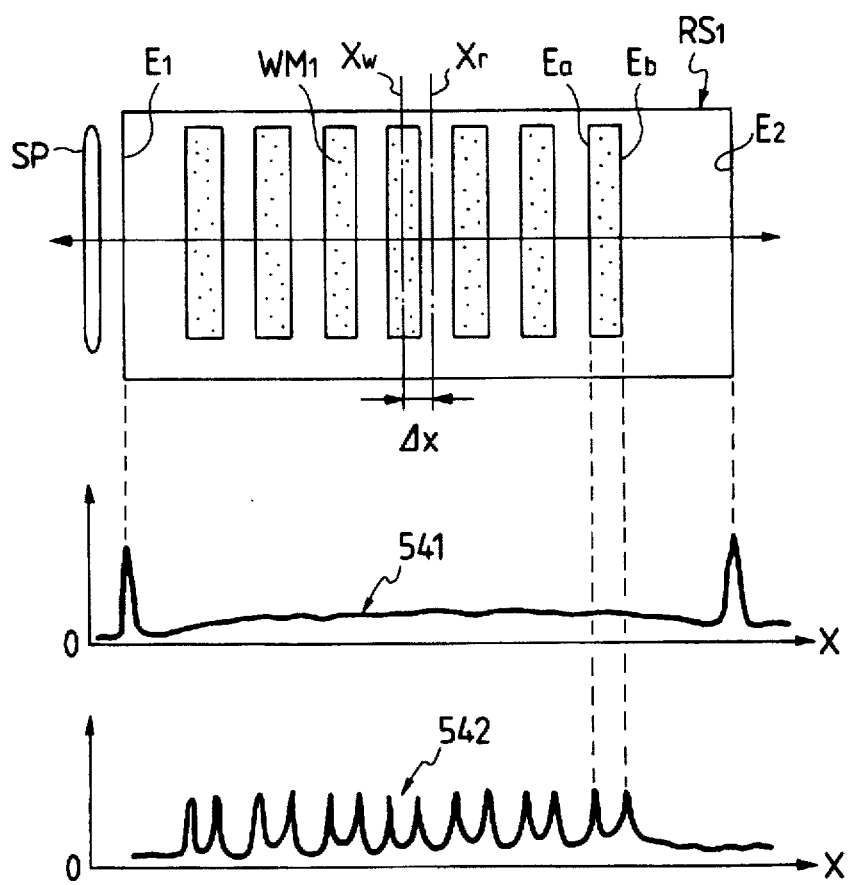
FIG. 6 is a view which illustrates the relationship among spot light, reticle windows, and wafer marks.

As a result, the areas of the regions in which the marks are formed can be restricted to the areas according to the structure shown in FIG. 6, and the width of the street line can be made about 100 µm. In order to conduct the exposure on the wafer by using the reticle having the above-described linear patterns MPl and MPr, the stepping pitch in direction X must be arranged to be the same as distance STP between the marks $WM_2$ and $WM_3$ as shown in FIG. 10A. When the shot region SAc is subjected to the alignment at the time of the detection of the marks $WM_2$ and $WM_3$, it is necessary to selected the four linear patterns MPl in the left-hand mark $WM_2$ and four linear patterns MPr in the right-hand mark $WM_3$ from the wavelength of the optical signal for the purpose of conducting the detection.

Figure 11:
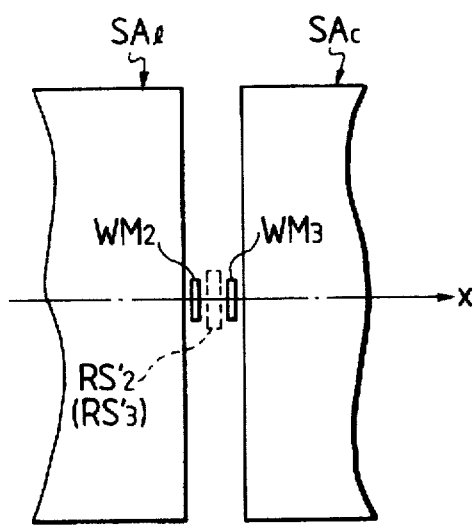
FIG. 11 is a plan view which illustrates the arrangement of alignment marks.

In the case where a projection exposure apparatus is constituted by using the projection lens system $PL_2$ shown in FIG. 8, the direction of generation of the magnification chromatic aberration is reversed. Therefore, as shown in FIG. 11, it is necessary for the structure to be constituted in such a manner that the left-hand mark $WM_2$ and the right-hand mark $WM_3$ are individually formed on a. street line so as to cause the projected images $RS_2'$ and $RS_3'$ of the two windows $RS_2$ and $RS_3$ to be projected at the same positions between the thus disposed two marks $WM_2$ and $WM_3$. That is, referring to FIG. 11, the mark $WM_3$ on the right of the shot region SAl is formed adjacent to the shot region SAc, while the mark $WM_2$ on the left of the shot region SAc is formed adjacent to the shot region SAl so that the images $RS_2'$ and $RS_3'$ of the windows are exposed at a common position between the marks $WM_2$ and $WM_3$. In this case, it is necessary for the structure to be arranged in such a manner that the two marks $WM_2$ and $WM_3$ respectively having a width of about 30 µm are arranged on the X-axis passing through the shot center SC and the width of the street line is about 95 µm in order to arrange one projected image $RS_2'$ or $RS_3'$ having a width of about 35 µm.

According to this embodiment, it is necessary for the marks $WM_1$, $WM_2$, and $WM_3$ formed on the wafer to be shielded from light during the exposure operation by the shield portions $LS_1$, $LS_2$, and $LS_3$ formed on the reticle. Furthermore, it is necessary for the magnification chromatic aberration quantity to have a level which cannot cause the image of the windows $RS_1$, $RS_2$, and $RS_3$ to overlap the marks $WM_1$, $WM_2$, and $WM_3$. However, the absolute quantity of the magnification chromatic aberration is varied in accordance with the change in the height of the image in the visual field of the projection lens system, the change in the height being determined with respect to the zero level which is assumed to be the optical axis $AX_0$. This leads to a problem when the size of the pattern region PA of the reticle is changed by the size of the device. A problem of this type will be described with reference to FIG. 12.

Figure 12:
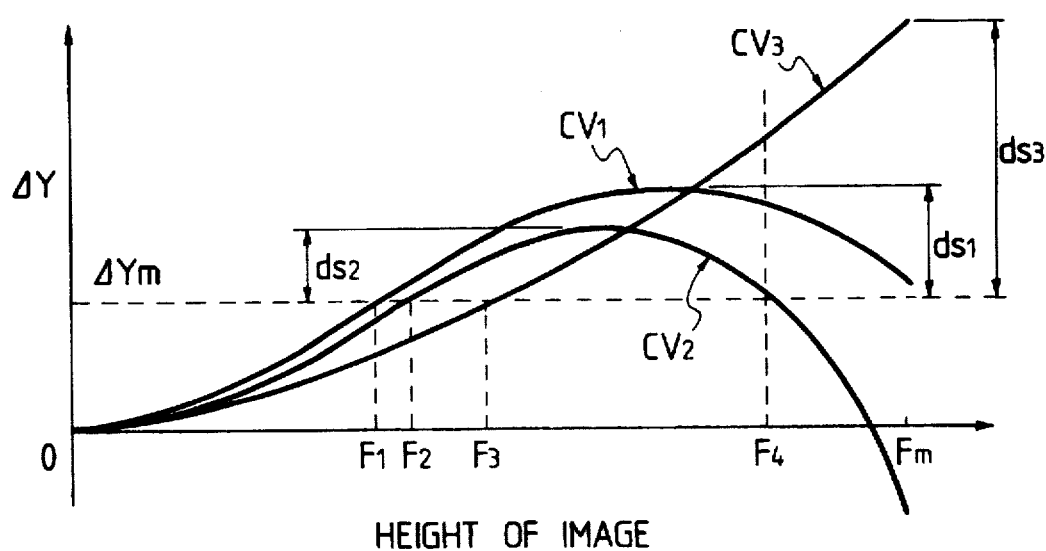
FIG. 12 is a graph which illustrates characteristics of chromatic aberration of magnification of a projection lens system.

FIG. 12 is a graph which schematically illustrates three typical magnification chromatic aberration characteristics $CV_1$, $CV_2$, and $CV_3$ which take place in the projection lens system. Referring to FIG. 12, the axis of abscissas denotes the height of the image (the distance from the optical axis), where the image height position Fm denotes the outermost point of the visual field region. Chromatic aberration quantity $\Delta Ym$ is a necessary and minimum value determined on the basis of the size of the region in which the mark WM is formed on the wafer, the size of the window RS, and the like. Therefore, the fact is expressed that the mark WM formed on the wafer cannot be protected from the projection of the image RS' of the window if the image height point has a chromatic aberration smaller than $\Delta Ym$.

The characteristic $CV_1$ is expressed by a curve which exceeds $\Delta Ym$ at image height point $F_1$, and its aberration quantity reaches its extremal value $\Delta Ym+ds_1$, the aberration quantity then being decreased to about $\Delta Ym$ at image height point Fm. The characteristics $CV_2$ is expressed by a curve which exceeds $\Delta Ym$ at image height point $F_2$ ($F_2>F_1$), and its aberration quantity reaches its extremal value $ds_2$. Then, the aberration quantity is rapidly reduced to a level smaller than $\Delta Ym$ at image height point $F_4$, and the direction of the aberration is reversed at image height point Fm. The characteristics $CV_3$ is expressed by a curve representing the aberration quantity which continually increases toward the image height Fm, and it exceeds $\Delta Ym$ at image height point $F_3$ ($F_3>F_2$). Then, the aberration quantity reaches its maximum value $\Delta Ym+ds_3$ at the image height point Fm. Assuming that the maximum image height point of the window RS (or the mark WM on the wafer) of the reticle is $F_4$, the minimum mark positions at which the mark can be protected become the image height points $F_1$, $F_2$, and $F_3$ in correspondence to the characteristics $CV_1$, $CV_2$, and $CV_3$. As a result, it can be understood that the characteristic $CV_1$ is able to correspond to the change in the size of the shift of the position of the mark, that is, the change in the size of the pattern region PA (the shot region SA).

However, since the aberration quantity is excessively changed from the image height point $F_3$ to the image height point $F_4$ in accordance with the characteristics $CV_3$, an excessive lateral deviation is caused between the mark WM and the window RS at the image height point $F_4$. This leads to the fact that the interval between the mark WM and the image RS' of the window is lengthened, the shield portion LS must have a large width, and the width of the street line must be enlarged. Furthermore, the design must be conducted so as to change the positional relationship between the window RS and the mark WM in accordance with the change in size of the pattern region PA of the reticle R. On the other hand, in the case of the characteristic $CV_2$, since the aberration quantity increased from $\Delta Ym$ is the smallest level of $ds_2$ ($ds_2<ds_1$), the mark can be protected without the necessity of considerably enlarging the width of the street line from the image height point $F_2$ to $F_4$.

Therefore, the characteristic $CV_2$ is the most preferable characteristic in the range to the image height point $F_4$ as the chromatic aberration characteristic with which the mark can be protected, the TTR system alignment can be conducted over a wide image height range, and the width of the street line can be reduced. In this case, the aberration quantity is rapidly reduced to a level smaller than $\Delta Ym$ in the region outside the image height point $F_4$. Therefore, it is preferable that a projection lens system having the characteristic between the characteristic $CV_1$ and $CV_2$ be used if the alignment operation is conducted outside the image height point F4. Anyway, it is preferable to use a projection lens system having the aberration characteristics expressed by a curve of the third order whose extremal value exceeds the aberration quantity $\Delta Ym$ when the height of the image is larger than about the halved value of the maximum image height point Fm.

It is necessary for the axial chromatic aberration quantity DL to be included in a certain region relative to $\Delta L$ regardless of the image height point when the double focus element 32 is used as the alignment system 20. The region is determined depending upon the depth of focus of the objective lens 30, size of the illumination light for the alignment operation which passes through the objective lens 30 at the pupil EP of the projection lens system (the number of apertures through which the illumination fluxes pass), or the like. A structure which meets the requirements above can be easily designed. In the case where no double focus element 32 is used, it is necessary for the axial chromatic aberration only to be compensated so as to become substantially zero within the range up to, for example, the image height point $F_4$ shown in FIG. 12.

Figure 13:
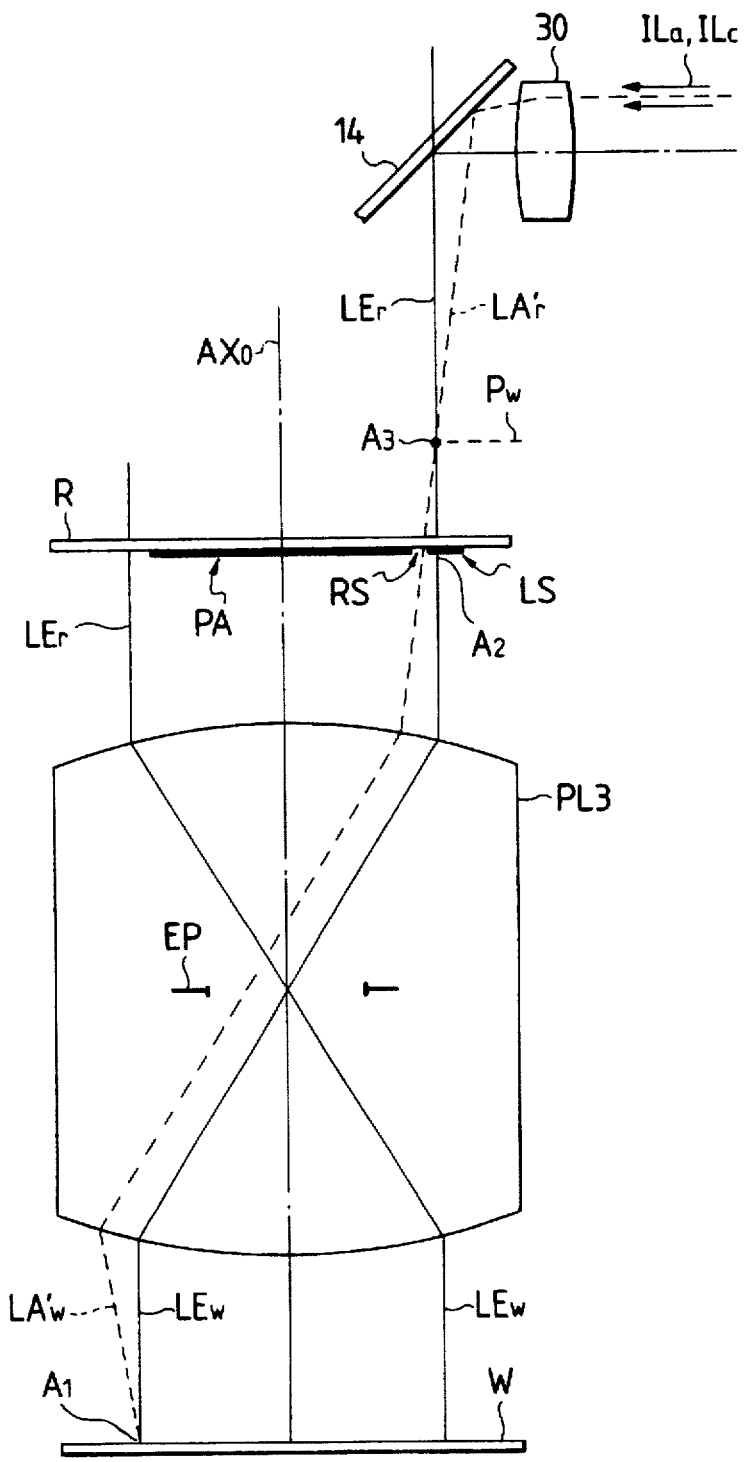
FIG. 13 is a view which illustrates the chromatic aberration of another projection optical system.
Figure 14A:
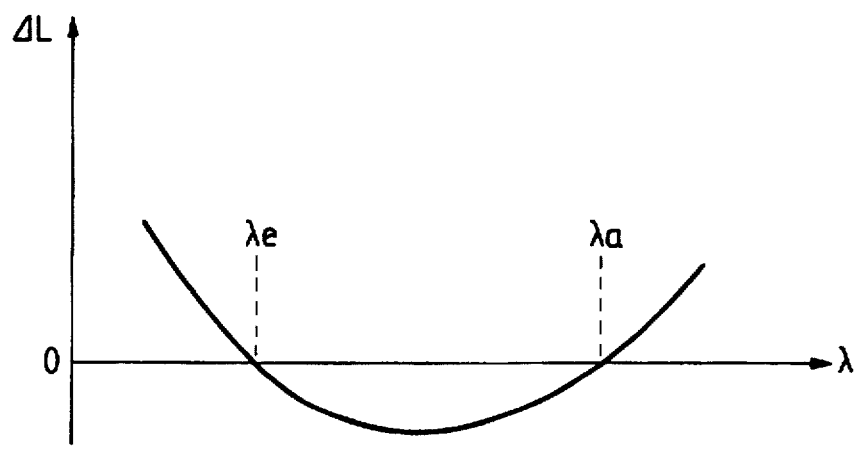
FIGS. 14A and 14B are views which illustrate axial chromatic aberration characteristics of the projection lens system.
Figure 14B:
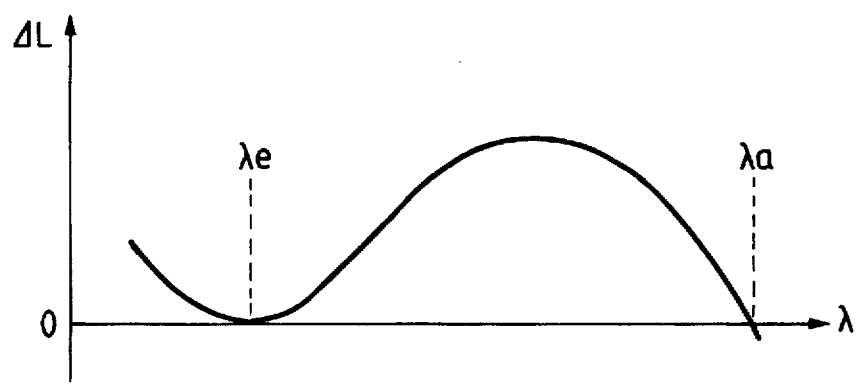

The difference between the projection lens system $PL_3$ shown in FIG. 13 and PL1 and PL2 lies in that the magnification chromatic aberration has been sufficiently compensated but the axial chromatic aberration has not been compensated as yet. Therefore, the main beams LEw and LEr connecting the points $A_1$ and $A_2$ defined with the wavelength of the exposing illumination light and the main beams LAw and LAr connecting the points $A_1$ and $A_2$ defined with the wavelength of illumination light for the alignment operation are caused to substantially coincide with each other. Therefore, the above-described method cannot protect the mark formed on the wafer.

In order to protect the mark, the structure is arranged in such a manner that the shield portion LS has a size capable of sufficiently covering the region in which the wafer mark is formed at the point $A_2$ on the reticle which is in conjugation with the point $A_1$ on the wafer, the conjugation being established with exposure light. In addition, the window RS is formed in the vicinity of the shield portion LS thus formed so as to cause illumination light for the alignment operation to pass through the window RS. That is, the structure is so arranged that illumination beam ILc (or ILa) can eccentrically pass in a, front focal surface (the surface which is in conjugation with the pupil EP) of the objective lens in the alignment system. As a result, the optical axis of the objective lens 30 can be disposed in parallel to the main beam LEr perpendicular to the reticle, and the main beam LAr' can be caused to diagonally pass through the window RS. The main beam LAr' must be inclined in a plane including the optical axis $AX_0$ of the projection lens system $PL_3$ and the central point of the window RS. If it is inclined perpendicularly to the above-described plane, an alignment error takes place. Thus, the main beam LAr' passes through a point deviated from the center of the pupil EP of the projection lens system, and reaches the wafer W. The main beam LAw' at the position between the wafer and the projection lens system is caused to be inclined. Furthermore, the beam ILc for the illumination passes through a region which deviates from the center of the pupil EP.

Light passing reversely along the main beam LAw' of optical information obtained from the wafer mark placed on the point $A_1$ passes through the window RS via the projection lens system, and is imaged at the point $A_3$ in the wafer conjugate surface in space so that a dark field image of the wafer mark is formed. The optical information again passes reversely along the main beam LAr' until it returns to the objective lens 30. In the case where the objective lens 30 is a telecentric lens and the rear focal surface is the surface Pw or the pattern surface of the reticle, or it is positioned between these two surfaces, the main beam in the vicinity of the pupil conjugate surface of the beam ILc can be arranged to run substantially parallel to the optical axis of the objective lens 30. Therefore, the main beam of Light returning along the main beam LAr' of optical information on the wafer mark is caused to run parallel to the optical axis after the main beam above has passed through the double focus element 32 disposed next to the objective lens 30. Optical information from the window RS, of course, is detected via the objective lens 30 and the double focus element 32.

In the case of the structure as shown in FIG. 13, the wafer mark point $A_1$ and the window RS can be simultaneously detected so that the TTR method alignment can be executed. Furthermore, since the wafer mark is in conjugation with the shield portion LS of the reticle with the wavelength of exposure light, the mark protection can be similarly conducted. In the other case where the mark formed at the point $A_1$ on the wafer is arranged to be a diffraction grating pattern having small grating elements disposed radially with respect to the optical axis $AX_0$ so as to be scanned with spot light, the structure is constituted in such a manner that the inclination of the main beam LAw' is made coincident with the diffraction angle of quadratic or higher diffraction light from the diffraction grating pattern.

Figure 15:
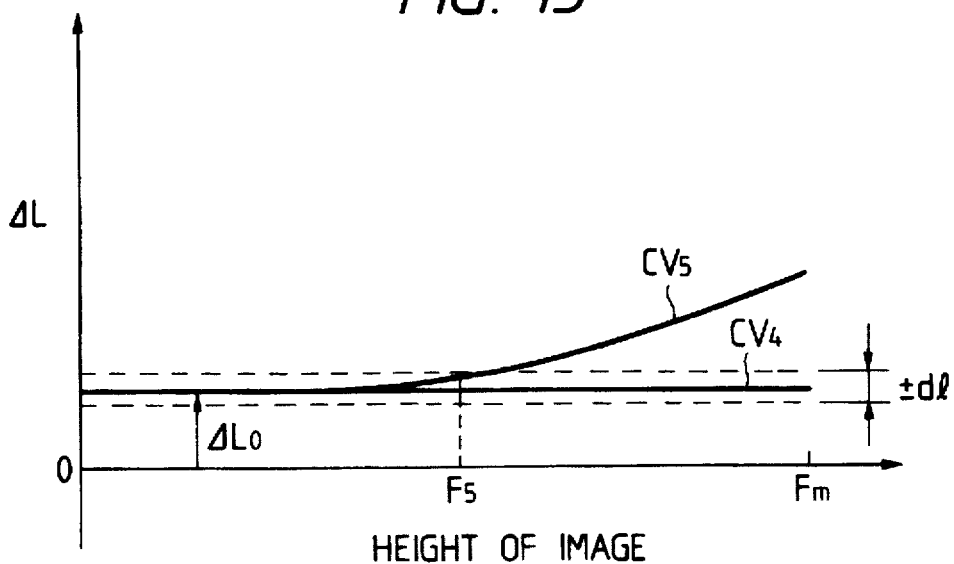
FIG. 15 is a graph which illustrates an example-of axial chromatic aberration characteristics

It is ideal that each axial chromatic aberration ΔL of the above-described projection lens systems PL1, PL2, and PL3 be constant $ΔL_0$ as in the case of the characteristic $CV_4$ shown in FIG. 15 regardless of the image height point. In actual practice, since there is a tolerance ±d1, the aberration within this range can be sufficiently compensated. However, it is usually difficult for the projection lens system $PL_3$ whose magnification chromatic aberration has been compensated as shown in FIG. 13 to have simultaneously kept its axial chromatic aberration quantity at a constant level. In this case, the axial chromatic aberration characteristic becomes as $CV_5$ in which the chromatic aberration quantity ΔL excessively deviates from the above-described tolerance +d1 at image height point $F_5$ positioned at substantially the middle point between the center and the outermost point Fm, causing the chromatic aberration quantity ΔL to be enlarged excessively to a level which cannot be compensated by the double focus element 32. There arises a severe problem when the position of the window RS and that of the wafer mark WM are changed by the change in size of the pattern region PA of the reticle.

Figure 16:
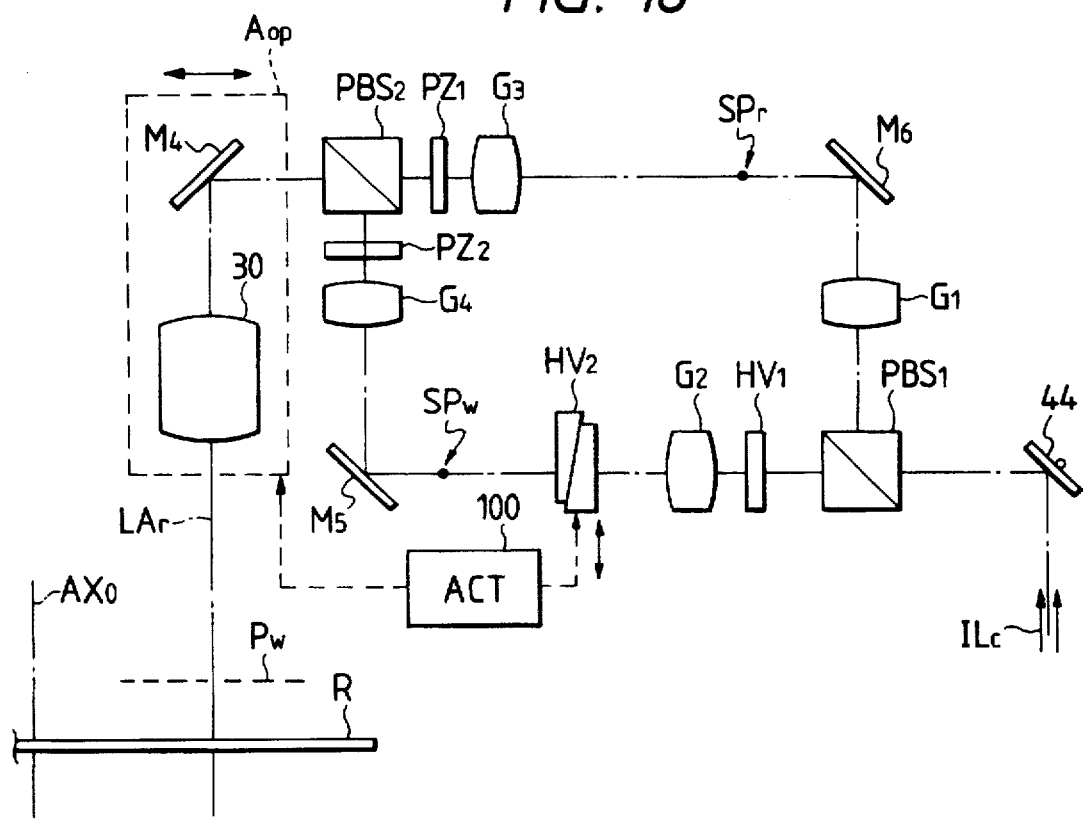
FIG. 16 is a view which illustrates an optical path for describing the structure of a portion of another alignment system.

In order to overcome the problem above, the structure is arranged in such a manner that the function of the double focus element 32 is realized by the optical system shown in FIG. 16 and the interval between the two focal points can be varied.

The substantially collimated beam ILc which has been deflected by the scanner mirror 44 is divided into P and S-polarized light by the polarization beam splitter $PBs_1$. The S-polarized light reflected by the polarization beam splitter $PBs_1$ is imaged at point SPr in the form of spot light (in a slit form) via lens system $G_1$ and mirror $M_6$, and then it is again collimated via lens system $G_3$. Then, the beam penetrates polarization beam splitter $PBs_2$ via optical element $PZ_1$ capable of converting S-polarized light into P-polarized light. The beam of P-polarized light from the beam splitter $PBs_2$ is reflected by mirror $M_4$, and is imaged on the pattern surface of the reticle R in the form of spot light via telecentric objective lens 30. In this case, the reticle and the point SPr ate in conjugation with each other as concerns P-polarized light.

On the other hand, the beam of the polarization P which has passed through the polarization beam splitter $PBs_1$ is imaged at point SPw in the form of spot light (in the form of a slit) via parallel flat plate $HV_1$ which can be tilted, lens system $G_2$, and thickness variable-parallel flat glass (constituted by two opposed wedge prisms) $HV_2$. Then, it is made incident upon the polarization beam splitter $PBs_2$ via mirror $M_5$, lens system $G_4$, and optical element $PZ_2$ capable of converting P-polarized light into S-polarized light, at which it is reflected. As a result, the beam of P-polarized light becomes a beam of S-polarized light which has been substantially collimated. The polarization beam splitter $PBs_2$ coaxially synthesizes both beams of P- and S-polarized light, the beam of S-polarized light of the two beams thus synthesized being imaged in the form of spot light on the surface Pw by the objective lens 30. The mirror $M_4$ and the objective lens 30 are arranged to be a movable portion $A_{op}$ formed integrally, and between the mirror $M_4$ and the polarization beam splitter $PBs_2$ is formed an afocal system.

When the position of the window RS (the wafer mark WM) on the reticle is changed with respect to the height of the image at the time of the alignment operation, the movable portion $A_{op}$ is, as designated by an arrow, moved by a drive system 100. The drive system 100 has previously stored, for example, the characteristic $CV_5$ as shown in FIG. 15. Therefore, a value concerning the axial chromatic aberration quantity $\Delta L$ which corresponds to the image height point after the above-described movement is read out. In accordance with the value thus read out, the thickness of the parallel flat glass $HV_2$ is changed. As a result, the surface Pw on which the beam of S-polarized light is imaged in the form of spot light can be vertically compensated. Thus, the TTR system alignment can be similarly conducted even if the axial chromatic aberration quantity $\Delta L_0$ is changed in accordance with the image height point.

A first embodiment of the invention has been described employing beam scanning system TTR alignment. An alternative structure in which, for example, the scanner mirror 44 shown in FIG. 2 is not used to reflect the beam, may be constituted in such a manner that stationary beam ILc is applied to the surface of the wafer through the window RS formed in the reticle, stationary spot light is applied to the surface of the wafer, and the wafer stage 18 is scanned so as to move the wafer mark WM with respect to the spot light, and thus the mark WM is detected. In this case, the structure thus constituted is a TTL system in which no optical information is detected from the window RS formed in the reticle, and in which it is necessary for the positional relationship between the position of the stationary spot light and the projected point of the window RS formed in the reticle to be measured.

As an alternative to the structure in which illumination light for the alignment operation is applied to the reticle and the wafer via the objective lens 30, a structure capable of similar effect can be constituted by causing illumination light to be diagonally applied to the wafer mark WM without the projection lens system being used.

Now the principle of the second embodiment of the present invention will be described with reference to FIGS. 17A and 17B.

Figure 17A:
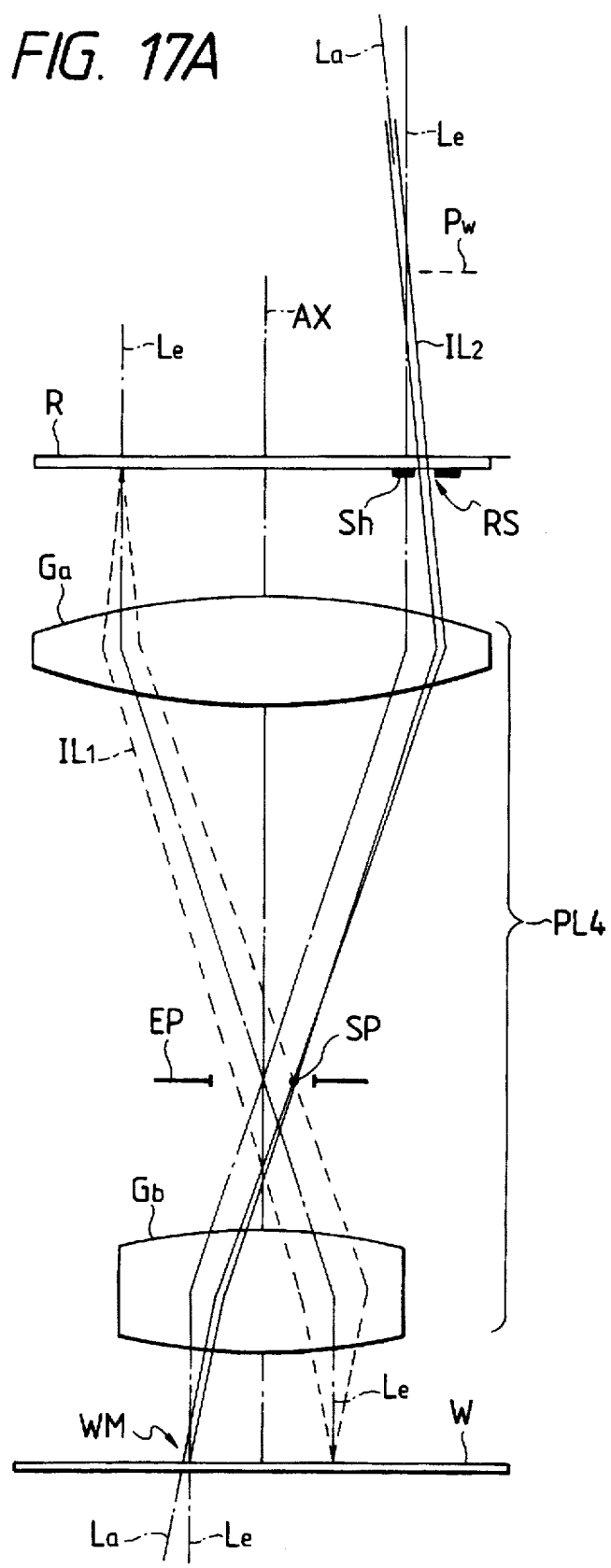
FIG. 17A is a view which illustrates an optical path for describing the chromatic aberration of the projection optical system according to a second embodiment of the present invention.

FIG. 17A is a view which illustrates projection lens system $PL_4$ capable of reduction-projecting the pattern on the reticle R on the wafer. W in a both side telecentric manner, the projection lens system $PL_4$ being schematically illustrated in such a manner that the projection lens system $PL_4$ is divided into lens system Ga adjacent to the reticle R and lens system Gb adjacent to the wafer W with respect to the pupil (diaphragm surface) EP. With first illumination light $IL_1$ for the exposure operation, the reticle R and the wafer W are positioned in conjugation with each other. The projection lens system $PL_4$ has been had its chromatic aberration compensated with respect to first illumination light $IL_1$. Therefore, the imaged flux of main beam Le due to the first illumination light $IL_1$ intersects the optical axis AX at the center of the pupil EP of the projection lens system $PL_4$ so as to run parallel to the optical axis AX in both the portions adjacent to the reticle R and the wafer W.

Second illumination light $IL_2$ having a wavelength bind different from that of the first illumination light $IL_1$ diagonally illuminates the alignment mark (the diffraction grating pattern) WM on the wafer. The position at which the mark WM is reversely projected on the reticle side with first illumination light $IL_1$ and the position of the window Rs can be shifted laterally by so positioning the transparent window Rs formed in the reticle as to enable the main beam La of the second illumination light $IL_2$ to pass through. With second illumination light $IL_2$, the mark WM on the wafer is imaged on the surface Pw positioned above the reticle. Thus, the axial chromatic aberration quantity can be obtained as the axial difference between the surface Pw and the reticle pattern surface.

According to this embodiment, the main beam La of second illumination light $IL_2$ is arranged to intersect the main beam Le of first illumination light $IL_1$ extending from the central point of the alignment mark WM, the intersection being realized on the surface Pw. Provided that second illumination light $IL2$ passing through the window Rs is a flux such as collimated laser beam or the like, second illumination light $IL_2$ is converted in the form of a spot SP in the surface of the pupil EP at a position deviated from the central position, and the second illumination light $IL_2$ is again emitted in the form of inclined collimated flux. Higher diffraction light can be caused to return to the path through which second illumination light $IL_2$ passes, that is, to the window Rs along the main beam La by arranging the mark WM to be in the form of a diffraction grating pattern having a suitable grating constant.

Figure 17B:
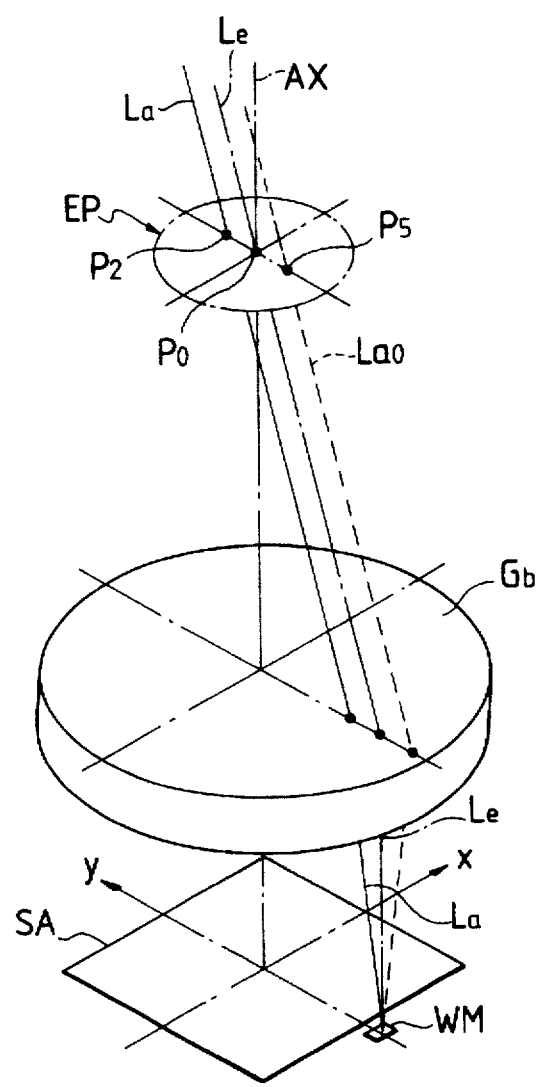
FIG. 17B is a perspective view which illustrates a state of light passing through the projection optical system shown in FIG. 17A.

FIG. 17B is a view which illustrates the spatial positional arrangement of the pupil EP, the lens system Gb, the shot region SA on the wafer, and the mark WM. Referring to this drawing, the center of the shot region SA to be subjected to the exposure coincides with the optical axis AX of the projection lens system, and serves as an origin of the x-y coordinate system. The mark WM is, for example, positioned on the axis Y in the vicinity of the shot region SA.

In order to inwardly (toward the optical axis AX) incline the main beam La of second illumination light $IL_2$ on the wafer, the direction of the application of second illumination light $IL_2$ is determined so as to cause the main beam La to pass through the point $P_2$ deviated from the central point $P_0$ of the pupil EP in the direction y. The spot SP shown in FIG. 17A is formed on this point $P_2$. When second illumination light $IL_2$ has been collimated on the wafer, the collimated light regularly reflected by the wafer is again converged at point $P_5$ in the pupil EP after it has passed through the main beam Lao. The point $P_5$ is positioned in point symmetry with the point $P_2$ relative to the point $P_0$. The reason for this lies in that the front focal surface of the lens system Gb substantially coincides with the pupil EP and the wafer side of the projection lens system is telecentrically constituted.

The window Rs and the mark WM can be aligned with each other by causing diffraction light from the mark WM to pass through the window Rs as shown in FIG. 17A. In this case, the optical axis of the alignment optical system including the objective lens capable of detecting diffraction light from the mark WM at a position above the reticle is arranged to run parallel to the optical axis AX of the projection lens system or the main beam La.

After the alignment and the ensuing exposure have been conducted, the projected image of the window Rs of the reticle is imaged at a position outside the mark WM on the wafer. Therefore, there is provided a shield Sh in a portion (adjacent to the optical axis AX) inward of the window Rs. As a result, the mark WM can be protected from the exposure since the shield Sh is arranged to be in conjugation with the region in which the mark WM is formed with first illumination light $IL_1$.

Now the structure of the projection exposure apparatus according to this embodiment will be described with reference to FIG. 18.

The reticle R having a predetermined circuit pattern and the diffraction grating mark is held by a reticle stage 102 which is two-dimensionally movable. Each of the patterns on the reticle is imaged on the wafer W by the both-side telecentric projection lens $PL_4$ with exposure light (first illumination light). The projection lens $PL_4$ has its chromatic aberration satisfactorily compensated in terms of the illumination wavelength for the exposure operation, and the reticle and the wafer are arranged to be in conjugation with the exposure wavelength. Furthermore, a diffraction grating mark which is similar, to the grating mark on the reticle is also formed on the wafer.

The wafer W is attracted on to the surface of a stage 105 capable of two-dimensional movement in a step-and-repeat method so that the exposure and transcription of one shot region SA on the wafer are completed. As a result, the wafer W is stepped to the next shot position. In a portion of the reticle stage 102, there is secured a moving mirror 106 capable of reflecting laser beams, the laser beams being from a laser beam gage interferometer (abbreviated to "an interferometer" hereinafter) 143 capable of detecting the position in the directions x and y and the direction (Θ) of rotation in the horizontal plane of the reticle. The interferometer 143 includes three laser beams for the purpose of individually detecting the positions in directions x, y and Θ. In order to make the description easier, a portion is omitted from illustration. The reticle stare is arranged to move in units of several millimeters, and the interferometer 143 has a resolving power for detection arranged to be about $0.01$ μm. In a portion of the wafer stage 105, a moving mirror 107 is secured thereto, the moving mirror 107 being capable of reflecting laser beams from the interferometer 145 capable of detecting the positions in directions x and y on the horizontal plane of the wafer. The interferometer includes two laser beams capable of individually detecting the positions in directions x and y. A portion of it is omitted from illustration in order to simplify the description. The movement of the reticle stage 102 in the directions x, y and θ is conducted by an actuator 142, while the two-dimensional movement of the wafer stage 105 is conducted by an actuator 146.

An illumination system for the exposure operations comprises a mercury lamp 130, an elliptic mirror 131, an input lens group 132 including a converging lens or a coherent filter, an optical integrator 133 constituted by a fly-eye lens or the like, a mirror 134, relay system including lens groups 136A and 136B, a variable reticle blind 137, a mirror 138, a main condenser 139, and a dichroic mirror 122. The dichroic mirror 122 is disposed 45°-diagonally above the reticle so that exposure light from the condenser lens 139 is transmitted downward. As a result, the reticle is uniformly irradiated. The dichroic mirror 122 has a transmittance exceeding 90% with respect to the wavelength of exposure light and a transmittance exceeding 50% with respect to the wavelength of illumination light for the alignment operation (which is longer than the wavelength of exposure light). The reticle blind 137 serves as an illumination visual field diaphragm for defining the illuminated region on the reticle, and is disposed in conjugation with the reticle by the lens group 136B and the condenser lens 139.

Figure 19:
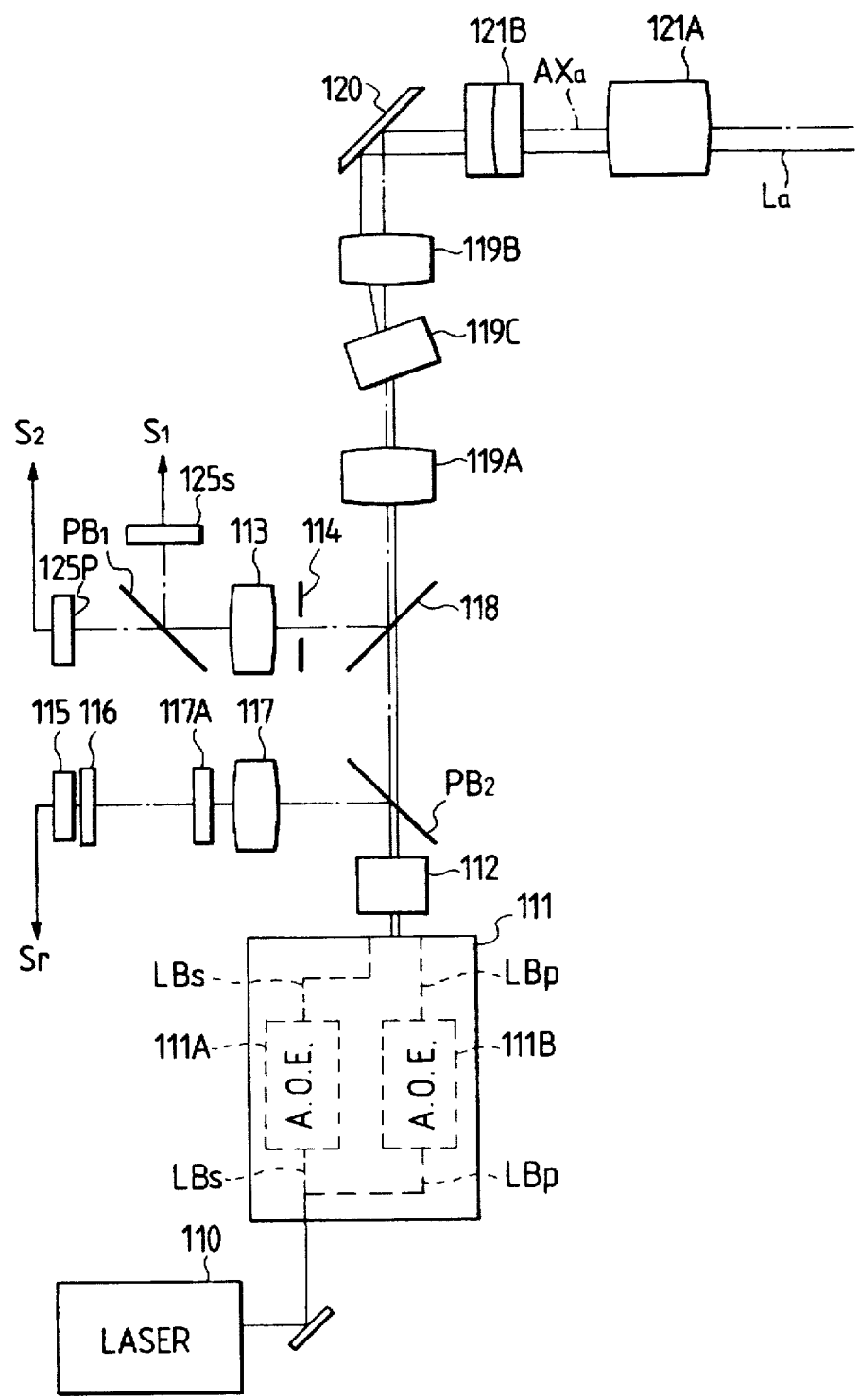
FIG. 19 is a view which illustrates the structure of the alignment system of the apparatus shown in FIG. 18.
Figure 20:
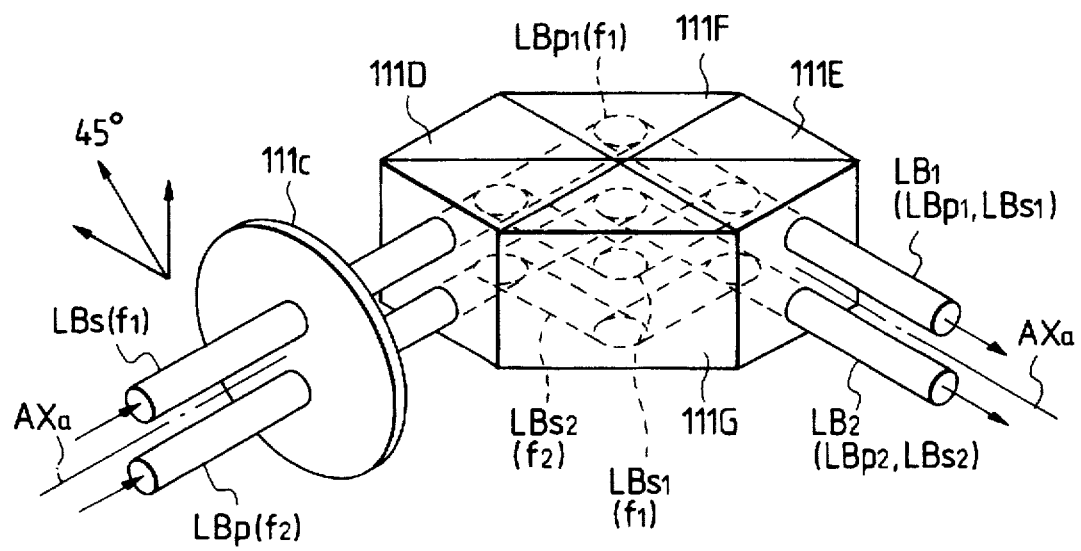
FIG. 20 is a perspective view which illustrates the structure of the output portion of a frequency shifter.

FIG. 19 is a view which illustrates the structure of the alignment system 100. Illumination light (second illumination light) for the alignment operation is emitted from laser light source 110, and is made incident upon a frequency shifter 111 including two acousto-optical elements 111A and 111B. Then, it is converted into beam LBs and LBp with frequency difference Δf in regard to the polarization components (P or S-polarized light). These beams LBs and LBp are parallel fluxes slightly deviated from a coaxial state. As shown in FIG. 20, beam $LB_{p1}$ of the P-polarized light with frequency $f_1$ and beam $LB_{s1}$ of S-polarized light are coaxially synthesized so as to be beam $LB_1$ by the ½-wavelength plate 111C having a polarization direction of 45° and polarization beam splitters 111D and 111E. The beam $LBp_2$ of P-polarized light with frequency $f_2$ ($f_1+\Delta f$) and beam $LB_{s2}$ of S-polarized light are coaxially synthesized so as to be beam $LB_2$. Then, the beams thus formed are-emitted from the frequency shifter 111.

As shown in FIG. 20, when the beam LBp of P-polarized light (with frequency $f_2$) is made incident upon the ½-wavelength plate 111C, the direction of the polarization of the incident beam is rotated by 45°. Therefore, the beam LBp is divided into the beam $LBp_2$ of P-polarized light and the beam $LB_{s2}$ of S-polarized light. Similarly, the direction of the polarization of the beam LBs (with frequency $F_1$) which has passed through the ½-wavelength plate 111C is rotated by 45°. Therefore, it is divided into beam $LPp_1$ of P-polarized light and beam $LBs_1$ of S-polarized light at the beam splitter 111D. The beams are synthesized by the polarization beam splitter 111E via rectangular prisms 111F and 111G, and then are emitted from the polarization beam splitter 111E in the form of two parallel beams $LB_1$ and $LB_2$. The two beams $LB_1$ and $LB_2$ are positioned symmetrically with each other with respect to optical axis AXa of the alignment optical system, and then they become illumination light $IL_2$ for the alignment operation. According to this embodiment, an imaginary center line (the optical axis AXa in the structure shown in FIG. 20) positioned between the beams $LB_1$ and $LB_2$ corresponds to the main beam La of illumination light $IL_2$ for the alignment operation shown in FIG. 17A or 17B.

Referring to FIG. 19, two beams $LB_1$ and $LB_2$ emitted from the frequency shifter 111 pass through the optical system 112, polarization beam splitter $PB_2$, a beam splitter 118, relay systems 119A and 119B, inclined parallel flat glass 119C, the mirror 120, the double focus element 121B made of a double-refraction material, and the telecentric objective lens 121A. Then, the two beams are horizontally applied to the dichroic mirror 122 shown in FIG. 18 so that the region including the reticle window Rs is irradiated as a result of reflection from the dichroic mirror 122.

Figure 21:
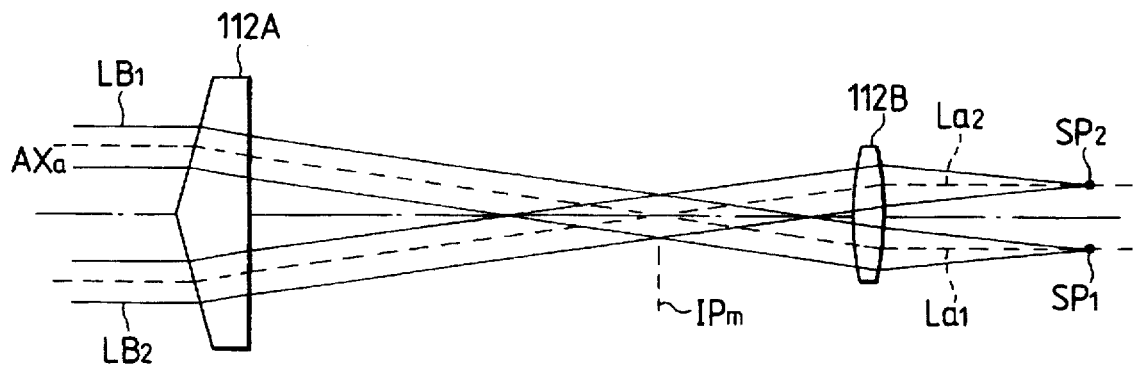
FIG. 21 is a view which illustrates an optical path used in the optical system 112 shown in FIG. 19.

The optical system 112 is, for example, constituted as shown in FIG. 21 and includes a prism 112A capable of receiving two beams $LB_1$ and $LB_2$ and intersecting the two beams at a predetermined angle on surface IPm, and lens 112B whose front focal surface is arranged to coincide with the surface IPm. The two collimated fluxes $LB_1$ and $LB_2$ which have intersected on the surface IPm are converged on the rear focal surface of the lens 112B in the form of spots $SP_1$ and $SP_2$ before being caused to diverge. The diverging beams are then made incident upon the lens group 119A of the relay system. Provided that the main beam of the beam $LB_1$ is $La_1$ and the main beam of the beam $LB_2$ is $La_2$ hereinafter, the main beams $La_1$ and $La_2$ run parallel to the optical axis AXa between the lens 112B and the lens group 119A.

In order to cause the front focal surface of the lens group 119A to coincide with the positions of the spots $SP_1$ and $SP_2$, the beams $LB_1$ and $LB_2$ intersect at a predetermined angle in the form of collimated flux, and then spots $SP_1$ and $SP_2$ are again formed by the lens group 119B. The main beams $La_1$ and $La_2$ of the beams $LB_1$ and $LB_2$ run parallel to the optical axis AXa between the lens 119B and the double focus element 121B. The spots $SP_1$ and $SP_2$ shown in FIG. 21 are relayed to the position of the double focus element 121B by the relay systems 119A and 119B. The double focus element is disposed on the front focal surface of the objective lens 121A, that is, disposed in the pupil. Therefore, the beams $LB_1$ and $LB_2$ which have been caused to be spot light by the double focus element intersect in the window Rs in the window Rs, or on the surface Pw in space.

The rear focal surface of the objective lens 121A coincides with either the surface Pw or the reticle pattern surface with the wavelength of illumination light for the alignment operation.

Since the parallel flat glass 119C is disposed between the lens groups 119A and 119B in an inclined manner, the main beams $La_1$ and $La_2$ of the two beams $LB_1$ and $LB_2$ are caused to be eccentric to each other between the lens group 119B and the objective lens 121A. Referring to FIG. 19, the main beams $La_1$ and $La_2$ are deviated perpendicular when viewed in this drawing where an imaginary center line between the main beams $La_1$ and $La_2$ is shown as the main beam La. Since the parallel flat glass 119C is inclined with respect to the optical axis AXa, the two spots $SP_1$ and $SP_2$ are positioned away from each other relative to the optical axis AXa. Therefore, the beam passing through the double focus element 121B and the objective lens 121A passes as shown in FIGS. 22A and 22B.

Figure 22A:
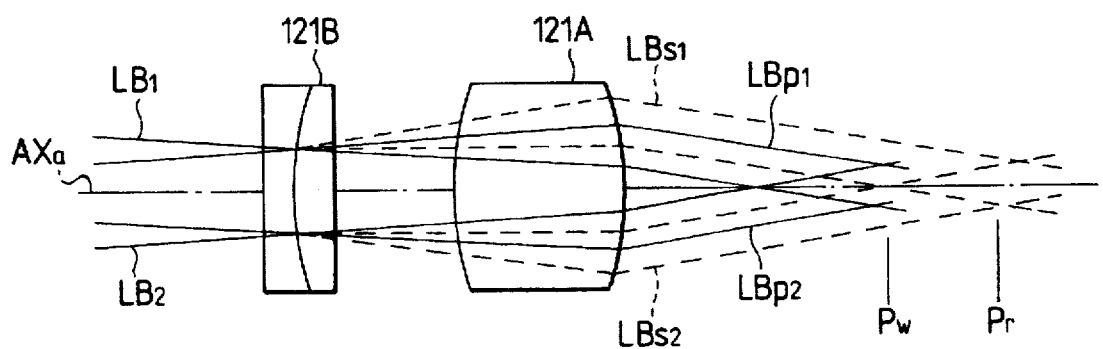
FIGS. 22A and 22B are views which illustrate the optical path for a double-focus element and an objective lens.
Figure 22B:
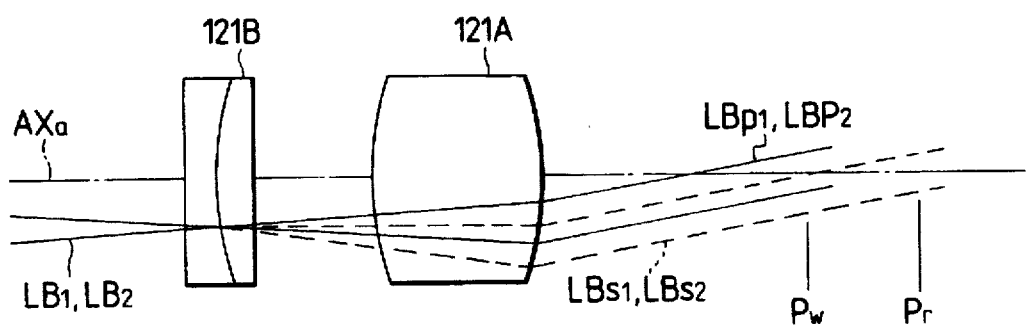

Referring to FIG. 22A, the beams $LB_1$ and $LB_2$ converged at the double focus element 121B, are refracted with different refractive indexes in regard to the S and P-polarized light so that they are divided into the collimated flux $LBp_1$ and $LBp_2$ of P-polarized light shown by a continuous line and the collimated flux $LBs_1$ and $LBs_2$ of S-polarized light shown by a dashed line before being diagonally emitted from the objective lens 121A. The beams $LBp_1$ and $LBp_2$ intersect on the surface Pw, while the beams $LBs_1$ and $LBs_2$ intersect on the pattern surface Pr.

The inclination of the beam $LBp_1$ and that of $LBp_2$ with respect to the optical axis AXa (actually, with respect to the main beam La) are arranged to be symmetric with each other, and the angle of inclination is defined in regard to the grating constant of the diffraction grating mark WM. The beams $LBp_1$ and $LBp_2$ which have intersected on the surface Pw are made incident upon the projection lens $PL_4$ after they have passed through the reticle window Rs. Then, they intersect again on the mark WM. The states of the beams $LBp_1$ and $LBp_2$ are the same as illumination light $IL_2$ shown in FIG. 17A. On the other hand, the inclinations of the beams $LBs_1$ and $LBs_2$ are defined by the diffraction grating mark RM disposed in a portion of the reticle window Rs. As a result, the beams $LBs_1$ and $LBs_2$ intersect on the mark When the beams $LBp_1$ and $LBp_2$ are applied to the wafer mark WM from the two directions as described above, one-dimensional interference fringes are formed at a predetermined pitch on the diffraction grating mark WM due to the frequency difference $\Delta f$ between the beams $LBp_1$ and $LBp_2$, the interference fringes moving perpendicular to the direction in which the fringes are extended at a speed corresponding to the frequency difference $\Delta f$. Similar interference fringes are formed on the mark RM in the reticle window Rs by the beams $LB_{S1}$ and $LB_{S2}$, the interference fringes thus formed also moving at a speed corresponding to the frequency difference $\Delta f$.

Figure 23:
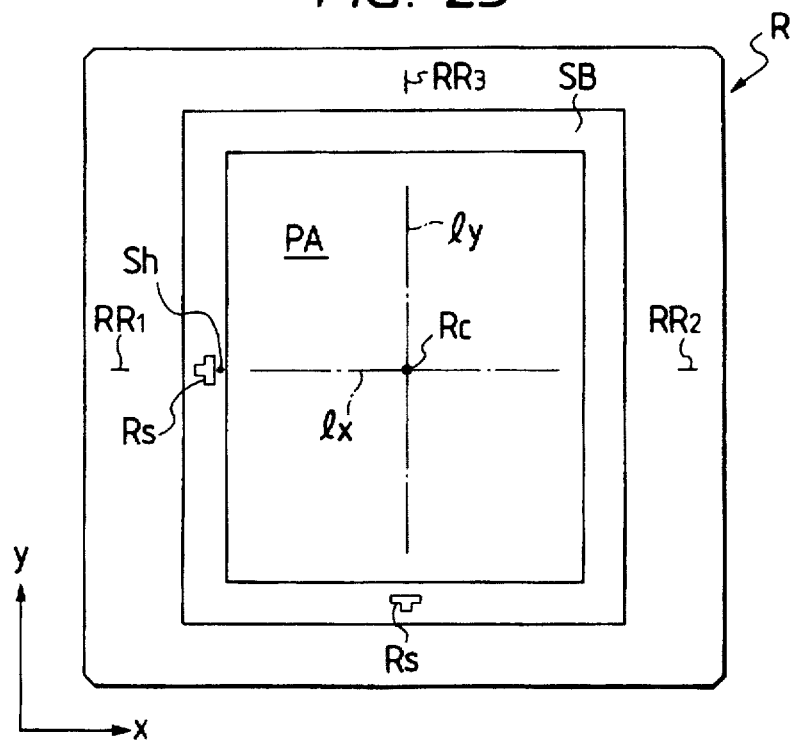
FIG. 23 is a plan view which illustrates the arrangement of the pattern on the reticle.

FIG. 23 is a view which illustrates an example of the arrangement of the pattern region PA of the reticle R, and the window Rs, the shield Sh, and the mark RM. In the structure shown in FIG. 18, although one window Rs on the reticle is illustrated, a plurality of the windows Rs are formed for the purpose of conducting two-direction (in directions x and y) alignment, and a plurality of the alignment system shown in FIG. 18 are provided.

Referring to FIG. 23, a shield band SB having a predetermined width is formed around the pattern region PA, and three alignment marks $RR_1$, $RR_2$, and $RR_3$ for alignment of the reticle only are disposed on lines lx and ly radially extending from the center (the center of the pattern region) RC of the reticle. Windows Rs are disposed on the lines lx and Ly at two portions in the shield band SB. The portion within the window Rs serves as the shield Sh shown in FIG. 18.

Figure 24:
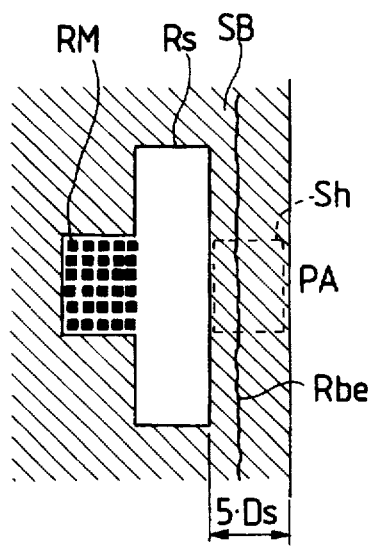
FIG. 24 is a plan view which illustrates the shape of a window formed in the reticle.
Figure 25:
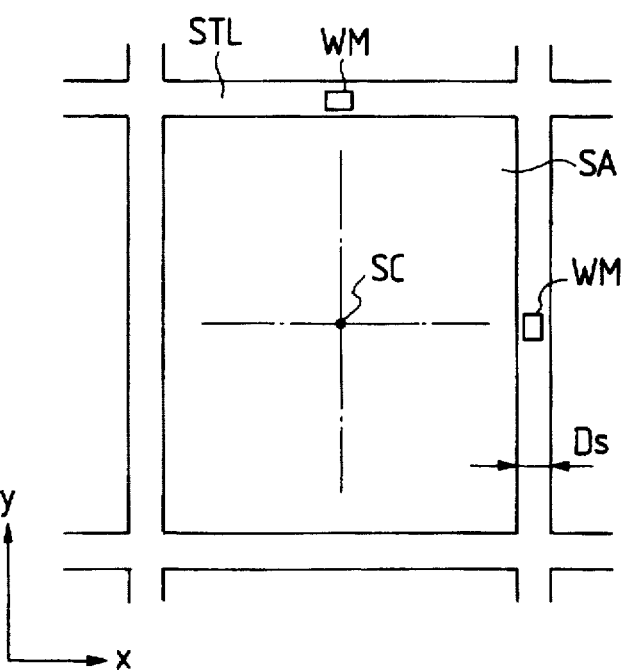
FIG. 25 is a plan view which illustrates shot regions in the wafer.

FIG. 24 is a view which illustrates the window Rs (the left-hand window Rs shown in FIG. 23) capable of conducting the alignment in direction y. The window Rs is formed by combining a region in which the reticle mark RM is formed and a region through which illumination light $IL_2$ ($LBp_1$ and $LBp_2$) is applied to the wafer mark WM, the two regions being combined so as to form a T-shape and holding the shield Sh in cooperation with the pattern region PA. The reason for the fact that the window between the mark RM and the shield Sh is elongated in direction y lies in that the beams $LBp_1$ and $LBp_2$ to be applied are distributed widely on the reticle with respect to the distribution on the surface Pw. Therefore, in the case where the alignment system in which the mark RM is detected in direction y with window Rs positioned on the line lx, the state shown in FIG. 22A is a state in a plane including an optical axis AX perpendicularly passing through the center RC on the reticle and the line ly. On the other hand, the state shown in FIG. 22B is a state when viewed in a plane including the optical axis AX and the line lx. Furthermore, the beams $LBs_1$ and $LBs_2$ to be applied to the reticle mark RM and the beams $LBp_1$ and $LBP_2$ to be applied to the wafer mark WM are, as shown in FIG. 22B, deviated from each other in the direction of the line lx shown in FIG. 23.

The edge disposed inside of the shield band SB shown in FIG. 24 is disposed for the purpose of defining the street lines (scribe lines) STL formed on the four sides of the shot region SA on the wafer. The projected image formed by exposure light from the window Rs and the mark RM overflows to the outside portion of the street line STL. That is, assuming that the magnification of the projection lens $PL_4$ is 1/5, and the width of the street line STL is Ds, the interval (the width of the shield Sh) between the window Rs on the reticle and the pattern region PA becomes 5·Ds. Therefore, the reversed projected position of the wafer mark WM caused by exposure light coincides with the region of the shield Sh.

Therefore, if the reticle is illuminated by exposure light, the mark WM on the street line STL is protected from light at the shield Sh so that the mark WM is not exposed. However, since the image of the opening of the window Rs is exposed on to the wafer in this case, the degree of opening of the blind 137 is adjusted so as to position edge (the edge image of the blind blade) Rbe of the illumination region by the reticle blind 137 to coincide with the shield Sh (between the pattern region PA and the window Rs) on shield band SB.

Since exposure light and the alignment illumination light are separated from each other by using the dichroic mirror 122 according to this embodiment, the alignment operation can be conducted normally even if the region of the window Rs is restricted by the reticle blind 137. Furthermore, the reticle mark RM and the wafer mark WM must be in the form of two-dimensional diffraction gratings as shown in FIG. 24.

Since the two beams $LBs_1$ and $LBs_2$ applied to the mark RM are in the same polarized state, one-dimensional interference fringes are formed on the mark RM. The interference fringes are in a form extending in direction x and arranged side by side at a predetermined pitch in direction y as shown in FIG. 24. However, since there is frequency difference $\Delta f$ between the beams $LBs_1$ and $LBs_2$, the one-dimension interference fringes move in direction y at a speed corresponding to the frequency difference $\Delta f$. The pitch of the interference fringes on the reticle is arranged to be a half of the grating pitch of the mark RM in direction y. Therefore, primary diffraction light generated from the mark RM as a result of the application of the beam $LBs_1$ and primary diffraction light generated from the mark RM as a result of the application of the beam $LBS_2$ are coaxially synthesized so as to be an optical beam whose quantity is changed at a speed corresponding to the frequency difference $\Delta f$ thereby generating an optical beat. The optical beam thus formed is reflected by the beam splitter 118 via the objective lens 121A, the double-focus element 121B, and the relay systems 119B and 119C along the main beam La. After reflection, the optical beam passes through the spatial filter 114 capable of shielding unnecessary diffraction light and 0-order light before being converged by the lens system 113. Since the optical beat signal from the mark RM is S-polarized light component, it is reflected substantially by 100% at the polarization beam splitter $PB_1$, and is received by a detector 125S. The detector 125S transmits reticle measurement signal $S_1$ whose level is changed in the form of a sine wave at frequency $\Delta f$ in response to the optical beat signal.

On the other hand, a portion of the beams $LBs_1$, $LBs_2$, $LBp_1$, and $LBp_2$ emitted from the optical system 112 and incident on the beam splitter $PB_2$ shown in FIG. 19 is converted into parallel beams $LB_1$ and $LB_2$ by the lens system 117, which are made incident upon reference diffraction grating 116 in an intersecting manner. The two beams $LB_1$ and $LB_2$ are limited to either P or S-polarized light by a polarization plate 117A. As a result, one-dimensional interference fringes moving at the frequency difference $\Delta f$ are formed on the reference diffraction grating 116. The detector 115 receives an Optical beat signal of the diffraction light generated from the reference diffraction grating 116 due to the application of the interference fringes thereto, and transmits reference signal Sr whose level is changed at frequency $\Delta f$ in the form of a sine wave.

Figure 18:
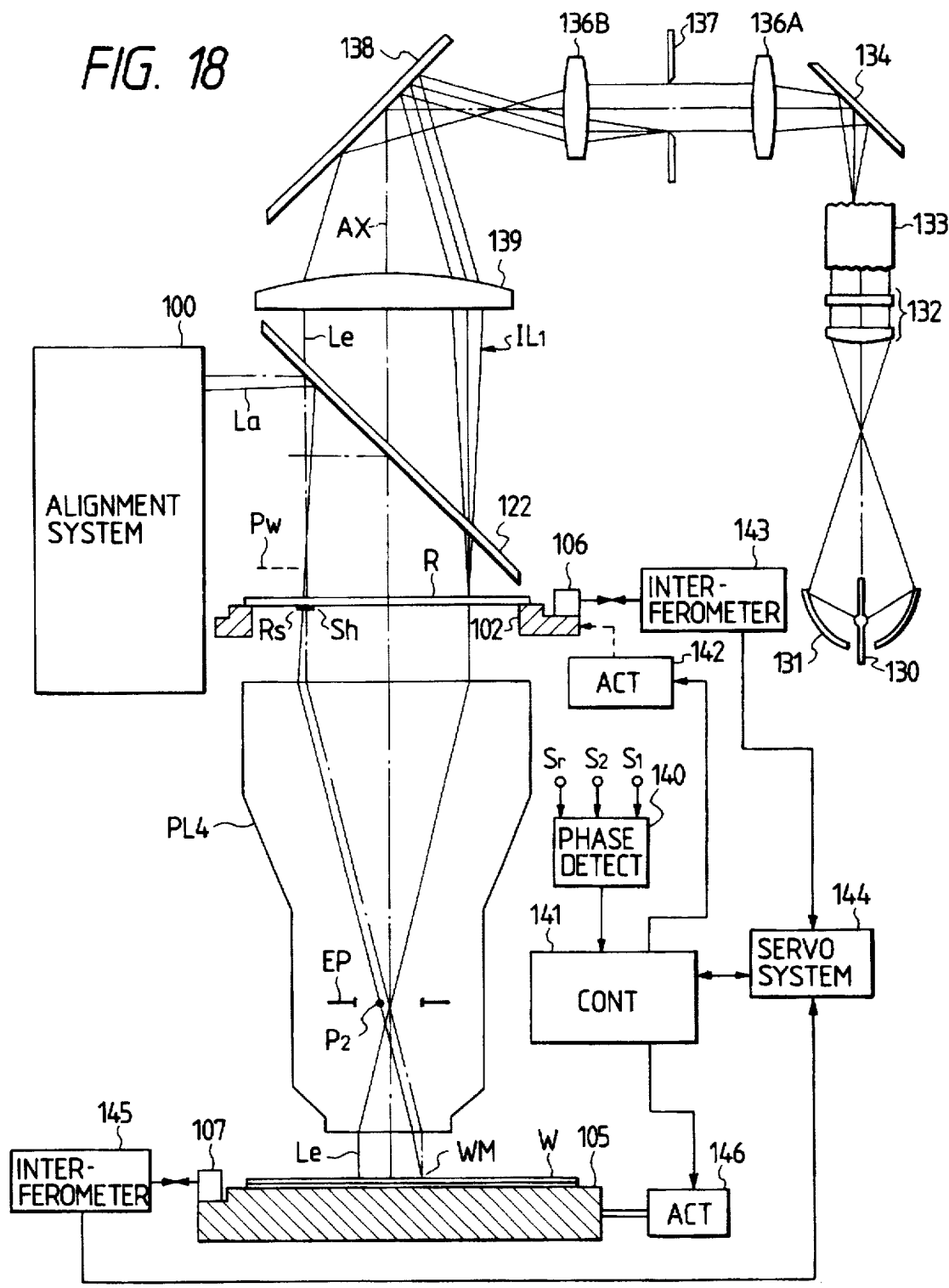
FIG. 18 is a view which illustrates the structure of a second embodiment of the projection exposure apparatus according to the present invention.

Signals $S_1$ and Sr from the detectors 125S and 115 are supplied to the phase detection system 140 shown in FIG. 18 where phase difference $\theta_1$ ($\pm 180°$) of the signal $S_1$ with respect to the signal Sr is detected. The thus detected phase difference corresponds to $\pm 1/2CG$ provided that the grating pitch of the mark RM is CG. Therefore, when the phase difference is zero, the mark RM of the reticle is correctly aligned with the reference diffraction grating 116.

The beams $LBp_1$ and $LBp_2$ which have passed through the window Rs of the reticle pass through the projection lens $PL_4$, and are converged as a spot in the pupil EP. Then, the beams $LBp_1$ and $LBp_2$ intersect as collimated flux on the wafer. The reason for this lies in that the surface Pw in the space above the reticle is in conjugation with the wafer with the wavelengths of the beams $LBp_1$ and $LBp_2$.

Figure 26:
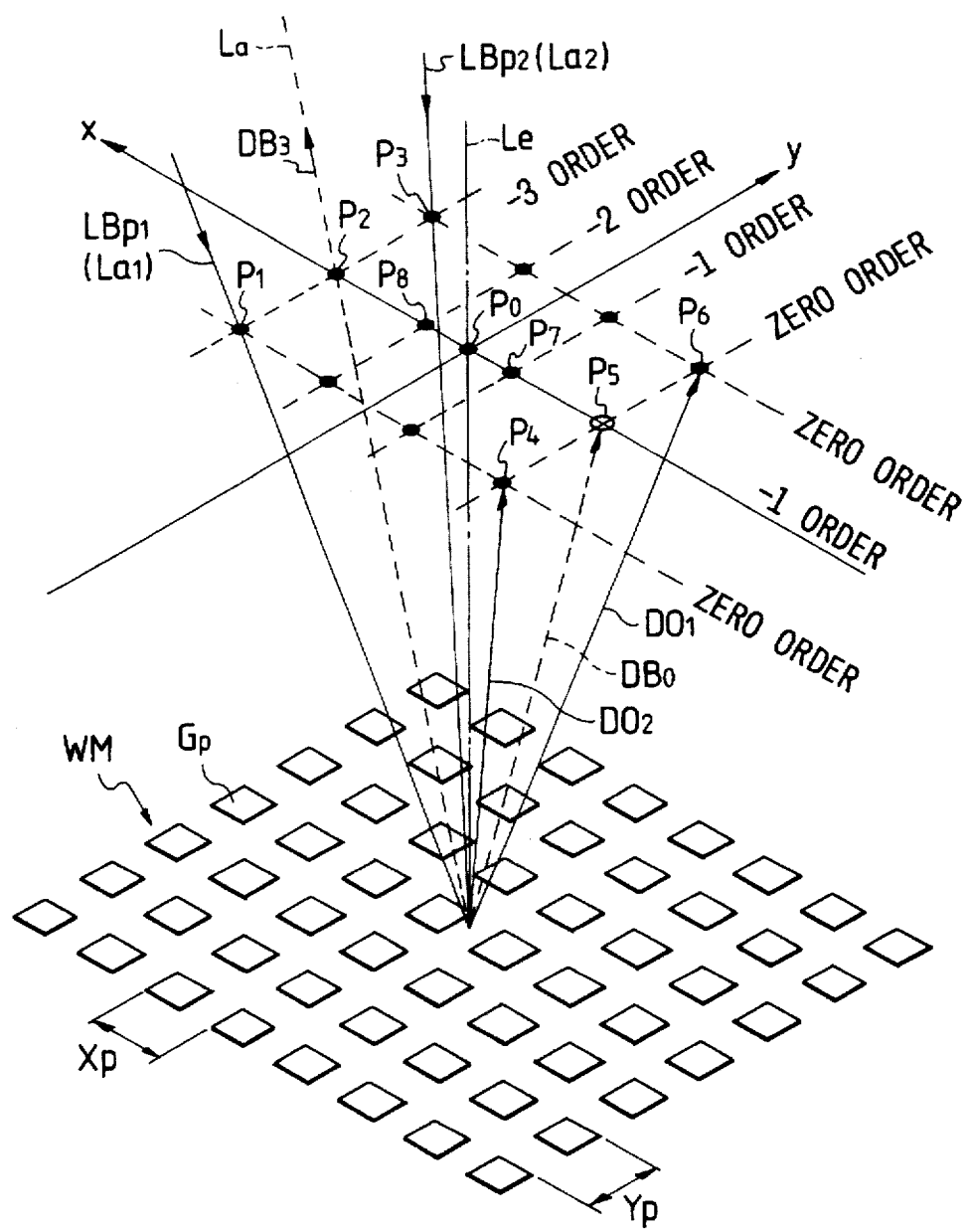
FIG. 26 is a perspective view which illustrates a state of beams passing to the wafer mark and diffraction light from the same.

Now the relationship between the beams $LBp_1$ and $LBp_2$ and the wafer mark WM will be described with reference to FIG. 26. The mark WM is a two-dimensional diffraction grating in which rectangular grating elements GP are two-dimensionally arranged in directions x and y. FIG. 26 is a schematic view which illustrates a structure arranged such that the surface of the pupil EP is plane x-y and the main beam Le perpendicularly extending from the center of the mark WM passes through the origin (the center of the pupil) $P_0$.

The beams $LBp_1$ and $LBp_2$ (or main beams $La_1$ and $La_2$) are converged at the points $P_1$ and $P_3$ in the form of spots in the pupil EP, and reach the central point of the mark WM. The points $P_1$ and $P_3$ are positioned symmetrically with respect to the x-axis and the distance from the y-axis becomes the same. The point $P_2$ in the pupil EP is a point through which the main beam La passes, and is a middle point between the points $P_1$ and $P_3$ in direction y.

Light (collimated flux) of the beams $LBp_1$ passing along the main beam $La_1$ and regularly reflected at the wafer surface becomes zero-order light $D0_1$ to form a spot at points $P_6$ which are point-symmetrically disposed with respect to the center $P_0$ in the surface of the pupil EP. Light of the beam $LBp_2$ passing along the main beam $La_2$ and regularly reflected at the wafer surface becomes zero-order light $D0_2$ to form a spot at points $P_4$ which are point-symmetrically disposed with respect to the center $P_0$. Since the two beams $LBp_1$ and $LBp_2$ are inclined to teach other in direction y and the mark WM is formed in a grating in direction y at a constant pitch Yp, $-1$ order diffraction light having an angle in direction y and generated by the application of the beam $LBp_1$ and $-1$ order diffraction Light having an angle in direction y and generated by the application of the beam $LBp_2$ are synthesized in the pupil EP so as to commonly pass through intermediate point $P_5$ between the points $P_6$ and $P_4$ in regard to the wavelength of the beam and the grating constant of the mark WM in direction y. As a result, they become an optical beat signal $DB_0$. The optical beat signal $DB_0$ passing through the point $P_5$ is not inclined in direction y, and is positioned point-symmetrically with the point $P_2$ with respect to the origin $P_0$. The optical beat signal $DB_0$ is also converged at the point $P_5$ in the form of spot. Since the mark WM is also arranged to be a grating having a constant pitch Xp in direction x, higher diffraction light (optical beat signal) from each of the points $P_4$, $P_5$, and $P_6$ passes, in direction x, through a point which is defined by the grating constant of the mark WM in direction x. Assuming that the degrees of each of the diffraction light in the pupil EP are arranged in direction x and y, the points $P_4$ and $P_6$ become $(0, 0)$, while the point $P_5$ becomes $(0, -1)$ so that light of negative higher degree is positioned in direction x in a scattered manner. In particular, $-1$ order light $(-1, -1)$ of the optical beat signal $DB_0$ in direction x is positioned at the point P7 on x-axis, while, $-2$ order light $(-2, -1)$ of the optical beat signal $DB_0$ in direction x is positioned at point P8. Furthermore, $-3$, order light $(-3, -1)$ of the optical beat signal $DB_0$ indirection x is positioned at point $P_2$. Assuming that the $-3$ order optical beat signal is $DB_3$, the optical beat signal $DB_3$ is caused to return along the main beam La. That is, according to this embodiment, the grating constant of the mark WM is determined in such a manner that $-3$ order light of the higher degree diffraction light distributed from the mark WM in direction x coincides with the main beam La of the beams $LBp_1$ and $LBp_2$ (illumination light $IL_2$).

The pitch Xp of the mark WM in direction x is determined from the following Equation (1):

$$Xp = \frac{n \cdot \lambda}{2 \cdot \theta w} \qquad (1)$$

there symbol n represents the degree of diffraction light in direction x, $\lambda$ represents the wavelength of the beams $LB_1$ and $LB_2$, and $\theta w$ represents the inclination (telecentric inclination) of the main beam La on the mark WM. This fact completely applies to the above-described relationship between the reticle mark RM and the beams $LBs_1$ and $LBs_2$.

The 3-order optical beat signal $DB_3$ from the mark WM is emitted from the projection lens $PL_4$ in the form of a collimated flux, and passes through the reticle window Rs. It then passes through the objective lens 121A, the double focus element 121B, and the relay systems 119B and 119A before being reflected by the beam splitter 118. The thus reflected beam reaches the spatial filter 114. In this spatial filter 114, the optical beat signal $DB_3$ at the point $P_2$ among the spot light due to the diffraction light at each of the points shown in FIG. 26 is shifted so as to be positioned on the optical axis (AXa) of the lens system 113. Therefore, the spatial filter 114 only passes optical beat signal $DB_3$, and stops the other diffraction light from the mark WM. The spatial filter 114, of course, passes the 3-order optical beat signal from the reticle mark WM. The 3-order optical beat signal $DB_3$ from the mark WM is P-polarized light and can be received by the detector 125P after it has passed through the polarization beam splitter PB1. The detector 125P transmits a wafer measurement signal $S_2$ whose level is changed in sine wave form at frequency $\Delta f$ in accordance with the change in the frequency $\Delta f$ of the optical beat signal $DB_3$ due to brightness. The phase detection system 140 receives the signal $S_2$ and detects the phase difference $\theta_2$ from the reference signal Sr. The phase difference $\theta_1$ ($\pm 180°$) thus detected corresponds to the positional deviation of the mark WM with respect to the reference diffraction grating 116.

In order to roughly align the reticle and the wafer in direction y within a range of a half of pitch yp of the marks RM and WM in direction y, the position measured by the interferometers 143 and 145 (FIG. 18) is supplied to the servo system 144 so that the control system 141 controls the actuators 142 and 146 in accordance with the thus measured result. Furthermore, the control system 141 feedback-controls the actuator 142 or 146 in accordance with the phase differences $\theta_1$ and $\theta_2$ detected by the phase detection system 140 after the rough alignment. The operation above can be continued during the pattern exposure operation, so that the deviation of the relative aligned position due to unnecessary vibration during the exposure operation or the like can be prevented.

A method described above in which interference fringes are formed by applying beams of the same polarized state from two directions to the diffraction grating mark, generating the optical beat signal from the mark by slightly changing the frequency of the beams applied from the two directions, and the position of the mark is measured statically without moving the mark is called heterodyne grating alignment. A technology similar to this has been disclosed in U.S. Pat. No. 4,710,026. There is a method in which the two beams are not given the frequency difference. In this case, the mark must be moved slightly with respect to the beam (interference fringes). This method is called homodyne grating alignment since the frequencies of the two beams coincide with each other.

Next the conditions required for protecting the mark WM on the wafer and aligning by arranging illumination light $IL_2$ diagonally will be described.

Assume that the reduction ratio of the projection lens $PL_4$ is 1/5, the axial chromatic aberration quantity $\Delta L$ due to alignment illumination light is 10 μm on the reticle (the interval between the surface Pw and the surface Pr), and the illumination beams $LB_1$ and $LB_2$ for the alignment operation are He—Ne laser beams (wavelength 633 nm). Furthermore, assuming that the opening edge Rbe of the reticle blind 137 can be controlled with an accuracy better than 250 μm, the interval 5·D between the window Rs and the pattern region PA must have a width larger than 250 μm in the shield band SB shown in FIG.

Figure 27:
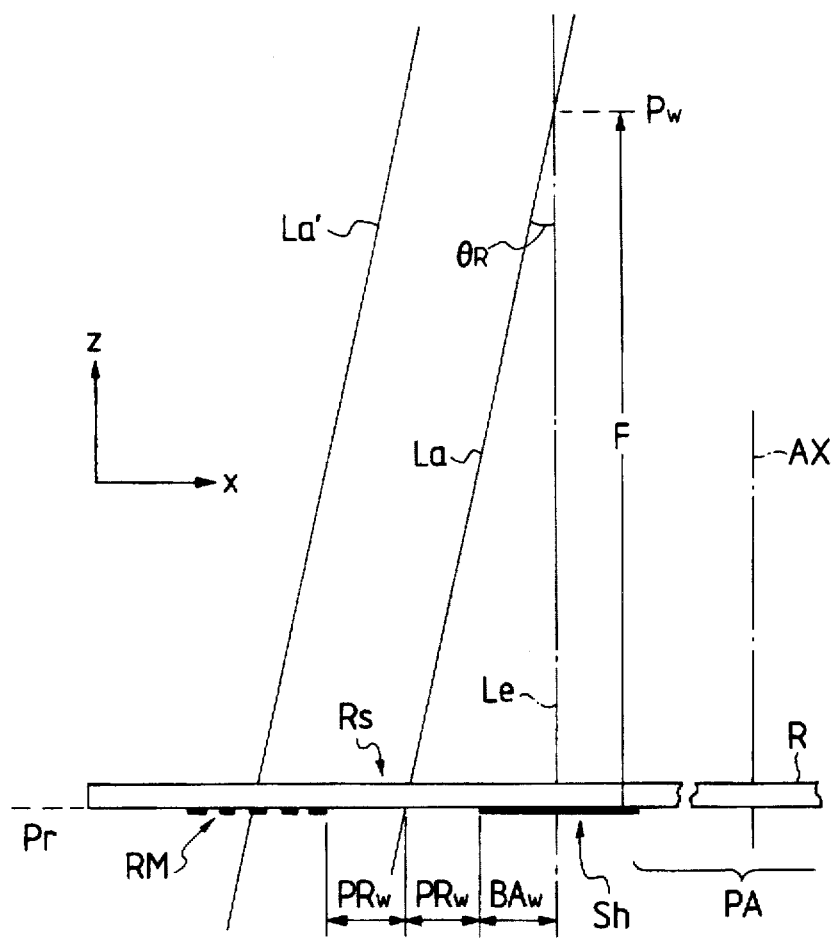
FIG. 27 is a view which illustrates states of each of main beams on the reticle.

FIG. 27 is a view which illustrates each of the main beams adjacent to the reticle window Rs. It is assumed that the main beam Le perpendicularly passing through the center of the mark WM shown in FIG. 26 passes through the center of the shield Sh on the reticle. The main beam La passing through the intersection between the surface Pw and the main beam Le and also passing through the center of the window Rs is the main beam of the beams $LBp_1$ and $LBp_2$ to be supplied to the wafer. The beam La' running parallel to the main beam La and passing through the center of the reticle mark RM is the main beam of the beams $LBs_1$ and $LBs_2$. Assuming that the width of the window Rs between the mark RM and the shield Sh is 2·PRw, and the width of the shield Sh is 2·BAw (=5·Ds), the telecentric inclination $\theta r$ of the main beam La can be obtained from Equation (2):

$$\theta_R = (BAw + PRw)/F \qquad (2)$$

Assuming that the reduction ratio of the projection lens $PL_4$ is 1/M, the telecentric inclination $\theta w$ of the main beam La on the wafer can be obtained from Equation (3):

$$\theta w = M \cdot \theta_R \qquad (3)$$

Therefore, from Equation (1), the pitch Xp of the mark WM in direction x can be given by Equation (4):

$$Xp = \frac{n \cdot \lambda \cdot F}{2 \cdot M \cdot (BAw + PRw)} \qquad (4)$$

For example, assuming that the width BAw is 125 μm and the width PRw is 100 μm, and substituting n=3 into Equation (4) gives:

$$Xp = \frac{3 \cdot 633 \times 10^{-9} \times 10^{-2}}{2 \cdot 5 \cdot (125 \times 10^{-6} + 100 \times 10^{-6})}$$

$$\approx 8.4 \times 10^{-6} \ [m].$$

Therefore, the 3-order optical beat signal $DB_3$ can return along the main beam La by arranging the pitch Xp of the mark WM in direction x to be 8.4 μm. The value recommended is an extremely practical level, so that the mark WM can be readily formed on the wafer.

According to this embodiment, the two-dimensional diffraction grating is used as the reticle mark RM and the wafer mark WM on the assumption that the heterodyne grating alignment or homodyne grating alignment is used. In the case where the light visual field images of the marks RM and WM are imaged, and the alignment is conducted by using the image signals from the imaged light visual field images, or in the case where the edge scattering or the like is detected by scanning with beam spots, a one-dimensional diffraction grating sufficiently serves the objects above, in which the grating elements are disposed at a predetermined pitch in the direction of the inclination of illumination light $IL_2$. In regards to the reticle mark RM, the optical beat signal of (0, −1) order which is the regular reflected light of the main beam La' shown in FIG. 27 may be photoelectrically detected.

A structure may be alternatively employed in which the laser light source 110 is arranged to be a Zeeman laser capable of emitting laser beams having different frequencies in accordance with the polarization direction and the frequency shifter 111 and the like are omitted. In addition, the direction of inclination of the main beam La of the illumination light $IL_2$ for the alignment operation may be reversed to that shown in FIG. 27.

Furthermore, if the projection lens has a characteristic which can conduct imaging and projecting on the photosensitive substrate under a telecentric condition and the main projects inclined on the mask, that is, the projection lens is a one-side telecentric lens, the alignment mark on the substrate does not need to comprise the two-dimensional diffraction grating. The reason for this lies in that above-described second illumination light can be brought into a telecentric condition on the photosensitive substrate only by slightly shifting the position at which the alignment mark is imaged to the mask side by the projection optical system with exposure light and the position of optical information on the mask side from the alignment mark passing through the projection optical system due to the application of illumination light for the alignment operation, the sight shift being conducted by a predetermined degree.

According to this embodiment, illumination light $IL_1$ and illumination light $IL_2$ for the alignment operation are separated from each other by the dichroic mirror 122 and the alignment optical system is arranged such that the reticle and the wafer can be simultaneously observed by illumination light which does not expose the resist during the exposure operation. In addition, since illumination light for the alignment operation is brought into double-focus light by employing the double focus optical system for the purpose of corresponding to the chromatic aberration quantity of the projection lens, the conventional compensation optical system must not be provided in the alignment optical path between the reticle and the wafer. Therefore, a precise alignment can be conducted by directly detecting the mark on the reticle and the mark on the wafer. Furthermore, the mark for the alignment operation is arranged to be a diffraction grating capable of detecting the deviation with high resolving power and the sine-wave like level change of diffraction light generated in accordance with the periodic structure of the diffraction grating is be detected. Therefore, an extremely stable and precise position deviation detection can be conducted with an assist of the structure arranged such that transparent wavelength illumination light (non-photosensitive) is used so as to be applied to the resist.

Now an alignment device according to a third embodiment of the present invention will be described.

Figure 28:
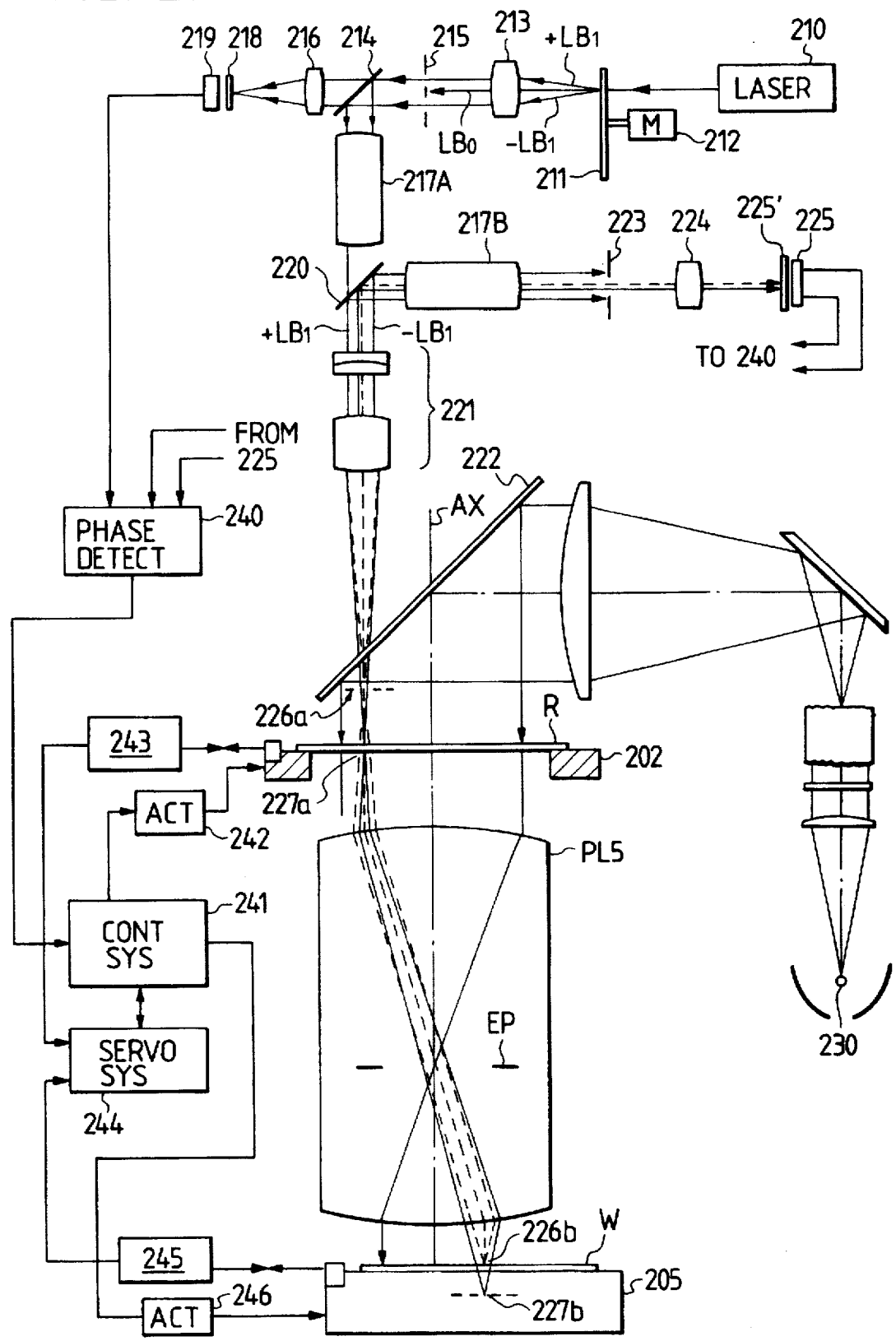
FIG. 28 is a view which illustrates the structure of a third embodiment of the projection exposure apparatus according to the present invention.

FIG. 28 is a view which illustrates a projection exposure apparatus preferably used with this embodiment. Reticle R having a predetermined circuit pattern and a diffraction grating mark for the alignment operation is held by a reticle stage 202. Each of patterns formed on the reticle is imaged on wafer W having a diffraction grating mark by a projection lens $PL_5$ of both-side telecentric type whose chromatic aberration has been compensated satisfactorily with respect to exposure wavelength. The wafer is attracted on to a stage 205 capable of two-dimensionally moving in a step-and-repeat method. The reticle stage 202 is actuated by an actuator 242, and the position in each of directions x, y, and θ is detected by an interferometer 243. The movement stroke of the reticle stage is arranged to be less than several millimeters and the resolving power for the detection operation of the interferometer is arranged to be, for example, about 0.01 μm. On the other hand, the wafer stage 205 is actuated by an actuator 246, and its position is detected by an interferometer 245 in directions x and y. Illumination light for the exposure operation supplied from a mercury lamp 230 uniformly is uniformly applied to the reticle by a dichroic mirror 222 via a system similar to that shown in FIG. 18.

illumination light for the alignment operation is emitted from a laser light source 210, and passes through a radial grating 211 formed by radially disposing transparent reference diffraction gratings. It then reaches a spatial filter 215 disposed on a Fourier surface (the surface of a pupil of the alignment optical system) via a Fourier lens 213. The radial grating 211 is rotated at a substantially constant speed by a motor 212. The laser beam made incident upon the radial grating 211 diffracts as 0-order light, ±1 order light, ±2 order light, . . . , and then the laser beam passes at individual diffraction angles. in the drawing-, only 0-order light $LB_0$, +1 order light+$LB_1$ and −1 order light −$LB_1$ are illustrated. The main beams of the 0-order light and ±1 order light are caused to run parallel by the action of the lens 213, and are clearly separated on a spatial filter 215 at which only 0-order light $LB_0$ is stopped, while ±1 order light transmits therethrough.

The ±1 order light which has passed through the spatial filter 215 is reflected by a beam splitter 214 before passing through a pupil relay system 217A. Then, ±1 order light passes through the beamsplitter 220, and is made incident upon a double-focus optical system 221 arranged similarly to the above-described embodiments. Since the laser light source 210 emits perpendicularly linearly polarized laser beam, one component of polarized light emitted from the double-focus optical system is imaged on surface 226a in a space above the reticle before being imaged at 226b on the surface of the wafer via the projection lens $PL_5$. Another polarized light component emitted from the double-focus optical system is imaged on the lower surface 227a of the reticle, and is imaged on a surface 227b which is positioned downward from the surface of the wafer via the projection lens system $PL_5$.

Assuming that the distance between the imaging surfaces 226b and 227b is Dw, the distance between the focal surfaces 226a and 227a is Dr, and the magnification of the-projection lens is 1/M (usually, M is arranged to be either of 1, 2.5, 5, or 10), the relationship $Dr=M^2 \cdot Dw$ is usually satisfied. The more the wavelength of the laser beam for the alignment operation become different from that of exposure light, $D_w$, and $D_r$, become larger in accordance with the aberration characteristic of the projection lens. The focal depth of the projection lens of the type described above is arranged to be an extremely small value of about ±1 μm, and the interval $D_w$, sometimes reaches several tens μm through choice of the wavelength of illumination light for the alignment operation. It is preferable that illumination light for the alignment operation (laser beam) be a wavelength for which there is no sensitivity with respect to the resist applied to the wafer W. It is important to determine most suitable illumination light for the alignment operation also considering the chromatic aberration.

The ±1 order light beams $LB_1$ (S-polarized light) of the laser beam for the alignment operation are made incident and imaged on the diffraction grating mark portion of the reticle at the focal surface 227a from two directions at an angle formed by +1 order light $LB_1$ and −1 order light −$LB_1$. The ±1 older light beams $LB_1$ (P-polarized light) which have passed through the transparent portion of the reticle and supplied from the focal surface 226a are made incident and imaged in the diffraction grating mark portion of the wafer at the focal surface 226b at an angle formed by the +1 order light and −1 order light from two directions via the projection lens.

Reflected diffraction light from the diffraction grating mark on the reticle is reflected by the beam splitter 220 via the dichroic mirror 222, and the double focus optical system, and is introduced into the spatial filter 223 disposed on the pupil conjugation surface (Fourier surface) after it has passed through the pupil relay system 217B, at which only diffraction light passing on the axis is filtered. The filtered light reaches a photoelectric detector 225 by a converging lens 224. Reflected diffraction light from the diffraction grating on the wafer also reaches the photoelectric detector 225 similarly after it has passed through the projection. lens and the transparent portion of the reticle.

The spatial filter 223 is disposed on the surface of the pupil of the alignment optical system, that is, at a position substantially in conjugation with the exit pupil of the projection lens so that it stops regularly reflected light from the reticle or wafer and allows only light perpendicularly (in the direction of a normal line of the surface) diffracted to the diffraction grating of the reticle or the wafer to pass through. There is provided an aperture plate 225' positioned in conjugation with both the reticle and the wafer via the double focus optical system, the pupil relay system, and the lens 224, the aperture plate 225' being positioned in front of the photoelectric detector 225.

An optical signal obtained from the photoelectric detector 225 becomes a sine wave shaped A.C. signal having a frequency corresponding to the rotational speed of the radial grating 211 since application of light is conducted in such a manner that the interference fringes formed by ±1 order light ±LB$_1$ applied to the reticle or the wafer from two directions moved along each of the diffraction grating marks in the direction of the pitch. The ±1 order light and 0-order light from the radial grating pass through the beam splitter 214 and are imaged (the beams +LB$_1$ an -LB$_1$ from the two directions intersect) on a reference diffraction grating 218 disposed in a fixed manner by a lens system (reversed Fourier lens) 216 capable of converting the pupil (Fourier surface) into an imaged surface. The +1 order light +LB$_1$ and -1 order light -LB$_1$ are made incident upon the diffraction grating 218 at predetermined angles from the two directions. The photoelectric detector 219 receives diffraction light (or coherent light) which has passed through the reference diffraction grating and outputs a sine wave shaped photoelectric signal. The photoelectric signal has a frequency which is in proportion to the rotational speed of the radial grating and thereby becomes a reference beat signal.

The phase detection system 240 receives an optical signal from the photoelectric detector 225 and a photoelectric signal from the photoelectric detector 219 and detects the waveform phase difference between the two signals. The detected phase difference corresponds to the relative positional deviation at a level of a half of the pitch of the grating of the diffraction grating mark formed on the reticle and the wafer, respectively. The control system 241 controls the actuators 242 and 246 in accordance with information about the phase difference thus detected and information about the position obtained from the interferometers 243 and 245 so that the reticle and the wafer are relatively aligned with each other. In the above-described overall structure, a portion of the alignment optical system, and more particularly the double focus optical system is arranged to be optionally disposed in accordance with the position of the alignment mark on the reticle so that the mark can be detected even if the mark is disposed in any position. In addition, the dichroic mirror 222 diagonally disposed above the reticle permits detecting the mark during the exposure operation since it separates exposure light and illumination light for the alignment operation. The light source for exposure light may be replaced by an excimer laser source or the like other than the mercury lamp.

Next the detailed structure of only the alignment system, and the principle of alignment will be schematically described with reference to FIG. 29. In the drawing, the dichroic mirror and the spatial filter are omitted from illustration for making the description easier, and the same elements as those in the structure shown in FIG. 28 are given the same reference numerals. The radial grating (the frequency shifter) 211 is arranged such that a collimated flux LB formed from the laser light source is made incident thereon. The direction of polarization of the flux LB has been adjusted in such a manner that the light intensity (light quantity) of P-polarized light and that of S-polarized light become a predetermined ratio when the flux LB divided into P-polarized light and S-polarized light by the double focus optical system 221 is converged on the surfaces 226a and 227a. Since the quantity of light which can reach the wafer is usually reduced somewhat, the quantity of light to be supplied to the wafer is increased. In order to achieve this, a structure in which the double focus element is rotated around the optical axis, or a structure in which a λ/2-plate is inserted between the laser light source and the radial grating so as to be rotated around the optical axis may be employed. That is, the light quantity ratio of polarized light which reaches the reticle and the same which reaches the wafer can be adjusted satisfactorily.

The ±1 order light beams Lb$_1$ (a parallel flux) from the radial grating 211 are made incident upon the pupil surface of the telecentric double focus optical system, that is in the double refraction material 221b so as to be converged in the form of a spot by the action of the lens system 213. The +1 order light +LB$_1$ is divided into P-polarized light +LB$_{1p}$ and S-polarized light +LB$_1$s by the polarization component at the double refraction material 221b so as to become a collimated flux inclined with respect to the optical axis of the double focus optical system by an angle defined by the diffraction angle, the collimated flux then reaching the reticle. Similarly, the -1 order light -LB$_1$ is divided into P-polarized -LB$_{1p}$ and S-polarized light -LB$_1$s so as to become a collimated flux positioned symmetrically to the +1 order light (+LB$_{1p}$ and +LB$_{1s}$) with respect to the optical axis of the objective lens 221a, the collimated flux then reaching the reticle. Since the surface 227a and the radial grating are in conjugation with each other in regards to P-polarized light, 1-order light +LB1P and -LB1P become a substantially collimated flux and intersect each other (are imaged) at the diffraction grating mark RM. Referring to FIG. 29, the direction in which the gratings of the mark RM are disposed is arranged to be in the lateral direction when viewed in this drawing, and the directions of the inclination of the 1-order light +LB1P and -LB1P with respect to the corresponding optical axes are determined similarly when viewed in the drawing.

Figure 30A:
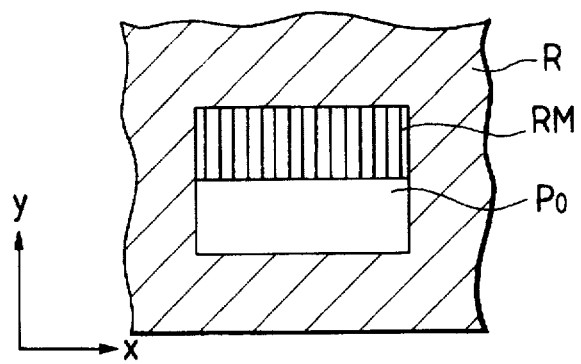
FIGS. 30A, 30B, and 30C are plan views which respectively illustrate a reticle mark, a wafer mark, and the structure of the aperture plate in the alignment system.
Figure 30B:
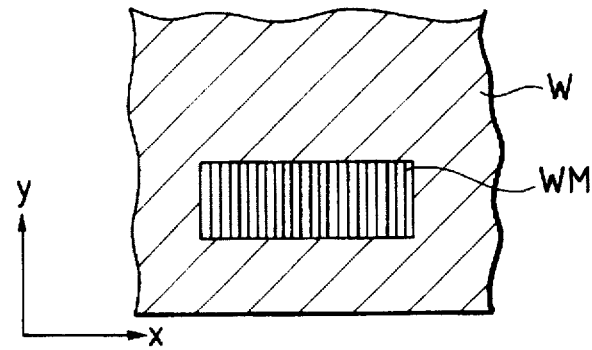

As shown in FIG. 30A, the reticle R has the diffraction grating mark RM and the transparent window P$_0$ and the 1-order light +LB$_{1p}$ and -LB$_{1p}$ are applied to the reticle over the mark RM and the window P$_0$. The mark RM is used for detecting the position in direction x (the direction in which the gratings are disposed), the diffraction grating mark WM on the wafer W corresponding to the mark RM as shown in FIG. 30B. The mark WM is arranged to be aligned at the-position of the window P$_0$ formed in the reticle when the alignment operation (or the exposure operation) is conducted.

S-polarized 1-order light beams +LB$_1$s and -LB$_1$s emitted from the double-focus optical system 221 and substantially collimated are temporarily imaged (intersect) on the surface 226a in space, and pass through the reticle window P$_0$ before being converged in the form of spot light at the pupil EP of the projection lens. Then, they are imaged so as to be made incident upon the diffraction grating mark WM from two different directions. The reason for this lies in that the surface 226a, the wafer surface, and the radial grating are in conjugation with one another in regards to S-polarized light.

The substantially collimated S-polarized 1-order light beams +LB$_{1S}$ and −LB$_{1S}$ which have been emitted from the projection lens are made incident on grating mark WM while inclined symmetrically to each other with respect to the direction in which the gratings of the diffraction grating mark WM are disposed. The angle made by the S-polarized 1-order light beams +LB$_1$S and −LB$_1$S which have reached the wafer does not exceed the numerical aperture of the projection lens on its side confronting the wafer. Since the reticle and the wafer are disposed in conjugation with the radial grating, each of the fluxes +LB$_{1P}$ and −LB$_{1P}$, +LB$_{1S}$, and −LB$_{1S}$ becomes a collimated flux provided that the laser flux LB is a collimated flux.

The action of the P-polarized 1-order light +LB$_{1P}$ and −LB$_{1P}$ on the reticle mark RM will be described.

Figure 31:
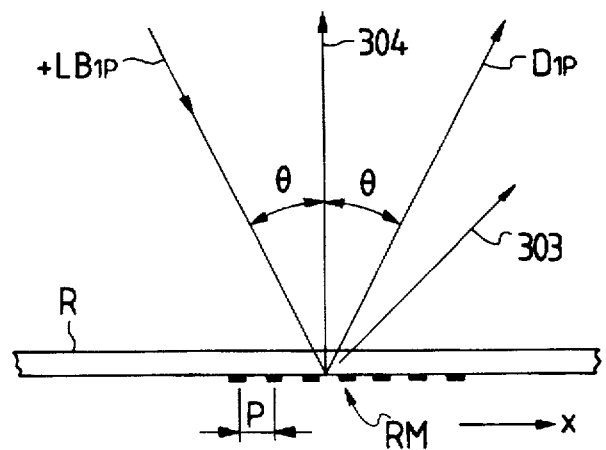
FIG. 31 is a view which illustrates state of generation of diffraction light from the mark on the reticle.

FIG. 31 is a view which schematically illustrates the reticle mark RM, in which it is assumed that P-polarized 1-order light +LB$_{1P}$ is made incident upon the mark RM at angle θ, also regularly reflected light D$_{1P}$ of 1-order light +LB$_{1P}$ at the reticle is reflected at angle θ. The fact that the flux +LB$_{1P}$ is made incident at angle θ means that flux −LB$_{1P}$ is made incident upon the reticle at angle θ in the reversed direction to the regularly reflected light D$_{1P}$. Then, pitch P and angle θ are determined so as to satisfy the following Equation (5) assuming that grating pitch of the diffraction grating mark RM is P, the wavelength of the laser flux LB is λ, and symbol n represents an integer:

$$\sin\theta = \frac{\lambda}{P} \times n. \tag{5}$$

On condition that Equation (5) can be satisfied, diffraction light 304 of the specific degree generated from the mark RM due to the application of 1-order light +LB$_{1P}$ and −LB$_{1P}$ passes perpendicularly with respect to the reticle, that is, in the direction along the optical axis of the double focus optical system. Although other diffraction light 303, of course, is generated, it passes in a direction different from diffraction light 304.

Since the reticle mark RM is supplied with fluxes +LB$_{1P}$ and −LB$_{1P}$ from two directions in such a manner that +LB$_{1P}$ and −LB$_{1P}$ intersect each other and the two fluxes thus applied are of the same polarization emitted from the same laser light source, one-dimensional light and dark fringes, that is, interference fringes are generated as a result of the interference generated by the two fluxes fluxes +LB$_{1P}$ and −LB$_{1P}$. If the radial grating is stopped, the interference fringes are arranged at a predetermined pitch in the direction in which the gratings of the mark RM are disposed. The pitch of the interference fringes and the pitch of the gratings of the mark RM are determined properly in accordance with the required detection resolving power. Therefore, diffraction light 304 from the mark RM is generated as a result of a fact that the mark RM is supplied with the interference fringes. Alternatively, the reason for this might be considered to lie in that a coherence takes place since diffraction light generated by the mark RM as a result of the application of the flux +LB$_{1P}$ and diffraction light generated by the mark RM as a result of the application of the flux −LB$_{1P}$ return through the same optical path (on the axis of the double-focus optical system).

As described above, although the interference fringes are generated on the mark RM when the mark RM is supplied with the fluxes +LB$_{1P}$ and −LB$_{1P}$ from two different directions, the interference fringes move (flow) in the direction in which the gratings of the mark RM are arranged. The reason for this lies in that the dark visual field image due to the 1-order light +LB$_1$ and −LB$_1$ of the radial grating is imaged on the reticle mark RM. Therefore, diffraction light 304 periodically repeats the change between light and dark states when the interference fringes (a diffraction image projected by the double focus optical system of the radial grating or the like) scans the mark RM. Therefore, a signal generated from the photoelectric detector 225 becomes an A.C. signal in a sine wave shape corresponding to the period of the change between the dark and light states.

The fact described above can be similarly applied to the relationship between the diffraction grating mark WM on the wafer and the S-polarized flux fluxes +LB$_{1S}$ and −LB$_{1S}$ so that diffraction light 305 is generated by the mark WM, the diffraction light 305 passing along the main beam of the projection lens. As a result, diffraction light 305 reaches the photoelectric detector 225 via the reticle window P$_0$. The S-polarized fluxes +LB$_{1S}$ and −LB$_{1S}$ emitted from the double focus optical system are imaged on the surface 226a in such a manner that the two fluxes +LB$_{1S}$ and −LB$_{1S}$ intersect with each other. However, they excessively defocus at the reticle mark RM and the window P$_0$.

Figure 30C:
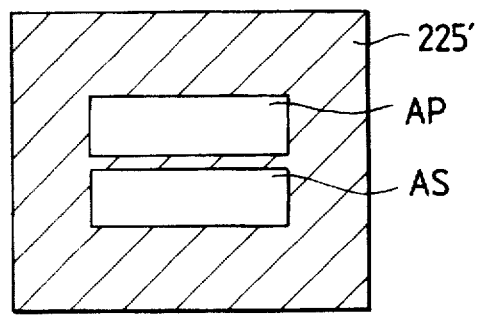

The photoelectric detector 225 is disposed behind a mask plate 225' as shown in FIG. 30C, the mask plate 225' being disposed in conjugation with the mark RM and the mark WM via the double focus optical system, the structure thereof being constituted so as to be capable of photoelectrically detecting diffraction light 304 and 305 which has passed through apertures A$_P$ and A$_S$ formed in the mask plate. The aperture A$_P$ is provided for the purpose of, for example, taking a diffraction image due to diffraction light 304 from the reticle mark RM, while A$_S$ is provided for the purpose of taking a diffraction image due to diffraction light 305 from the wafer mark WM. Therefore, the detection of the position of the reticle by the mark RM and the detection of position of the wafer by the mark WM can be individually conducted by individually providing a light receiving surface of the photoelectric detector 225 behind the apertures A$_P$ and A$_S$.

In the aperture AP, an image of the reticle mark RM supplied with the P-polarized fluxes +LB$_{1P}$ and −LB$_{1P}$ is formed. Simultaneously reflected diffraction light of the S-polarized fluxes +LB$_{1S}$ and −LB$_{1S}$ is supplied as background noise. Therefore, it is preferable that a polarization plate through which P-polarized light can pass be provided for the aperture A$_P$ and a polarization plate through which S-polarized light can pass be provided for the aperture A$_S$. As a result, cross talk in which light from the wafer and light from the reticle are mixed can be satisfactorily reduced in the photoelectric detector 225.

Next an optical signal of diffraction light 304 obtained via the aperture A$_P$ when the radial grating 211 is stopped will be analyzed. Assuming that n=±1 in the above-described Equation (5), the grating pitch P is in an imaginary magnification relationship with the pitch of the reference grating of the radial grating through the lens system 213, the pupil relay system 217A, and the double focus optical system 221 (similarly, the pitch of the gratings of the mark WM on the wafer relates to the pitch of the gratings of the mark RM and the imaginary magnification of the projection lens). Amplitude VR of diffraction light generated by the flux +LB$_{1P}$ made incident upon the mark RM is given from Equation (6), while amplitude VR$^-$ of diffraction light generated by the flux −LB$_{1P}$ is given from Equation (7):

$$VR^+ = a \cdot \sin\left(\phi + 2\pi\frac{x}{P}\right) \quad (6)$$

$$VR^- = a' \cdot \sin\left(\phi - 2\pi\frac{x}{P}\right) \quad (7)$$

where symbol P represents the pitch of the gratings of the mark RM, and x represents the quantity of displacement of the mark RM in the direction in which the gratings are arranged. Since the quantity which is the result of the interference between diffraction light $VR^+$ and $VR^-$ is photoelectrically detected, the change in the photoelectric signal (the amplitude of diffraction light 304) can be expressed by following Equation (8):

$$|VR^+ + VR^-|^2 = a^2 + a'^2 + 2 \cdot a \cdot a' \cdot \cos\left(4\pi\frac{x}{P}\right) \quad (8)$$

where $a^2+a'^2$ is a bias (a D.C. Component) of the signal, while $2 \cdot a \cdot a'$ is an amplitude component of the signal change. As is shown from Equation (8), the photoelectric signal changes in the form of a sine wave when the radial grating and the mark RM displace relatively in the direction in which the gratings are arranged. Whenever the relative displacement x becomes x =P/2 (a half of the pitch of the gratings), the amplitude of the signal is changed by a period.

Similarly, the above-described fact can be applied to diffraction light 305 from the wafer mark WM, and the relationship can be expressed by Equation (8). The alignment is thus completed by moving the reticle or the wafer so as to cause the phases of the two photoelectric signals to coincide with each other. However, since each of the signals is in the form of a sine wave as can be seen from Equation (8), the detectable phase difference is limited to a range of ±180°. Therefore, the reticle and the wafer must be previously pre-aligned with each other with an accuracy better than a half of the pitch P of the gratings of the marks RM and WM. When the radial grating is stopped as in this case, the level of the amplitude of the obtainable photoelectric signal can be changed to the sine wave shape by moving the reticle or the wafer.

When the radial grating is being rotated, diffraction light 304 and 305 becomes periodic (sine wave shape) light and dark information so that the obtainable photoelectric signal becomes a sine wave A.C. signal even if the reticle or the wafer is in a stationary state. Therefore, in this case, phase difference $\phi r$ of the photoelectric signal (a sine wave A.C. signal) of diffraction light 304 from the mark RM is detected by the phase detection system 240 as a phase difference between the photoelectric signal (a sine wave A.C. signal) from the photoelectric detector 219 shown in FIG. 28 and a reference signal. Similarly, phase difference $\phi w$ between the photoelectric signal of diffraction light 305 from the mark WM and the reference signal is detected. Thus, the deviation between the reticle and the wafer in direction x can be obtained by calculating the difference between the phase differences $\phi r$ and $\phi w$. According to this optical heterodyne detection system, the positional relationship can be detected with an excellent resolving power so far as the reticle and the wafer are positioned within a positional error which is a half of the grating pitch P even if it is in a stationary state. This is advantageous when a closed loop is subjected to a positional servo for the purpose of preventing slight positional deviation during the exposure of the reticle pattern on the resist of the wafer. According to this detection system, the servo lock can be conducted for the purpose of preventing the relative movement of the reticle and the wafer at the alignment position after the alignment has been completed by moving the reticle or the wafer in such a manner that $\phi r - \phi w$ becomes zero (or a predetermined value).

According to this embodiment, the movement of the wafer stage to each of the shot regions on the wafer is conducted in accordance with the result of the measurement conducted by the interferometer. Furthermore, when the mark WM is positioned within a region to which two fluxes $+LB_{1S}$ and $-LB_{1S}$ are applied with an accuracy of $+\frac{1}{2}$ pitch, the reticle stage or the wafer stage can be servo-controlled in accordance with only information from the phase detection system 240. In this state, the structure can be constituted in such a manner that the reticle stage or the wafer stage is moved by a D.C. motor and analog voltage corresponding to the phase difference $\phi r - \phi w$ is generated by a D/A converter or the like, the thus generated analog voltage being directly applied to a servo circuit of the D.C. motor as deviation voltage. The servo control is continued to the end of the exposure operation for the shot region.

Since the servo control is not the servo control in correspondence to the result of measurement by the interferometer, slight vibrations of the stage caused from the stagger of the density of air in the beam optical path of the interferometer can be reduced. In actual practice, when information about the phase difference with which the servo control is enabled is obtained from the phase detection system 240, the result of measurement conducted by the interferometer of the wafer stage is separated from the servo system adjacent to the wafer stage. In addition, voltage to be applied to the motor for the wafer stage is made zero, and the above-described analog voltage is applied to the servo system adjacent to the reticle stage. As a result, the slight vibrations generated during the exposure operation, in particularly generated adjacent to the wafer stage can be prevented. Since the slight vibrations can be changed to moderate drift motions, the relative positional deviation between the reticle and the waveform can be kept at about zero by causing the reticle stage to follow the motions at high speed. As a result, the exposed pattern can be prevented from being excessively thickened or from deterioration in the resolved quality. Consequently an extremely fine transcription can be conducted.

The frequency of each of the photoelectric signals from the photoelectric detectors 219 and 225 is in proportion to the rotational speed of the radial grating, and is preferably arranged to be at a level between 1 KHz to 100 KHz in terms of an excellent resolving power in the detection of the phase difference and the response of the photoelectric detectors 219 and 225. Since the signal frequency can be raised by using a high speed response type photoelectric detector, the detection of the mark by detecting the phase difference can be conducted with a further improved resolving power.

In principle, the pitch of the interference fringes (the dark visual field image of the gratings of the radial grating) formed on the mark RM is determined to be a half of the pitch P of the mark RM. In addition, the interference fringes formed on the mark WM is determined to be a half of the pitch of the mark WM.

Figure 29:
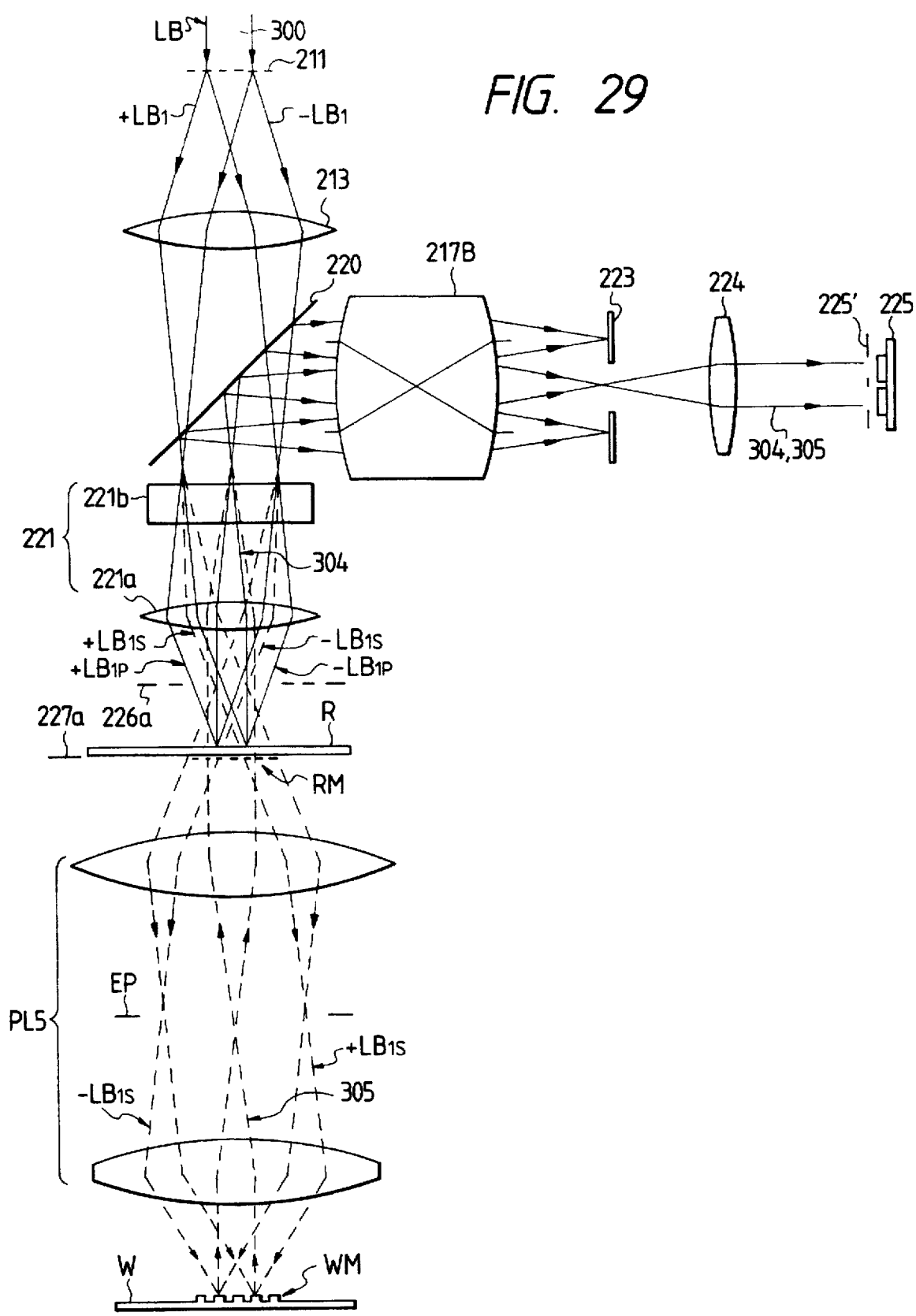
FIG. 29 is a view which illustrates the optical path for-describing the structure of the alignment system of the apparatus shown in FIG. 1.

In addition, as can be clearly seen from FIG. 29, all beams $\pm LB_1$ ($\pm LB_{1S}$ and $\pm LB_{1P}$) from the radial grating are converged on the pupil conjugate surface (Fourier surface) in the form of spot light. Therefore, both diffraction light (interference beat signal) 304 from the mark RM and diffraction light (interference beat signal) 305 from the mark WM are converged on the pupil surface EP and on the pupil conjugate surface in the form of spot light, and they become substantially collimated flux on the object (the reticle and the wafer) surface or the image surface which is in conjugation with the object surface.

The two fluxes $+LB_{1S}$ ($+LB_{1P}$) and $-LB_{1S}$ and ($-LB_{1P}$) are caused to have a difference in the frequency in accordance with the rotational speed of the radial grating. Therefore, the radial grating may be replaced by an acousto-optical modulator according to the second embodiment or as disclosed in U.S. Pat. No. 4,710,026. As a result, two beams having a constant difference in the frequency are formed.

The technology which serves as the base of this embodiment and described above involves the following problems in terms of technology.

The alignment system constituted as shown in FIGS. 28 and 29 detects optical information based on diffraction light as shown in FIG. 32A. The reticle R and the wafer W respectively have a grating mark whose size is determined so as to respectively make equal the pitch of the gratings and the width of the same of the projected image of the reticle mark RM projected on the wafer and the pitch of the gratings and the width of the same of the wafer mark WM. When the reticle mark RM is supplied with two fluxes $+LB_{1P}$ and $-LB_{1P}$ from two directions, $\pm 1$ order diffraction light LBR$\pm 1$ (diffraction light 304) passing upward and transmissive diffraction light ($\pm 1$ order diffraction light) $LB_w\pm 1$ passing downward are simultaneously generated from the reticle mark RM. Since transmissive diffraction light $LB_w\pm 1$ passes along the main beam of the projection lens, it is reflected after it has perpendicularly reached the wafer, the transmissive diffraction light $LB_w\pm 1$ thereby passing the reticle mark RM from the lower portion to the upper portion. Therefore, the transmissive diffraction light $LB_w\pm 1$ is caused to mix with the diffraction light LBR$\pm 1$ from the mark RM. Since the diffraction light LBR$\pm 1$ and $LB_w\pm 1$ are polarized similarly, a phase deviation can occur at the time of the phase detection operation by the mixture of above-described diffraction light.

Symbol $LB_0$ shows the state of 0-order light after the flux $-LB_{1P}$ has passed through the mark RM, while $LB_0'$ shows the state of 0-order light after the flux $+LB_{1P}$ has passed through the mark. These 0-order light beams $LB_0$ and $LB_0'$ return to a chrome surface CR which on the lower surface of the reticle after 0-order light beams $LB_0$ and $LB_0'$ have been reflected by the wafer. Since the reticle and the wafer are in the relationship in which they are considerably defocused with illumination light for the alignment operation, diffraction light $LB_w\pm 1$ is not imaged on the surface of the mark RM.

Figure 33:
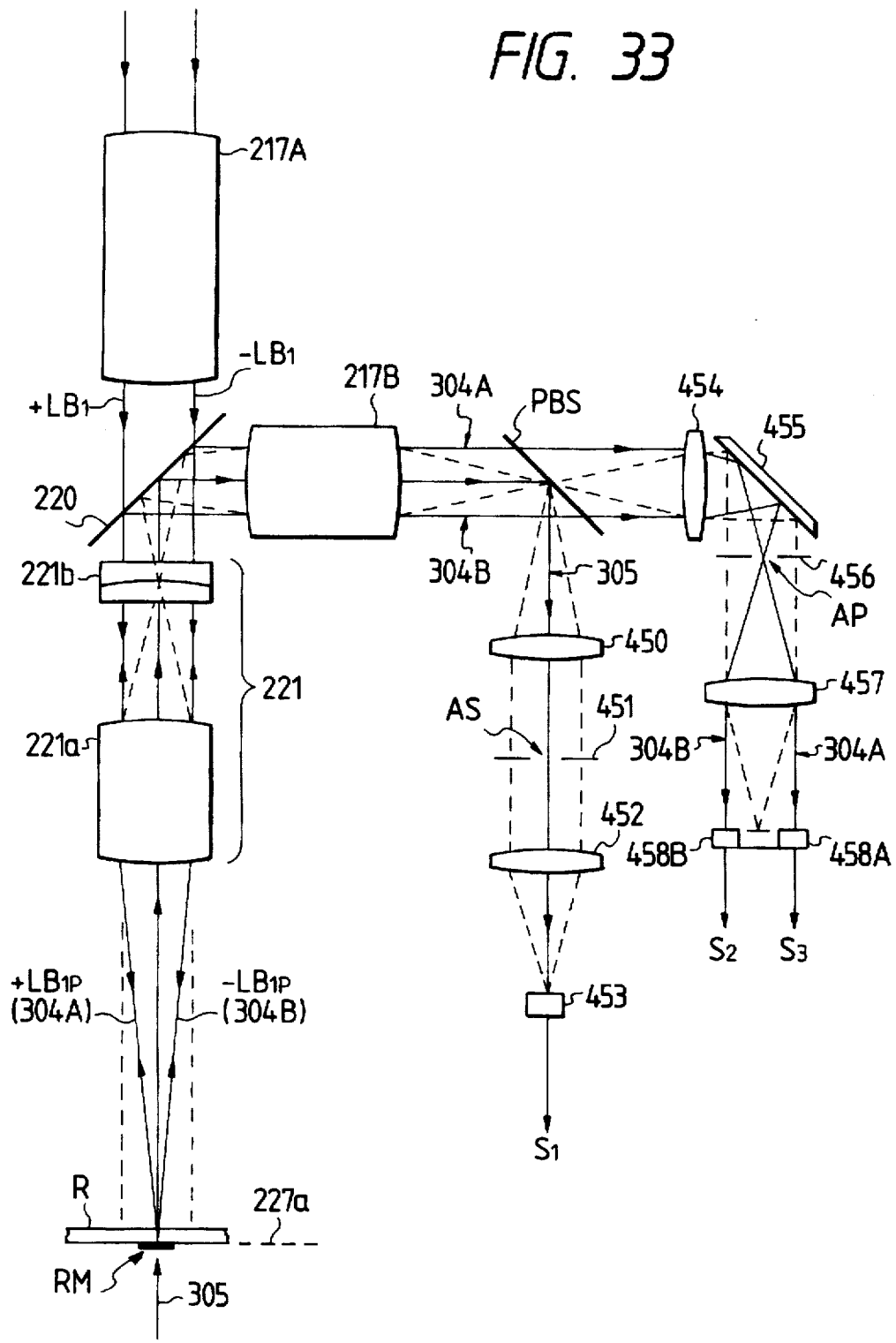
FIG. 33 is a view which illustrates the structure of another modification of the alignment system according to the present invention.

The above-described problem can be overcome by changing a partial structure of the alignment system as shown in FIG. 33. Referring to FIG. 33, the same elements as those shown in FIG. 28 are given the same reference numerals, and the dichroic mirror 222 is omitted from illustration. According to the change in the structure, the relationship in terms of the pitch between the marks RM and WM is arranged as shown in FIG. 34. That is, the pitch of the wafer mark WM is arranged to be twice the pitch of the interference fringes formed on the wafer, while the pitch of the reticle mark RM is arranged to be the same as the pitch of the interference fringes formed on the reticle. As a result, the diffraction angle can be further widened. A state of diffraction when the pitch of the reticle mark RM is halved will be described with reference to FIG. 32B.

When the reticle mark RM is supplied with fluxes of 0-order light $LB_{1P}$ and $-LB_{01P}$ from two directions, 0-order and $\pm 1$ order light are respectively generated from the mark RM in the reflection direction and the transmitting direction. When flux $+LB_{1P}$ is supplied, 0-order light $+LBR_0$ reflected by the mark RM and $-1$ order diffraction light $LBR_{-1}$ are generated in the reversed direction to the direction of the flux $-LB_{1P}$.

Similarly, when the flux $-LB_{1P}$ is supplied, 0-order light $-LBR_0$ and $+1$ order diffraction light $LBR+_1$ passing in the reverse direction to the flux $+LB_{1P}$ are generated from the mark RM. As described above, when the incident angle of the two fluxes $+LB_{1P}$ and $-LB_{1P}$, the pitch of the interference fringes on the reticle, and the pitch of the mark RM are determined suitably, the direction of $\pm 1$ order diffraction light LBR$\pm_1$ can be caused to coincide with that of 0-order light $\pm LBR_0$. Therefore, diffraction light passing perpendicularly to the mark RM theoretically becomes 0.5-th order diffraction light. As a result, the quantity of the 0.5th order diffraction light can be reduced to a level which can be neglected with respect to 1-order light.

Similarly, 0-order and $\pm 1$ order light are also generated on the lower surface of the mark (the transmissive side). 0-order order light beams $LB_0$ and $LB_0'$ which have passed through the mark RM act similarly to the case shown in FIG. 32A. However, $-1$ order diffraction light $LB_{w-1}$ caused to pass downward from the mark RM by the flux $+LB_{P1}$ supplied, is caused to pass through the same optical path as the optical path through which 0-order light $LB_0$ of the flux $-LB_{1P}$ passes. Similarly, $+1$ order diffraction light $LB_{w+1}$ caused to pass downward from the mark RM by the flux $-LB_{1P}$ supplied, is caused to pass through the same optical path as the optical path through which 0-order light $LB_0'$ of the flux $+LB_{1P}$ passes. Diffraction light generated downward from the mark RM is theoretically 0.5-th order diffraction light, and can be substantially neglected. Furthermore, since diffraction light higher than the second order from the mark RM is generated at an angle larger than that of $\pm 1$ order light, it can be neglected.

As described above, $\pm 1$ order diffraction light $LB_{w+1}$ and $LB_{w-1}$ passing through the mark RM and returned by the wafer so as to return to the mark RM overlaps 0-order light $LB_0$ an $LB_0'$. By virtue of the chromatic aberration of the projection lens, the diffraction light is shielded by the chrome surface $C_R$ disposed on both sides of the mark R. As a result, it does not return to the objective lens 221a.

As shown in FIG. 34, assuming that the width in direction x of the window formed in the chrome surface $C_R$ on which the mark RM is formed is Wx, the axial chromatic aberration quantity adjacent to the wafer is $\Delta L$, and the incident angle of the two fluxes $+LB_{1P}$ ($+LB_{1S}$) and $-LB_{1P}$ ($-LB_{1S}$) adjacent to the wafer is $\theta$, the 0-order light $LB_0$, $LB_0'$ and $+1$ order light $LB_{w+1}$ and $LB_{w-1}$ which constitute noise light can be effectively stopped when the following relationship expressed by following Equation (9) is satisfied:

$$Wx \leq 2 \cdot \Delta L \cdot \theta \qquad (9).$$

0-order light and $\pm 1$ order light from the wafer mark act similarly to that described above. $\pm 1$ order light 305 from the mark WM passes perpendicularly from the wafer along the main beam of the projection lens. The 0-order light and $\pm 1$ order light pass through the transparent window formed besides the reticle mark RM in a defocused manner before being made incident upon the objective lens 221a. Therefore, reflected diffraction light LBR$\pm 1$ (304) from the mark RM and reflected diffraction light 305 from the mark WM are caused to converge in the form of spot light at positions laterally deviated from each other on the surface of the pupil in the system or the pupil conjugate surface. That is, diffraction light 305 converges at the center of the pupil, while diffraction light LBR$\pm 1$ is positioned symmetrically at a position peripherally of the center of the pupil.

Now the alignment system shown in FIG. 33 will be described.

Diffraction light (an interference beat signal) 305 from the wafer mark passes through a transparent portion in the vicinity of the reticle mark RM, and passes along the optical axis of the objective lens 221a in the reversed direction. Then, it passes through double refraction material 221b, and is reflected by the beam splitter 220 before it reaches the polarization beam splitter PBS via the pupil relay system 217B. Diffraction light 305 is generated when the S-polarized flux $+LB_{1S}$ is applied to the wafer, the diffraction light 305 of course retaining S-polarization. Therefore, a portion exceeding 90% of diffraction light 305 is reflected by the polarization beam splitter PBS, and reaches the photoelectric detector 453 via the lens system 450, the aperture plate 451, and the lens system 452.

Referring to the drawing, the dash line shows the conjugate relationship of the pupil, where the aperture plate 451 is positioned in conjugation with the reticle R, that is, in conjugation with the wafer mark WM. The aperture plate 451 has an aperture AS through which only the image of the mark WM can pass. The light receiving surface of the photoelectric detector 453 is disposed in a pupil conjugation so that it receives spot light formed as a result of the convergence of diffraction light 305, and transmits an A.C. photoelectric signal $S_1$ which corresponds to the change in the intensity (the interference beat signal) of the spot light.

Optical information ($-LBR_0$ and $LBR_{+1}$) 304A and optical information ($+LBR_0$ and $LBR_{-1}$) 304B from the mark RM shown in FIG. 32B are in the form of an interference beat signal of 0-order light and 1-order light having a frequency difference therebetween. The interference beat signal passes reversely through the optical path through which the beams $+LB1P$ and $-LB1P$ pass until it reaches the polarization beam splitter PBS via the double focus optical system 221b, the beam splitter 220, and the relay system 217B. 0-order light $-LBR_0$ and +1 order diffraction light LBR+1 have a frequency difference therebetween and pass in the same direction overlapped with each other. Furthermore, since the 0-order light $-LBR_0$ and +1 order diffraction light LBR+1 are the same polarization (P-polarized light) components, they interfere with each other. Therefore, a quantity exceeding 90% of the optical information 304A and 304B passes through the polarization beam splitter PBS, and then reaches the photoelectric detectors 458A and 458B via the lens system 454, the mirror 455, the aperture plate 456, and the lens system 457. The aperture plate 456 has an aperture AP through which only the image of the reticle mark can pass, the aperture AP being in conjugation with the reticle pattern surface.

The light receiving surfaces of the two photoelectric detectors 458A and 458B are disposed in a pupil conjugation manner so that they receive each spot light of the optical information 304A and 304B and transmit A.C. signals $S_2$ and $S_3$ of a frequency of the interference beat signal. Since the two signals $S_2$ and $S_3$ have the same characteristics as signals, either of $S_2$ and $S_3$ may be supplied to the phase detection system 240. According to this embodiment, if the light intensities (the light quantity) become different, excessively between 1-order light and 0-order light, an offset can Be generated at the time of measuring the phase difference since optical information 304A and 304B are formed by the interference between 0-order diffraction light and 1-order diffraction light. Therefore, it is preferable that phase difference $\phi$ with respect to the reference signal generated from the photoelectric detector 219 be measured after the signals $S_2$ and $S_3$ have passed through an analog circuit capable of calculating the sum (or difference) of $S_2$ and $S_3$. Alternatively, a switch type structure may be employed in which either the signals $S_2$, $S_3$, or a signal formed by synthesizing the signals $S_2$ and $S_3$ is used.

As for the signal $S_1$ from the photoelectric detector 453, the phase difference $\phi w$ from the reference signal is measured so as to calculate $\phi r$ and $-\phi w$ by the phase detection system. As a result, the positional deviation between the reticle R and the wafer W can be detected.

Now the phase relationship will be described similarly to the case shown in FIG. 29. The relationship between P-polarized 1-order light $+LB_{1P}$ and $-LB_{1P}$ can be expressed by the above-described Equation (5). The pitch P is determined so as to cause ±1 order light ($LBR_{+1}$ and $LBR_{-1}$) to return to the direction of the fluxes $+LB_1P$ an $-LB_1P$, the ±1 order light being formed when the interference fringes formed on the reticle by the fluxes $+LB_{1P}$ and $-LB_{1P}$ are applied to the mark RM. That is, 1-order light $LBR_{+1}$ generated due to the application of the flux $+LB_{1P}$ is caused to return to the direction of the flux $+LB_{1P}$. As a result, since the interference beat between 0-order light ($-LBR_0$ and $+LBR_0$) and 1-order light ($LBR_{+1}$ and $LBR_{-1}$) is photoelectrically detected, the phase difference between the reference signal (the output from the photoelectric detector 219) and the signal $S_2$ (or $S_3$, or synthesized signal) is changed by one period when the relative displacement X of the mark RM deviates by pitch P (the same as the pitch of the interference fringes on the reticle). However, since ±1 order light (LBR±1) is arranged to return in the same direction as that of $\pm LB_{1P}$, the pitch of the mark RM must be halved with respect to that in the system shown in FIG. 32A. As a result, in the case where the quantity of displacement of the wafer and that of the reticle are the same, the phase difference between the reference signal and the signal $S_1$ and the phase difference between the reference signal and the signal $S_2$ (or $S_3$) are changed by the same quantity. This means that the phase difference $\phi r$ and $\phi w$ can be directly subtracted without the necessity of any special conversion.

According to this embodiment, assuming that the pitch of the line-and-space type mark RM on the reticle is Pr, the pitch of the line-and-space type mark WM on the wafer is Pw, the pitch of the interference fringes due to the two fluxes $\pm LB_{1P}$ is Pf, and the magnification of the projection lens 3 is 1/M (in the case where the reduction ratio is 1/5, M=5), the following relationship holds:

$$Pf=Pr=\tfrac{1}{2}\cdot M\cdot Pw.$$

The duty ratio between diffraction gratings of the marks RM and WM is 1:1. Therefore, diffraction light 305 from the mark WM and diffraction light 304A and 304B from the mark RM can be clearly separated from each other at the pupil of the alignment system or in vicinity of the pupil. As a result, the phase difference measurement can be conducted with a satisfactory S/N ratio.

In the case where the rotating radial grating 211 is used as the frequency shifter as shown in FIGS. 28 and 29, the frequencies of the two signals (the reference signal and the measured signal) used at the time of detecting the phase difference may change but the phase difference cannot be changed even if there is an uneven rotational speed. This leads to a fact that the necessity of precisely controlling the speed of the motor capable of rotating the radial grating can be eliminated. Furthermore, in the case where the frequency shifter is constituted by an acousto-optical modulator (AOM), the modulated wave (supersonic wave) of the AOM can be readily changed. Therefore, a structure may be employed which is constituted in such a manner that the frequency of the optical beat is switched into several modulated frequencies, and the modulated frequency having a required resolving power is selected after the phase differences of the same mark have been successively detected.

Alternatively, the optical beat frequency (the frequency difference between the two fluxes +LB$_1$ and −LB$_1$) may be switched in accordance with the required resolving power for detecting the position of the mark.

The incident angle of the two fluxes ±LB$_{1P}$ (±LB$_{1S}$) to be applied to the mark RM (WM) can be freely adjusted by changing the positions of the fluxes +LB$_1$ and −LB$_1$ in the pupil so as to respectively maintain the same distance from the center of the pupil. In order to achieve this, an optical block (a parallel flat glass or wedge shaped prism) may be disposed between the spatial filter 215 and the beam splitter 214 Shown in FIG. 28, the optical block being capable of varying the interval between the two fluxes +LB$_1$ and −LB$_1$ with the parallel relationship kept. The photoelectric detector 453 shown in FIG. 33 may be disposed behind the aperture plate 451, and one photoelectric detector may be disposed behind the aperture plate 456 as an alternative to the two photoelectric detectors 458A and 458B.

If a pattern (an alignment mark or an actual device pattern) is present at a position on the wafer which is in conjugation with the mark RM, diffraction light 304A and 304B from the mark RM and optical information from the wafer (diffraction light 305 or the like) can be detected in a completely separated manner according to this embodiment and the photoelectric detectors 458A and 458B do not detect the wafer pattern. Therefore, the position at which the reticle mark RM is positioned may be used commonly at the time of changing the mark. That is, the mark WM on the wafer at the time of exposing another layer may be positioned below the mark RM. In this case, the photoelectric detectors 453, 458A, and 458B must be disposed on the pupil conjugate surface or at a position in the vicinity of this surface.

As described above, the alignment system shown in FIG. 33 conducts the one-dimensional position measurement. However, a two-dimensional alignment can be conducted between the shot regions of the reticle and the wafer by disposing marks RM for direction x and for direction y on two sides of the circuit pattern region of the reticle, the two sides intersecting at right angles.

The alignment system according to this embodiment is capable of conducting the die-by-die alignment with different wavelengths without the necessity of providing a chromatic aberration compensating optical system between the reticle and the projection lens. Furthermore, the alignment system exhibits an advantage in that the mark position detection and the alignment operation can be continuously conducted by the action of the dichroic mirror 222 during the exposure operation. In general, in the die-by-die alignment, when the size of the circuit pattern region (or the size of the shot region on the wafer) of the reticle is changed, a portion of the alignment system, for example, the double-focus optical system 221 is moved in accordance with this change. Furthermore, since the reticle mark RM is detected optically via the reticle substrate made of a glass plate or a quartz plate, a portion of light reflected by the upper surface of the reticle and light (+LBR$_0$, −LBR$_0$, LBR$_{+1}$, and LBR$_{-1}$) generated from the mark RM on the lower surface of the reticle can interfere with each other in .the system in which the interference beat of light is detected according to this embodiment. Therefore, a phase offset is given diffraction light (an optical beat signal) 304A and 304B generated from the mark RM on the lower surface.

Therefore, it is preferable that the phase offset caused from the thickness of the reticle be previously measured and the offset be compensated by the phase detection system 240.

FIG. 35A is a view which illustrates a structure constituted in such a manner that a double focus optical system is provided for a portion of the conventional die-by-die alignment system, in which only the mirror M and the double focus optical system 221 are shown. The mirror and the double focus optical system 221 can move in parallel to the reticle in accordance with the position of the mark RM as designated by an arrow shown in this drawing.

FIG. 35B is a view which schematically illustrates phase offset quantity $\Delta\phi$ which varies in accordance with change in the thickness of the glass of the reticle. The offset quantity $\Delta\phi$ is slightly changed due to the uneven thickness even if it is measured in the same reticle. Although the slight change in the offset quantity $\Delta\phi$ is small with respect to the average absolute offset quantity $\Delta\phi_0$, it cannot be neglected in the alignment system in which interference is utilized.

Therefore, the phase offset quantity is measured at an actual alignment position, and data thus obtained is set in a compensation data portion 240D of the phase detection system 240 shown in FIG. 36. Phase difference detection portions 240A and 240B detect the phase differences $\phi f$ and $\phi w$ of the signals S$_1$, S$_2$, and S$_3$ (or a signal formed by synthesizing the signals S$_2$ and S$_3$) with respect to a reference signal Sr supplied from the photoelectric detector 219. A calculator 240C conducts calculations with $\phi r$ and −$\phi r$ and conducts addition or subtraction of the phase offset quantity (for example $\Delta\phi_0$) to be compensated. Since the phase offset quantity $\Delta\phi$ corresponds to the thickness of the glass in the upper portion of the alignment mark RM, only the phase offset quantity $\Delta\phi_0$ is actually measured when the thickness is $\Delta_0$ and the offset quantity $\Delta\phi_n$ for a variety of reticles can be approximated by inputting the glass thickness Dn at the alignment position as follows:

$$\Delta\phi_0 = K \cdot \Delta\phi_0 \cdot Dn/D_0$$

(where symbol K represents a constant).

In order to actually measure the offset quantity $\Delta\phi_n$ at the alignment position, a grating shaped reference mark FM is secured on the wafer stage so as to simultaneously observe the reticle mark RM and the reference mark FM with exposure light. As a result, the deviation $\Delta X_0$ between the two marks is measured precisely. In this case the illumination with exposure light may be conducted in accordance with a coaxial downward illumination method via a double focus optical system, or may conducted by causing the reference mark FM to emit light with exposure light. In the case where the two marks are detected via the double focus optical system with exposure light, illumination light for the exposure operation or the imaging light from the exposure light is restricted to one of the polarization components. Then, the deviation $\Delta X_n$ between the mark RM and the reference mark FM under the same condition is detected by the phase detection system 240 with the compensation data made zero. The subtraction of $\Delta X_0 - \Delta X_n$ corresponds to the phase offset quantity $\Delta\phi_n$ to be measured.

The reticle mark RM or the wafer mark WM may be formed by a bar mark or two or three bar marks, resulting in the same effect. In this case, optical information from the bar mark is not diffraction light having a uniform directionality, but approximates a certain scattered light. However, a similar alignment method utilizing interference can be conducted, and an advantage in which the mark region can be significantly reduced can be obtained.

We claim:

1. A projection exposure apparatus comprising:
    a first illumination optical system capable of supplying light in a first wavelength region for illuminating a mask having a predetermined pattern region;

a projection optical system capable of projecting an image of said pattern region on a predetermined region on a sensitive substrate with light in said first wavelength region;

a second illumination optical system capable of supplying light of a second wavelength region different from said first wavelength region for the purpose of illuminating an alignment mark disposed on said sensitive substrate with a predetermined positional relationship retained with respect to said predetermined region; and a mark detection optical system capable of receiving light in said second wavelength region from said alignment mark via said projection optical system and via a first position on said mask, said mask having shielding means at a second position thereof disposed to prevent light in said first wavelength region from illuminating said alignment mark when said mask is aligned with said substrate, the distance between said first and second positions of said mask being determined by lateral chromatic aberration of said projection optical system in said second wavelength region.

2. A projection exposure apparatus according to claim 1, wherein said first and second positions of said mask are spaced laterally of an optical axis of said projection optical system.

3. A projection exposure apparatus according to claim 2, wherein said first and second positions of said mask are located on the same line that is radial to said optical axis of the projection optical system.

4. A projection exposure apparatus comprising:

an illumination optical system for an exposure operation capable of irradiating a mask having a predetermined pattern region with first illumination light in a predetermined wavelength region;

a projection optical system whose chromatic aberration with respect to said first illumination light has been compensated and capable of projecting an image of said pattern of said mask on a photosensitive substrate having an alignment mark, said projecting being conducted in a telecentric condition;

an illumination system for an alignment operation capable of irradiating said alignment mark on said photosensitive substrate, through said mask and said projection optical system, with second illumination light which is in a wavelength region different from that of said first wavelength region and consists of two light beams, the alignment illumination system emitting the second illumination light so that a plane defined by said two light beams is inclined with respect to an optical axis of the alignment illumination system by a predetermined degree; and a mark detection optical system capable of detecting optical information generated from said alignment mark by said second illumination light, said optical information being detected via said projection optical system and said mask, wherein said projection optical system projects said second illumination light from said alignment mark to said mark detection optical system through a first position on said mask, and said mask has a shielding member at a second position thereof for shielding said alignment mark from said first illumination light when said mask and said substrate are aligned, said second position being conjugate with said alignment mark with respect to said projection optical system and with regard to said first illumination light.

5. A projection exposure apparatus according to claim 4, wherein said alignment mark has a diffraction grating pattern in which small gratings are arranged in a predetermined direction and at a predetermined pitch, and an incident angle of said second illumination light from said illumination system for the alignment operation made upon said photosensitive substrate coincides with a special diffraction angle higher than one order of said diffraction grating pattern.

6. A projection exposure apparatus according to claim 5, wherein said mask a window at said first position through which at least said second illumination light passes, said illumination system for the alignment operation is disposed so as to supply said second illumination light to said alignment mark through said window and said projection optical system, and a main beam of said second illumination light passing through said window of said mask is inclined in accordance with said special diffraction angle.

7. An alignment apparatus capable of aligning a mask having a first mark to a photosensitive substrate having a second mark comprising:

a projection optical system capable of projecting an image of said mask on said photosensitive substrate;

a light source capable of emitting coherent two light beams in a wavelength region for which said projection optical system has a predetermined chromatic aberration quantity;

an optical member capable of orienting said two light beams so as to be applied to said first mark from two different directions and capable of orienting said two light beams so as to be applied to said second mark from two different directions via said projection optical system;

a mark detection optical system capable of detecting first optical information obtained from two diffraction light beams which are generated from one of said first and second marks in substantially the same direction and between which the difference in the order is 1, and detecting second optical information obtained from two diffraction light beams which are generated from the other of said first and second marks in substantially the same direction and between which the difference in the order is 2, wherein said mask and said photosensitive substrate are aligned based on said first and second optical information.

8. An alignment apparatus according to claim 7, wherein said optical member is disposed so as to apply said two light beams, each of which has the same polarization component, to said mask via said mark detection optical system, and said two light beams are oriented so as to pass through positions on a pupil surface of said mark detection optical system which are deviated from each other by a predetermined interval.

9. An alignment apparatus according to claim 8, wherein said mark detection optical system includes a double-focus element having its focal points at two positions corresponding to an axial chromatic aberration quantity with respect to a difference in polarization components and a telecentric objective lens having a pupil surface disposed so as to substantially coincide with said double-focus element, and said two light beams to be applied to said first mark and said second mark via said projection optical system are separated from each other by said double-focus element.

10. An alignment apparatus according to claim 8, wherein width Wx of said first mark in a direction in which its position is measured is determined so as to meet the following relationship assuming that an axial chromatic aberration quantity of said projection optical system adjacent to said photosensitive substrate is ΔL, an incident angle made upon said photosensitive substrate when said two light beams are inclined symmetrically in said direction in which said measurement is conducted is θ:

$$Wx = 2 \cdot \Delta L \cdot \theta.$$

11. An alignment apparatus according to claim 8, wherein each of said first and second marks has a grating pattern having a predetermined pitch in a direction of inclination of said two light beams, and a pitch or a width of an image of said grating, when said first mark is projected on said photosensitive substrate by said projection optical system, is different from a pitch or a width of said second mark.

12. An apparatus according to claim 7, wherein said two diffraction light beams between which the difference in the order is 1 are 0-order and 1-order diffraction light beams from said one mark, and said two diffraction light beams between which the difference in the order is 2 are ±1-order diffraction light beams from said other mark.

13. An apparatus according to claim 7, wherein said two diffraction light beams between which the difference in the order is 1 are 0-order and 1-order diffraction light beams from said first mark, and said two diffraction light beams between which the difference in the order is 2 are ±1-order diffraction light beams from said second mark.

14. An alignment apparatus capable of aligning a mask having a first mark and a photosensitive substrate having a second mark comprising:

a projection optical system capable of projecting an image of said mask on said photosensitive substrate;

a light source capable of transmitting coherent illumination light in a wavelength for which said projection optical system has a predetermined chromatic aberration quantity;

an optical member capable of orienting said illumination light so as to be applied to said first mark from two different directions and capable of orienting said illumination light to be applied to said second mark from two different directions via said projection optical system;

a mark detection optical system capable of detecting first optical information obtained from at least one pair of diffraction light beams, between which the difference in the order is 1, from one of said first and second marks in substantially the same direction as an incident direction and second optical information obtained from a pair of diffraction light beams from the other of said first and second marks, wherein said mask and photosensitive substrate are aligned based on said first and second optical information.

15. An alignment apparatus according to claim 14, wherein said optical member disposed so as to apply first and second illumination light each of which has the same polarization component to said mask via said mark detection optical system, and said first illumination light and said second illumination light are oriented so as to pass through positions deviated from each other by a predetermined interval on a pupil surface of said mark detection optical system.

16. A projection exposure apparatus comprising:

a reticle having a pattern region and having a window and a shield adjacent to said pattern region;

a wafer having an exposure region corresponding to said pattern region and having a wafer alignment mark adjacent to said exposure region;

a projection optical system disposed between said reticle and said wafer;

a first illumination optical system for supplying exposure light of a first wavelength band to said reticle, said projection optical system being capable of projecting an image of said pattern region of said reticle onto said exposure region of said wafer with said exposure light;

a second illumination optical system for supplying alignment light of a second wavelength band different from said first wavelength band to said reticle, said projection optical system being capable of illuminating said wafer alignment mark with alignment light transmitted through said window of said reticle; and an alignment optical system for receiving alignment light from said wafer alignment mark via said projection optical system and said window;

wherein said shield of said reticle is spaced from said window by an amount corresponding to lateral chromatic aberration of said projection optical system with respect to said alignment mark.

17. A projection exposure apparatus according to claim 16, wherein said projection optical system has an optical axis extending through the center of a pupil of the projection optical system, and wherein said alignment light passes through said window along a path inclined relative to said optical axis and that passes through said pupil at a point spaced from said optical axis.

18. A projection exposure apparatus according to claim 17, wherein the path of said alignment light adjacent to said wafer is inclined with respect to said optical axis.

19. An alignment apparatus capable of aligning a first substrate to a second substrate comprising:

an illumination optical system capable of irradiating an alignment mark on one of said first and second substrates with first and second beams which are coherent; and a photoelectric detector capable of receiving a light which consists of a first diffraction light beam generated from said alignment mark by said first beam and a second diffraction light beam generated from said alignment mark by said second beam, the first and second diffraction light beams being generated from said alignment mark in substantially the same direction and the difference in the diffraction order between the first and second diffraction light beams being 1; wherein said first and second substrates are aligned based on a signal from said photoelectric detector.

20. An apparatus according to claim 19, wherein said first diffraction light beam is a 0-order light beam and said second diffraction light beam is a 1-order light beam.

21. An apparatus according to claim 19, wherein said photoelectric detector receives a third diffraction light beam generated from said alignment mark by said first beam and a fourth diffraction light beam generated from said alignment mark by said second beam, the third and fourth diffraction light beams being generated from said alignment mark symmetrically to said first and second diffraction light beams with respect to a direction perpendicular to said one substrate and the difference in the diffraction order between the third and fourth diffraction light beams is 1.

22. An apparatus according to claim 21, wherein said first and fourth diffraction light beams are 0-order light beams and said second and third diffraction light beams are 1-order light beams.

23. A projection exposure apparatus comprising:

an illumination optical system for an exposure operation capable of irradiating a mask having a pattern with first illumination light in a predetermined wavelength region;

a projection optical system whose chromatic aberration with respect to said first illumination light has been compensated and capable of projecting an image of said pattern of said mask on a photosensitive substrate having an alignment mark, said projecting being conducted in a telecentric condition;

an illumination system for an alignment operation capable of irradiating said alignment mark on said photosensitive substrate, through said mask and said projection optical system with second illumination light which is in a wavelength region different from that of said first wavelength region and consists of two light beams, the illumination system emitting the second illumination light so that the two light beams pass through a position which is conjugate with said alignment mark with respect to said projection optical system with regard to the second illumination light, and a plane defined by the two light beams is inclined with respect to an optical axis of the illumination system by a predetermined degree; and a light receiving system capable of detecting optical information generated from said alignment mark, the optical information being detected via said projection optical system and said mask.

* * * * *